United States Patent [19]

Garverick et al.

[11] Patent Number: 5,349,676
[45] Date of Patent: Sep. 20, 1994

[54] DATA ACQUISITION SYSTEMS WITH PROGRAMMABLE BIT-SERIAL DIGITAL SIGNAL PROCESSORS

[75] Inventors: Steven L. Garverick, Schenectady, N.Y.; Kenji Fujino, Tokyo, Japan

[73] Assignee: General Electric Company, Schenectady, N.Y.

[21] Appl. No.: 653,935

[22] Filed: Feb. 11, 1991

[51] Int. Cl.[5] .......................... G06F 7/68; G06F 7/70; G06F 9/302

[52] U.S. Cl. .................................. 395/800; 395/775; 364/736; 364/754; 364/768; 364/258.1; 364/258.2; 364/DIG. 1

[58] Field of Search ............... 395/800, 425, 775, 100; 364/736–784; 324/76 R

[56] References Cited

U.S. PATENT DOCUMENTS

| | | | |
|---|---|---|---|
| 4,621,228 | 11/1986 | Toki et al. | 324/61 R |
| 4,797,848 | 1/1989 | Walby | 364/754 |
| 4,839,847 | 6/1989 | Laprade | 364/754 |
| 4,922,212 | 5/1990 | Roberts et al. | 331/176 |
| 4,931,725 | 6/1990 | Hutt et al. | 324/142 |
| 5,031,137 | 7/1991 | Elrod | 364/757 |
| 5,103,419 | 4/1992 | Toyokura et al. | 364/570.5 |
| 5,113,363 | 5/1992 | Orsino et al. | 364/736 |
| 5,179,714 | 1/1993 | Graybill | 395/800 |

*Primary Examiner*—Alyssa H. Bowler
*Assistant Examiner*—Alpesh M. Shah
*Attorney, Agent, or Firm*—Marvin Snyder

[57] ABSTRACT

A monolithic integrated circuit as may be used in combination with a plurality of sensors for generating respective sensor output signals, which monolithic integrated circuit includes means for converting each sensor output signal to bit-serial digital format, together with some initial processing circuitry comprising a bit-serial multiply-add processor. This processor includes a bit-serial digital multiplier for multiplying a first digital processor input signal in bit-serial form by a second digital processor input signal to generate a digital product signal, a digital adder for adding a third digital processor input signal to the digital product signal to generate a digital sum signal, and means for supplying a digital processor output signal with bits correspond-ing to those of said digital sum signal. A memory system provides memory for storing program instructions, memory for storing successive values of the second digital processor input signal, memory for storing successive values of the third digital processor input signal, and memory for storing successive values of the digital processor output signal as written into the memory system. The first digital processor input signal can be selected from among the sensor output signals as converted to bit-serial digital format. The second digital processor input signals applied to the bit-serial multiply-add processor are at least at selected times read from the memory system, as are the third digital processor input signals applied to the bit-serial multiply-add processor. A controller retrieves stored program instructions in a prescribed order from the memory for storing program instructions and generates control signals for controlling at least the reading and writing of the memory system, as well as the selecting of the first digital processor input signal.

25 Claims, 23 Drawing Sheets

FIG. 3

| | MSB | | LSB | | LSBs PROM 9 ADDRESS |
|---|---|---|---|---|---|
| 8-BYTE UNIT (BLOCK) ADDRESSED WHEN BIT3 OF PROM 9 ADDRESS IS 0 | READ1 (3) | READ 0 (5) | | MAP ADR | 0000 |
| | WR0 (1) | WRITE (5) | READ1 (2) | MAP ADR | 0001 |
| | MAP CNTL (8) | | | MAP ADR | 0010 |
| | MAP CNTL (8) | | | MAP ADR | 0011 |
| | MAP COEF (8) | | | MAP ADR | 0100 |
| | CORDIC CNTL (CC0) (8) | | | CORDIC ADR | 0101 |
| | MAP COEF (8) | | | MAP ADR | 0110 |
| | CORDIC CNTL (CC1) (8) | | | CORDIC ADR | 0111 |
| 8-BYTE UNIT (BLOCK) ADDRESSED WHEN BIT3 OF PROM 9 ADDRESS IS 1 | READ1 (3) | READ0 (5) | | MAP ADR | 1000 |
| | WR0 (1) | WRITE (5) | READ1 (2) | MAP ADR | 1001 |
| | MAP CNTL (8) | | | MAP ADR | 1010 |
| | MAP CNTL (8) | | | MAP ADR | 1011 |
| | MAP COEF (8) | | | MAP ADR | 1100 |
| | CORDIC COEF (8) | | | CORDIC ADR | 1101 |
| | MAP COEF (8) | | | MAP ADR | 1110 |
| | CORDIC COEF (8) | | | CORDIC ADR | 1111 |

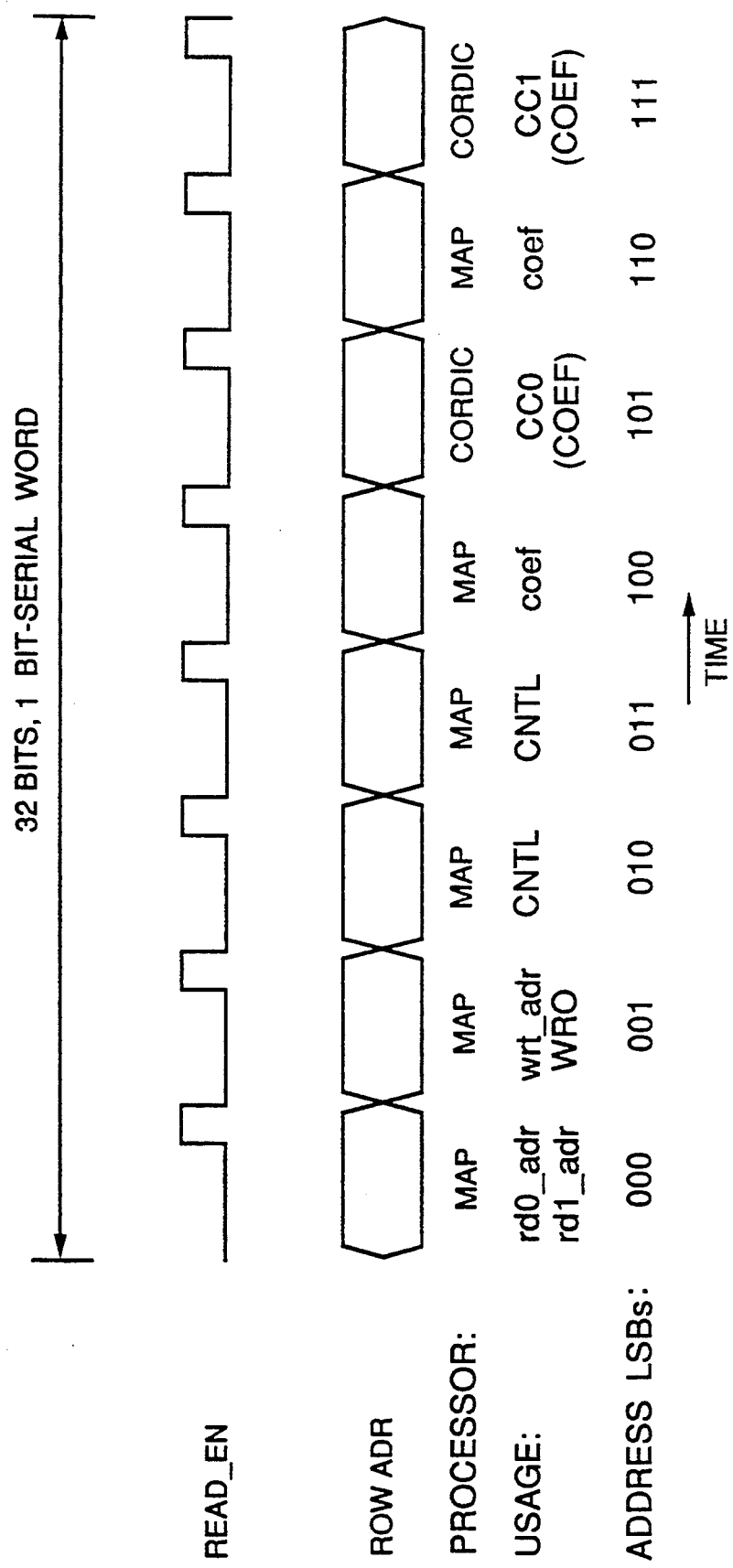
FIG. 4 ROM TIMING CHART

CORDIC PROCESSOR - INSTRUCTION FORMAT

FIG. 18

ARGUMENT & FUNCTION
ENCODING

| Code | yin | xin | func |
|---|---|---|---|
| 000 | oa1 | oa1 | arctan |
| 001 | oa2 | oa2 | divide |
| 010 | RC | RC | sqrt |
| 011 | RC-coef | RC-coef$_{-1}$ | —— |
| 100 | fa | fa | mag |
| 101 | f | f | —— |
| 110 | ns | ns | —— |
| 111 | np | np | —— |

FIG. 22

| read_0 address | read_1 address | coef | write address | data mux control bits | coef mux control bits | acc mux control bits | FLAGS |

MULTIPLY-ADD-PROCESSOR INSTRUCTION FORMAT

DATA ACQUISITION SYSTEMS WITH PROGRAMMABLE BIT-SERIAL DIGITAL SIGNAL PROCESSORS

The invention relates to programmable digital signal processors and, more particularly, to such processors operative on digital signals in bit-serial form and included in data acquisition systems.

BACKGROUND OF THE INVENTION

Bit-serial digital signal processing is known to be efficient, from the standpoint of the amount of digital hardware required, for computing fixed algorithms involving multiplication and addition processes. However, when programmable algorithms are to be employed, or when considerable memory is involved in carrying out an algorithm, as in a general-purpose computer or in a microprocessor, electronic designers have used bit-parallel processing instead of bit-serial digital signal processing.

Data acquisition systems for generating digital data for the purposes of computation may receive analog input signals from a plurality of sensors, which analog signals must be digitized before they can be used by a computer as a basis for supporting computations. It is desirable to include respective analog-to-digital converters for the analog output signals from the various sensors within the confines of an inexpensive single monolithic integrated circuit, together with some simple initial processing circuitry. Such data acquisition circuitry can be constructed using metal-oxide-semiconductor (MOS) integrated circuit technology and is suited for applications such as power metering and internal-combustion engine control.

Since the unit cost of monolithic integrated circuits tends to go up with the complexity of the digital hardware within their confines, analog-to-digital converters, multiplexers, and digital signal processors that are economical of the digital hardware involved were particularly considered by the inventors. Bit-serial multiplexers and processors are particularly economical of digital hardware; and an interconnection for a bit-serial signal requires but two lines, one line for conducting the serial flow of data bits, and the other line for conducting parsing signals. The speed requirements upon a digital signal processor in a data acquisition system are often not so onerous but that bit-serial computations are likely to be found to be fast enough. Oversampling analog-to-digital converters of sigma-delta type, particularly those with first-order sigma-delta modulators, are economical of digital hardware.

Bit-serial multipliers that are amenable to being laid out on a silicon substrate by a computer known as a silicon compiler are described by R. I. Hartley and S. E. Noujaim in their U.S. Pat. No. 4,860,240 issued Aug. 22, 1989 and entitled "LOW-LATENCY TWO'S COMPLEMENT BIT-SERIAL MULTIPLIER". Bit-serial multipliers that are amenable to being laid out on a silicon substrate by a computer known as a silicon compiler are also described by R. I. Hartley and P. F. Corbett in their U.S. Pat. No. 4,910,700 issued Mar. 20, 1990 and entitled "BIT-SLICED DIGIT-SERIAL MULTIPLIER"; and in their U.S. Pat. No. 4,939,687 issued Jul. 3, 1990 and entitled "SERIAL-PARALLEL MULTIPLIERS USING SERIAL AS WELL AS PARALLEL ADDITION OF PARTIAL PRODUCTS". R. I. Hartley and P. F. Corbett describe bit-serial adders that are amenable to being laid out on a silicon substrate by a computer known as a silicon compiler in their allowed U.S. patent application Ser. No. 265,210 filed Oct. 31, 1988 and now entitled "DIGIT-SERIAL LINEAR COMBINING APPARATUS USEFUL IN DIVIDERS". Oversampling analog-to-digital converters using first-order sigma-delta modulators are, by way of example, described by S. L. Garverick in U.S. Pat. No. 4,896,156 issued Jan. 23, 1990 and entitled "SWITCHED-CAPACITANCE COUPLING NETWORKS FOR DIFFERENTIAL-INPUT AMPLIFIERS, NOT REQUIRING BALANCED INPUT SIGNALS". P. L. Jacob and S. L. Garverick describe correcting for systematic errors in oversampling analog-to-digital converters in U.S. Pat. No. 4,951,052 issued Aug. 21, 1990 and entitled "CORRECTION OF SYSTEMATIC ERROR IN AN OVERSAMPLED ANALOG-TO-DIGITAL CONVERTER". Each of the foregoing patents is assigned to General Electric Company and is incorporated herein by reference.

SUMMARY OF THE INVENTION

The invention concerns a monolithic integrated circuit as may be used in combination with a plurality of sensors for generating respective sensor output signals, which monolithic integrated circuit includes means for converting each sensor output signal to bit-serial digital format, together with some initial processing circuitry comprising a bit-serial multiply-add processor. This processor includes a bit-serial digital multiplier for multiplying a first digital processor input signal in bit-serial form by a second digital processor input signal to generate a digital product signal, a digital adder for adding a third digital processor input signal to the digital product signal to generate a digital sum signal, and means for supplying a digital processor output signal with bits corresponding to those of said digital sum signal. A memory system provides for storing program instructions, values of the first digital processor input signal, values of the second digital processor input signal, values of the third digital processor input signal, and values of the digital processor output signal as written into the memory system. The first digital processor input signal can be selected from among the sensor output signals as converted to bit-serial digital format or from memory. The second digital processor input signals applied to the bit-serial multiply-add processor are at least at selected times read from the memory system, as are the third digital processor input signals applied to the bit-serial multiply-add processor. A controller retrieves stored program instructions in a prescribed order from the memory for storing program instructions and generates control signals for controlling at least the reading and writing of the memory system, as well as the selecting of the first digital processor input signal.

Other aspects of the invention concern the combination of the integrated circuit with sensors for monitoring voltages and currents of electric mains conductors and the usage of the combination for power metering. The plural-channel decimation filtering used after the sigma-delta modulators in the analog-to-digital conversion of analog sensor data is new. The bit-serial processor for making CORDIC, division and square rooting calculations is new.

BRIEF DESCRIPTION OF THE DRAWING

FIG. 3 is a diagram of the layout of stored information in the programmable read-only memory.

FIG. 4 is a timing diagram of the operation of the programmable read-only memory.

FIG. 18 is a table of argument and function selection coding as employed in CORDIC processor instructions per the FIG. 17 format, which instructions are used by the CORDIC processor of the FIG. 1 monolithic integrated circuit.

FIGS. 19A and 19B are the lefthand and the righthand portions of a composite block diagram of the processing carried out in the FIG. 1 monolithic integrated circuit, which composite block diagram is referred to as FIG. 19 in this specification.

FIG. 22 is a diagram of the multiplier-adder processor instruction format.

Throughout this drawing and the accompanying specification the symbol $\Delta$ without a number thereafter is used to denote the one-word (32-bit) delay operator. The symbol An where n is an integer is used to denote the n-bit delay operator. The symbol S&Hn is used to denote the operation of sampling and holding the $n^{th}$ bit of each bit-serial word in a stream of bit-serial words. The symbol $2^m$, where m is an integer in the range from $-31$ to zero, signifies a bit serial word in which the $(31+m)^{th}$ one of the successive bits in the 32-bit bit-serial words in a stream of bit-serial words is a ONEs and all other bits are ZEROs.

DETAILED DESCRIPTION

Figure 1:
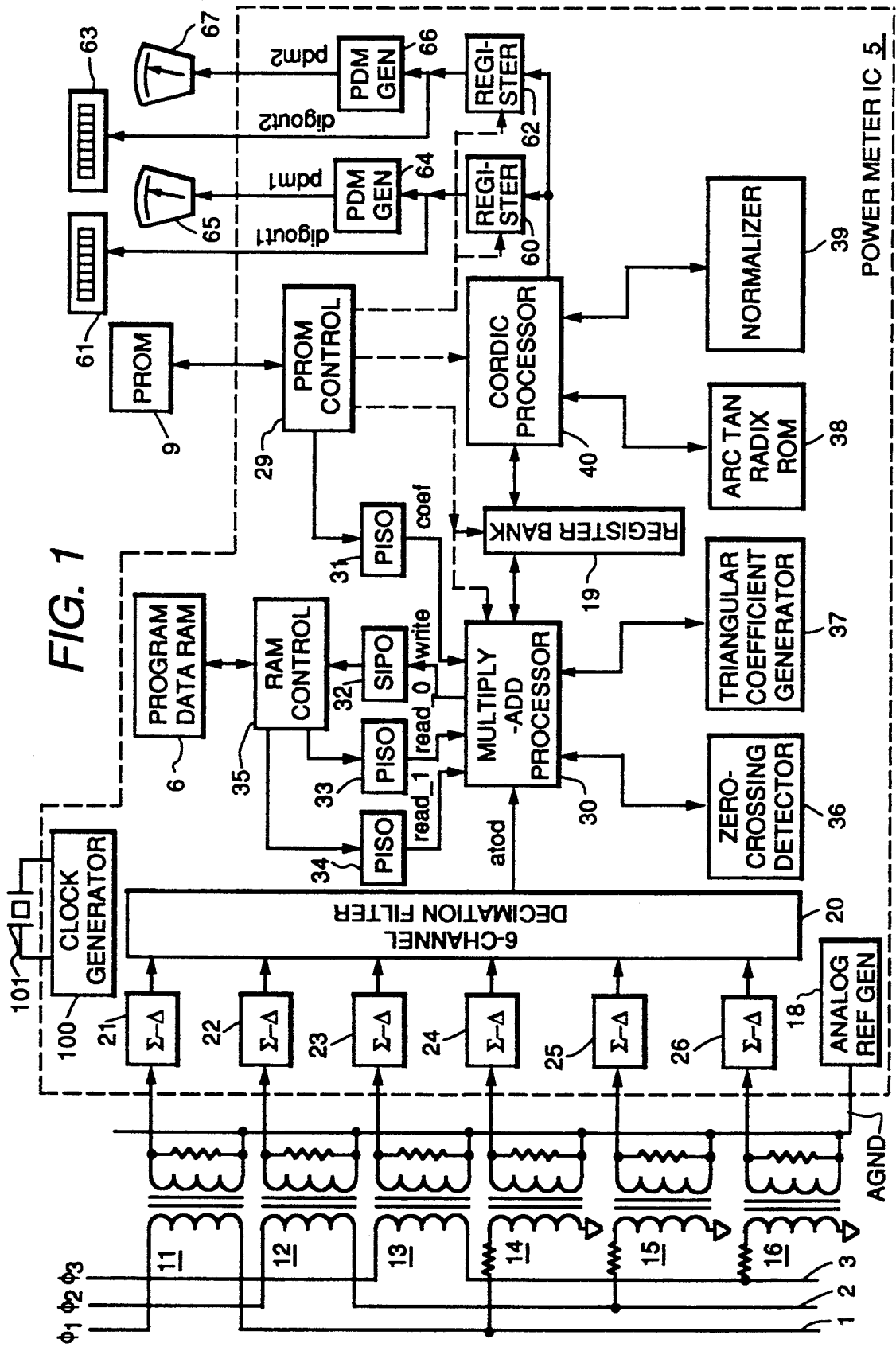
FIG. 1 is a schematic diagram of a monolithic integrated circuit connected for use in a power metering system, which monolithic integrated circuit embodies the invention in certain of its aspects and has therewithin oversampling analog-to-digital converters and a digital signal processor cascade operative on digital signals in bit-serial form.

In FIG. 1 a monolithic integrated circuit 5 is to be used for monitoring a three-phase power mains having a conductor 1 for a first phase of a-c current into which the primary winding of a current-sensing transformer 11 is inserted, a conductor 2 for a second phase of a-c current into which the primary winding of a current-sensing transformer 12 is inserted, and a conductor 3 for a third phase of a-c current into which the primary winding of a current-sensing transformer 13 is inserted. A voltage-sensing transformer 14 has its primary winding connected for sensing the voltage between ground and the first-phase conductor 1. A voltage-sensing transformer 15 has its primary winding connected for sensing the voltage between ground and the second-phase conductor 2. A voltage-sensing transformer 16 has its primary winding connected for sensing the voltage between ground and the third-phase conductor 3.

Sigma-delta modulators 21, 22 and 23 in integrated circuit 5 digitize the voltages supplied from the secondary windings of the current-sensing transformers 11, 12 and 13, respectively, to generate digital representations of the analog currents flowing in mains conductors 1, 2 and 3, respectively. Sigma-delta modulators 24, 25 and 26 in integrated circuit 5 digitize the voltages supplied from the secondary windings of the voltage-sensing transformers 14, 15 and 16, respectively, to generate digital representations of the analog voltages appearing on mains conductors 1, 2 and 3, respectively. The streams of output bits from the sigma-delta modulators 21–26 flow to respective input ports of a six-channel decimation filter 20, which cyclically supplies from an output port thereof to a bit-serial multiply-add processor 30 (which will be described presently in greater detail) decimated bit-serial representations of:

(1) the analog current flowing in mains conductor 1,
(2) the analog voltage on mains conductor 1,
(3) the analog current flowing in mains conductor 2,
(4) the analog voltage on mains conductor 2,
(5) the analog current flowing in mains conductor 3, and
(6) the analog voltage on mains conductor 3.

The multiply-add processor 30 supplies a bit-serial output signal to a bank 19 of bit-serial registers, from which bit-serial input signal can be taken by a CORDIC processor 40.

An analog reference voltage AGND against which to refer the voltages supplied from first ends of the secondary windings of transformers 11–16 to sigma-delta modulators 21–26 is applied to the second ends of these secondary windings from a generator 18 for this direct voltage, located within integrated circuit 5. Clock generator circuitry 100 located within integrated circuit 5 generates clocking signals at frequencies related in specified ratio to oscillations of a crystal-controlled oscillator (not shown separately) at a 10 MHz frequency controlled by a crystal 101. The 10 MHz oscillations are divided by four within the clock generator to generate 2.5 MHz clocking for the sigma-delta modulators 21–26 to determine their oversampling rate. The decimation filter 20 is clocked to update its response to the multiply-add processor 30 at 4.9 kHz word rate. The bank 19 of bit-serial registers is clocked to update its bit-serial input signal for the CORDIC processor 40 at a little over five Hz word rate.

A programmable read-only memory (PROM) 9 stores program instructions and coefficient data for the multiply-add processor 30, as well as storing program instructions for the CORDIC processor 40. PROM control circuitry 29 is located within integrated circuit 5, applies program instructions and coefficient data appropriately to the multiply-add processor 30, and applies program instructions appropriately to the CORDIC processor 40. PROM 9 is another monolithic integrated circuit (i-c) located externally to the integrated circuit 5, since PROM 9 preferably is of electrically-erasable. type, which is not easily combined with analog CMOS in a single i-c. The inventors use the NEC μPD28C04 electrically-erasable PROM, which is capable of storing 512 bytes and being read at a data rate of over 2.5 MHz, for the PROM 9. This PROM has 11 address lines and 8 data lines. The coefficients stored in the PROM 9 are sixteen-bit, two's complement numbers with the binary point following the most significant bit. The interface between integrated circuits 9 and 5 is seventeen bits wide, so a fair amount of power is required for high-speed driving across this interface.

A parallel-in/serial-out (PISO) converter 31, as controlled by the PROM control circuitry 29 (not specifically shown in FIG. 1), converts the coefficients stored in bit-parallel format in the PROM 9 to bit-serial format for application to the multiply-add processor 30. In the power metering system being specifically described, these coefficients invariably are used as multiplicands in the bit-serial multiplier portion of the processor 30; and the design of that bit-serial multiplier could be such that parallel-to-serial conversion would not be necessary. However, where the layout of that bit-serial multiplier on the integrated circuit dies is determined by a silicon compiler that permits only standardized bit-serial designs that accept only bit-serial signals through interfaces between functional elements, SIPO converter 31 is used, as shown in FIG. 1.

(The inventors used one silicon compiler program to lay out the program data RAM 6. The sigma-delta modulators 21–26 were laid out as macrocells, as were pulse duration modulators 63 and 64. Another silicon compiler program ((as described by F. Yassa, et al. in their paper "A Silicon Compiler for Digital Signal Processing: Methodology, Implementation and Applications" in the Proceedings of the IEEE, Vol. 75, pp. 1272–1282, September 1987)) was used to lay out the remaining bit-serial portions of the circuitry on i-c 5).

To conserve power for the high-speed driving of a random-access program data memory 6 for the multiply-add processor 30, the program data memory 6 is located within the integrated circuit 5. The writing of the memory 6 from and the reading of memory 6 to the multiply-add processor 30 is done via RAM control circuitry 35. A serial-in/parallel-out (SIPO) converter 32, as controlled by the RAM control circuitry 35 (not specifically shown in FIG. 1 ), converts the bit-serial program data from the multiply-add processor 30 to bit-parallel format for being stored in the memory 6. Parallel-in/serial-out (PISO) converters 33 and 34, as controlled by the RAM control circuitry 35 (not specifically shown in FIG. 1), converts the bit-parallel program data stored in the memory 6 two words at a time to respective first and second bit-serial streams of data for application to the multiply-add processor 30.

Accurate power measurement requires the multiply-add processor 30 to perform integrations over an integral number of cycles of the a-c signals on the mains conductors 1, 2 and 3. To detect integral number of cycles of these a-c signals, the multiply-add processor 30 supplies to a zero-crossing detector 36 high-pass-filtered versions of digital responses to these signals that the processor 30 receives from the decimation filters 27 and 28. The zero-crossing detector 36 returns indications of the zero-crossings back to the processor 30.

A triangular coefficient generator 37 communicates with the processor 30 and generates coefficients defining a triangular filter kernel when the processor 30 is programmed to perform $sinc^2$ low-pass filtering procedures.

The CORDIC processor 40 receives the bit-serial output signal from the multiply-add processor 30, as decimated in the bank 19 of bit-serial registers to a little over five Hz update rate. The arc tangent computations in the CORDIC processor 40 use algorithms of the nature described by J. E. Voider in the paper "The CORDIC Trignometric Computing Technique" appearing in the IRE Transactions on Electronic Computers, Vol. EC-8, No. 3, pp. 330–334, September 1959, as more specifically described by J. S. Walther in his paper "A Unified Algorithm for Elementary Functions" appearing in pages 379–385 of the digest of the Spring Joint Computer Conference, 1971 and as adapted for bit-serial operation. Arc tangent radix coefficients for the CORDIC processor 40 are stored permanently in a read-only memory 38 located within the integrated circuit 5. The CORDIC processor 40 also performs non-restoring division and non-restoring square root extraction using iterative techniques of the sorts generally described by H. W. Gschwind and E. J. McCluskey in pages 278–301 their book DESIGN OF DIGITAL COMPUTERS-An Introduction published in 1975 by Springer-Verlag of New York, Heidelberg and Berlin, but adapted for bit-serial operation. The latency through the CORDIC processor 40 is extended to two bit-serial words length to accommodate bit-serial operation, with its one-word-less-one-bit comparison times. Accordingly, the CORDIC processor 40 performs even and odd calculations on a time-interleaved basis. The CORDIC processor 40 is capable of computing the following primitive functions, where xin and yin are input variables selected to the CORDIC processor 40:

(a) yin/xin,
(b) yin$^{(\frac{1}{2})}$, (c) $\tan^{-1}$ (yin/xin), and (d) magnitude (xin, yin) = $(xin^2 + yin^2)^{(\frac{1}{2})}$.

A normalizer circuit 39 located within the integrated circuit 5 cooperates with the CORDIC processor 40 to provide for the calculation of the further primitive function:

(e) [sign (oa2)]*(cordic_out−L)/M.

Here L and M are constants contained in CORDIC program instructions supplied from the PROM 9; and [sign(oa2)] is the polarity of the value oa2 stored in a register. The signal cordic_out is a previous output from the CORDIC processor 40, and the further primitive function is generated using the yin/xin function of the CORDIC processor 40. The symbol * denotes multiplication throughout this specification.

Processing through the CORDIC processor 40 is done on a time-division-multiplexed basis, and provision is made for metering two functions at the same time. Accordingly, bit-serial indications of the one function digout1 are loaded during selected intervals into a register 60 for subsequent application to a digital meter 61; and bit-serial indications of the other function digout2 are loaded during selected intervals into a register 62 for application to a digital meter 63. A pulse duration modulator 64 responds to digout1 to supply pulses of corresponding duration as a signal pdm1 to a D'Arsonval meter 65. Similarly, a pulse duration modulator 66 responds to digout2 to supply pulses of corresponding duration as a signal pdm2 to another D—Arsonval meter 67.

Figure 2:
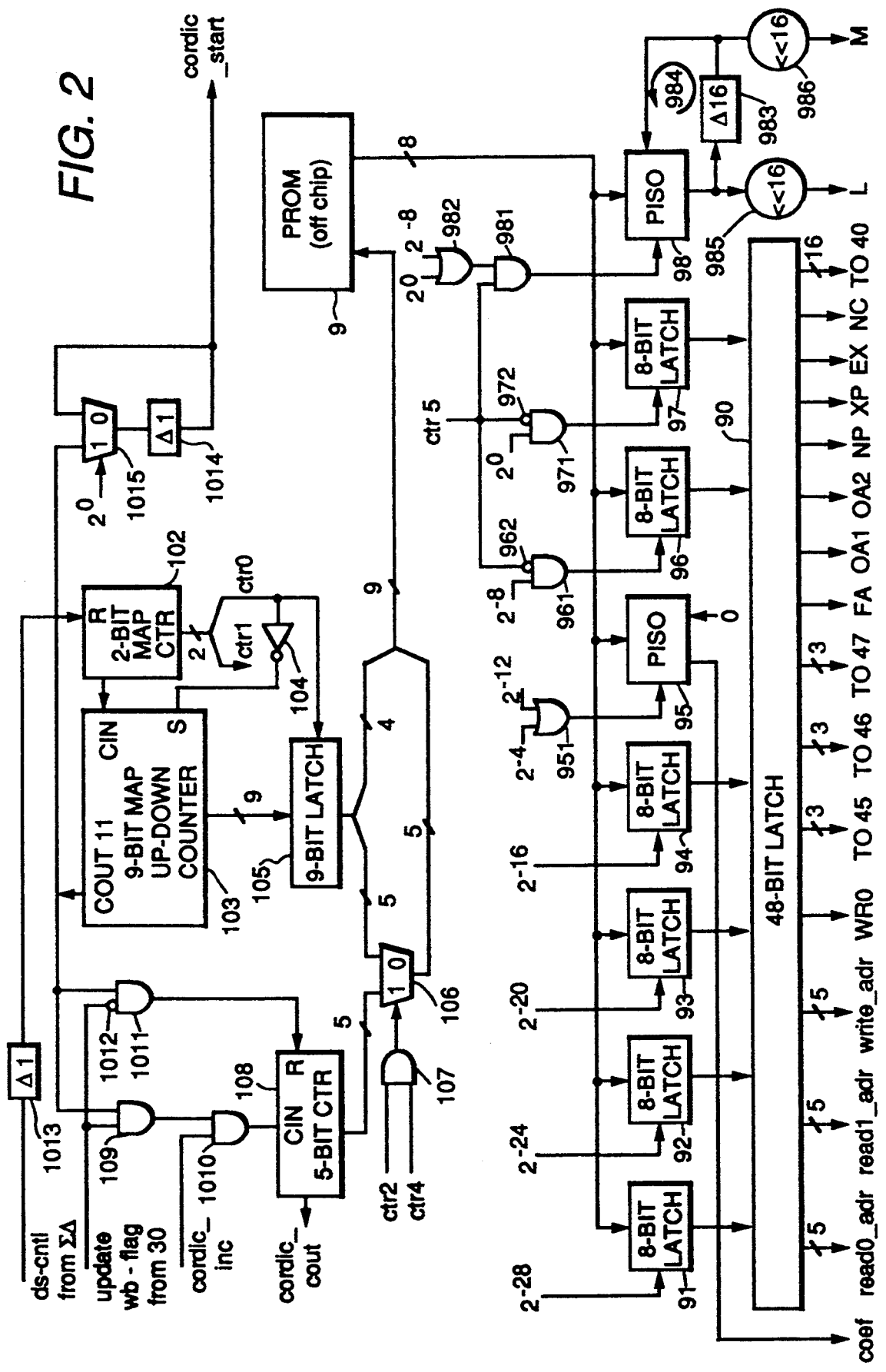
FIG. 2 is a schematic diagram of a portion of the control circuitry for the FIG. 1 power metering system, including circuitry for interfacing with the programmable read-only memory.

FIG. 2 shows the PROM control circuitry 29 and portions of the clock generator 100 on the power metering i-c 5 in greater detail, and connections of the PROM control circuitry 29 to the off-chip PROM 9.

An eleven-stage master counter in the clock generator 100 counts at four times the oversampling rate in the sigma-delta modulators 21–26. This eleven-stage master counter comprises a two-stage counter 102 generating a 2-parallel-bit relatively less significant count output and a further nine-stage counter 103 counting the overflow bits from the counter 102 and generating a 9-parallel-bit relatively more significant count output. The nine-stage counter 103 is of an up-down type in which the 9-parallel-bit count output can be selectively two's complemented, and such selective complementing is done responsive to the complement of the least significant bit of the count output of the counter 102, which complement is furnished via a logic inverter 104 as the signal saw to the decimation filter 20 of FIG. 1, which filter 20 is described in detail further on with reference to FIG. 7. This selective two's complementing is done so the 9-parallel-bit relatively more significant count output and its complement can be used as the rising and falling portions, respectively, of the triangular filter coefficients in the six-channel decimation filter 20, which is more specifically described in connection with FIG. 7.

The ds_cntl signal, generated at a 2.5 MHz rate by the sigma-delta modulators 21–26 each time their outputs are updated, is applied as a reset signal to the counter 102 to establish synchronization between the multiply-add processor 30 and the sigma-delta modulators 21–26.

Responsive to the least significant bit of the count output of the counter 102 being ONE, a 9-bit-wide parallel-bit latch 105 latches the up-count portion of counter 103 count output. The contents of latch 105 are used to address PROM 9 to access programmed instructions for the multiply-add processor 30. That is, the nine-stage counter 103 serves as the program counter for addressing the PROM 9 to read sequentially the programmed instructions for the multiply-add processor 30, on a continuing, cyclical basis. The four least significant bits temporarily stored in the latch 105 are forwarded directly to PROM 9 as address bits for accessing bytes in the 16-byte unit shown in FIG. 3. A multiplexer 106 selectively transmits the five most significant bits temporarily stored in the latch 105 to PROM 9 as address bits, responsive to a ZERO control signal being received from an AND gate 107.

The AND gate 107 supplies a ONE output signal only during the fifth, seventh, thirteenth and fifteenth bytes of PROM 9 output, responsive to both ctr2 and ctr4 signals being high. The ctr2 and ctr4 signals are the up counts from the second and fourth stages, respectively, of the master counter comprising counters 102 and 103, as obtained from the 9-bit latch 105. Responsive to a ONE control signal being received from the AND gate 107, the multiplexer 106 selectively transmits to PROM 9 as address bits the 5-parallel-bit count output of a counter 108. The PROM 9 is considered to have a three-bit-interval latency.

AND gates 109 and 1010 AND the coutll overflow from the counter 103 with the update_wb flag (as generated in the FIG. 11 circuitry) and a cordic_inc signal to generate the ONEs the five-stage counter 108 counts. The cordic_inc signal is a flag bit included in every instruction of the program for CORDIC processor 40, which flag bit is a ONE for every instruction but the last and then is a ZERO to halt the counter 108 at its full count. Accordingly, until the last instruction of the program for CORDIC processor 40, the counter 103 advances its count once every 2048 counts of the master counter comprising counters 102 and 103. The update_wb flag is complemented by the logic inverter 1012, and the complement is supplied to an AND gate 1011 as one of its input signals. The other input signal to the AND gate 1011 is the counter 103 overflow. If counter 103 overflow occurs other than when the update_wb flag is ONE, the AND gate 1011 will supply a ONE to reset the counter 108 to zero count.

ONEs indicating the clock cycle when the output signals from the sigma-delta modulators 21–26 are making their transitions are delayed one bit-serial clock delay in a clocked delay stage 1013 anti applied as reset signal to the two-stage counter 102, so the count conditions in the counters 102 and 103 are synchronized therefrom.

The final carry-out coutll of the master counter comprising counters 102 and 103, which occurs after count 2047 is reached, is selected to the input port of a clocked delay stage 1014 by a multiplexer 1015, responsive to bit-serial $2^0$ applied as its control signal being a ONE. During the next thirty-one bit intervals, when its control signal is ZERO, the multiplexer 1015 selects to the input port of the single-bit-delay clocked delay stage 1014 the signal from its output port, in a latching operation. The signal from the output port of the clocked delay stage 1014 is the cordic_start signal used by circuitry shown in FIGS. 9, 11, 13 and 15. This signal is high during the initial, zeroeth instruction of each cycle of sixty-four MAP instructions that is supplied to the multiply-add processor 30.

FIG. 3 diagrams the layout of the sixteen eight-bit bytes of information stored in the NEC μPD28C04 used as the PROM 9. The FIG. 2 circuitry successively extracts the sixteen bytes of stored program and coefficient information from the PROM 9, in the order shown in the FIG. 4 timing diagram. This reading of the PROM 9 will now be described in greater detail, referring to FIG. 2.

FIG. 3 shows a 48bit latch 90 that receives as its input signals output signals from eight-bit latches 91, 92, 93, 94, 96 and 97. (The 48bit latch 90 does not actually appear in the monolithic i-c's presently being fabricated, since the timing of each control signal is independently derived by the silicon compiler, but is a convenient fiction to help human minds to understand the operation of the i-c.) The zeroeth and eighth of the sixteen eight-bit bytes sequentially and cyclically read from PROM 9 are latched in the eight-bit latch 91, responsive to bit-serial $2^{-28}$; the first and ninth of the sixteen eight-bit bytes sequentially and cyclically read from PROM 9 are latched in the eight-bit latch 92, responsive to bit-serial $2^{-24}$; the second and the tenth of the sixteen eight-bit bytes sequentially and cyclically read from PROM 9 are latched in an eight-bit latch 93, responsive to bit-serial $2^{-20}$; and the third and eleventh of the sixteen eight-bit bytes sequentially and cyclically read from PROM 9 are latched in the eight-bit latch 94, responsive to bit-serial $2^{-16}$.

The fifth of the sixteen eight-bit bytes sequentially and cyclically read from PROM 9 are latched in the eight-bit latch 96, responsive to a latch instruction received thereby; and, responsive to another latch instruction eight bit intervals later, the eight-bit latch 97 latches the seventh of the sixteen eight-bit bytes sequentially and cyclically read from PROM 9. The latch instructions for latches 96 and 97 are shown as being provided from the output ports of AND gates 961 and 971, respectively. The AND gate 961 output signal goes to ONE when both bit-serial $2^{-8}$ and the output signal from a logic inverter 962 are ONEs. The AND gate 971 output signal goes to ONE when both bit-serial $2^0$ and the output signal from a logic inverter 972 are ONEs. The output signals from the logic inverters 962 and 972 go to ONE when ctr5 goes to ZERO. The ctr5 signal is the output signal during up count from the fifth (numbering from zeroeth) stage of the counter comprising counters 102 and 103, as latched in the latch 105.

Forty-eight bits are assumed to be temporarily stored in latch 90. Bits 0–4 in the output signal of latch 90 are applied to the RAM 6 (not shown in FIG. 2) as its read0 address read0_adr; bits 5–9 in the output signal of latch 90 are applied to the RAM 6 as its read1 address read-1_adr; and bits 10–14 in the output signal of latch 90 are applied to the RAM 6 as its write address write_adr. Bit 15 is the WR0 flag, which goes high to direct the writing of RAM 6 with its read_0 output. Bits 16–18 are the control signals for the multiplexer 45. Bits 19–21 are the control signals for the multiplexer 46. Bits 22–24 are the control signals for the multiplexer 47. Bits 25–28 are the load flags FA, OA1, OA2, and NP, respectively. Bit 29 is the XP flag. Bit 30 is the EZ flag. Bit 31 is unused. Bits 32–39, latched into the latch 90 from latch 96, are supplied to the cordic processor 40 as instruction CC0. Bits 40–47, latched into the latch 90 from latch 97, are supplied to the cordic processor 40 as instruction CC1.

The fourth, sixth, twelfth, and fourteenth of the sixteen eight-bit bytes sequentially and cyclically read from PROM 9 are loaded in parallel into a parallel-in/serial-out register 95, which has 8-bit temporary storage capability for the coef signals to be supplied to the multiply-add processor 30. An OR gate 951 supplies a ONE responsive to bit-serial $2^{-12}$ for commanding the loading of the fourth and twelfth of the sixteen eight-bit bytes sequentially read from PROM 9 into the SIPO register 95, as the initial portion of the coef signal made available to a multiplexer 46 (shown in FIG. 9). The OR gate 951 also supplies a ONE responsive to bit-serial $2^{-4}$ for commanding the loading of the sixth and fourteenth of the sixteen eight-bit bytes sequentially read from PROM 9 into the SIPO register 95, as the final portion of the coef signal made available to the multiplexer 46.

The thirteenth and fifteenth of the sixteen eight-bit bytes sequentially and cyclically read from PROM 9 are loaded in parallel into a parallel-in/serial-out register 98, responsive to an AND gate 981 supplying a ONE, responsive to ctr5 signal going to ONE at the same time as the output signal of an OR gate 982. The output signal of the OR gate 982 goes to ONE responsive to either bit-serial $2^0$ or bit-serial $2^{-8}$ being a ONE. The bit-serial signal from the serial output port of the parallel-in/serial-out register 98 is applied to the input port of a 16-bit clocked delay line 983, which has its output port connected back to the serial input port of the PISO register 98 to form a circulating serial-memory loop 984. This circulating serial-memory loop 984 supplies at the output port of the clocked delay line 983 the thirteenth and fifteenth eight-bit bytes from PROM 9 as temporarily stored in the circulating serial-memory loop 984, in parallel with the current thirteenth and fifteenth eight-bit bytes from PROM 9 as read directly from the parallel-in/serial-out register 98. Each successive pair of thirteenth and fifteenth eight-bit bytes from PROM 9 is read from the parallel-in/serial-out register 98 to a shifter circuit 985 that shifts those sixteen bits to sixteen bits greater significance, filling sixteen ZEROs before those bits and discarding the sixteen succeeding bits, thereby generating an L coefficient utilized by the normalizer 39. At the same time each successive pair of thirteenth and fifteenth eight-bit bytes from PROM 9 are read from the delay line 983 to a shifter circuit 986 that shifts those sixteen bits to sixteen bits greater significance, filling sixteen ZEROs before those bits and discarding the sixteen succeeding bits, thereby generating an M coefficient utilized by the normalizer 39. Accordingly, L is the value of the coefficient in the current CORDIC instruction, and M is the value of the coefficient in the previous CORDIC instruction as iterated by being cycled once around the loop 984. (How the normalizer 39 utilizes the L and M coefficients is described in detail further on in this specification, with reference to FIG. 9).

Figure 5:
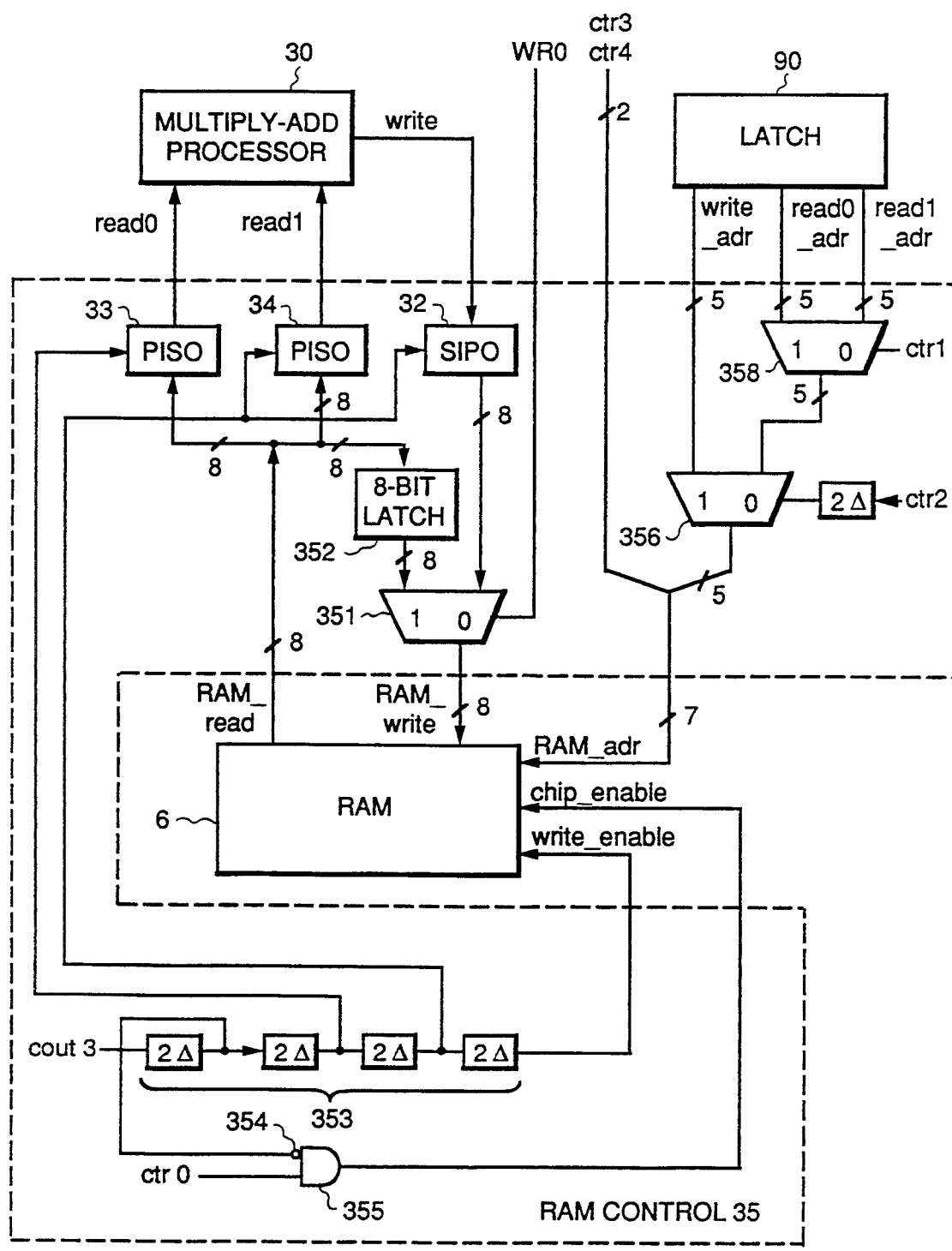
FIG. 5 is a schematic diagram of another portion of the control circuitry in the FIG. 1 power metering system, including circuitry for interfacing with the random-access memory.

FIG. 5 shows in greater detail the RAM control circuitry 35 and its interconnections to the RAM 6, the serial-in/parallel-out register 32 and the parallel-in/serial-out registers 33 and 34. The connections of the multiply-add processor 30 to the registers 32, 33 and 34 are also shown. The connection of the SIPO register 32 to the write input port of the RAM 6 is shown to be made selectively via a multiplexer 351 responsive to the WR0 flag in the multiply-add processor 30 instruction being ZERO. When the WR0 flag is a ONE, the multiplexer 351 selects to the RAM 6 as its write input its read0 output as read out two bits previously and temporarily stored in an eight-bit-wide, parallel-bit latch 352.

Figure 6:
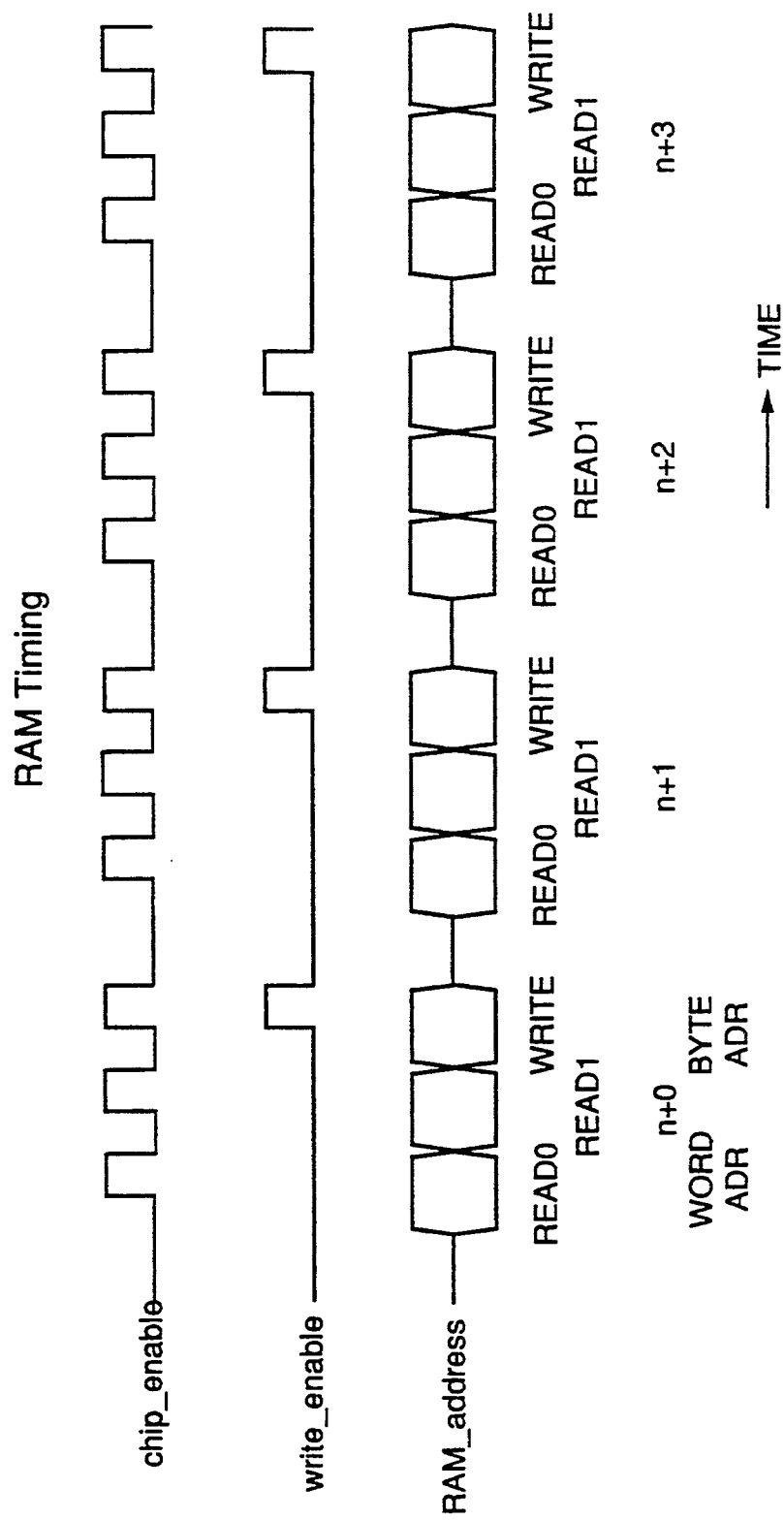
FIG. 6 is a timing diagram of the operation of the random-access memory.

As shown in the FIG. 6 timing diagram for the RAM 6, in each cycle of RAM operation, the READ0, READ1 and WRITE accesses to the RAM 6 are carried out sequentially during respective ones of the four successive counts of the initial stage of counter 102. The READ0, READ1 and WRITE accesses are preceded by another count in the 4-count cycle of the counter 102 when the RAM 6 is not accessed. A cout3 signal supplied from the counter 103 (of FIG. 2) responsive to overflow indications from the initial stage of the counter 102 (of FIG. 2) is delayed for 2-bit, 4-bit, 6-bit and 8-bit durations in a clocked delay line 353 to generate, respectively, an input signal to a logic inverter 354, load instructions for the PISO register 33 and the latch 352, load instructions for the SIPO register 32 and the PISO register 34, and the write_enable signal applied to the RAM 6 during the WRITE access. A chip_enable signal is supplied from an AND gate 354 to the RAM 6 during each of the READ0, READ1 and WRITE accesses. The two-input AND gate 355 responds to the ctr0 signal applied as one of its input signals going to ONE at the same time the output signal from the logic inverter 354 goes to ONE, which occurs two bit durations after the ctr3 signal goes to ZERO.

A multiplexer 356 is controlled by the ctr2 signal from the counter 102 as delayed by a two-bit interval in a clocked delay line 357. Two bit intervals after the ctr2 signal from the counter 102 goes to ONE, the multiplexer 356 selects the 5-bit write_adr signal from the latch 90 to be applied to the RAM 6 together with the ctr3 and ctr4 outputs taken from the counter 103. The multiplexer 356 responds to the ctr2 signal, as delayed for two bits duration in the clocked delay line 357, being a ZERO to select the 5-bit wide output signal from a multiplexer 358 to be applied to the RAM 6 together with the ctr3 and ctr4 outputs from the counter 103 as the 7-bit (read) address for RAM 6. The multiplexer 358 responds to the ctr1 signal from the counter 102 being a ONE to select to its output port the 5-bit read0_adr signal from the latch 90. The multiplexer 358 responds to the ctr1 signal from the counter 102 being a ZERO to select to its output port the 5-bit read1_adr signal from the latch 90.

Figure 7:
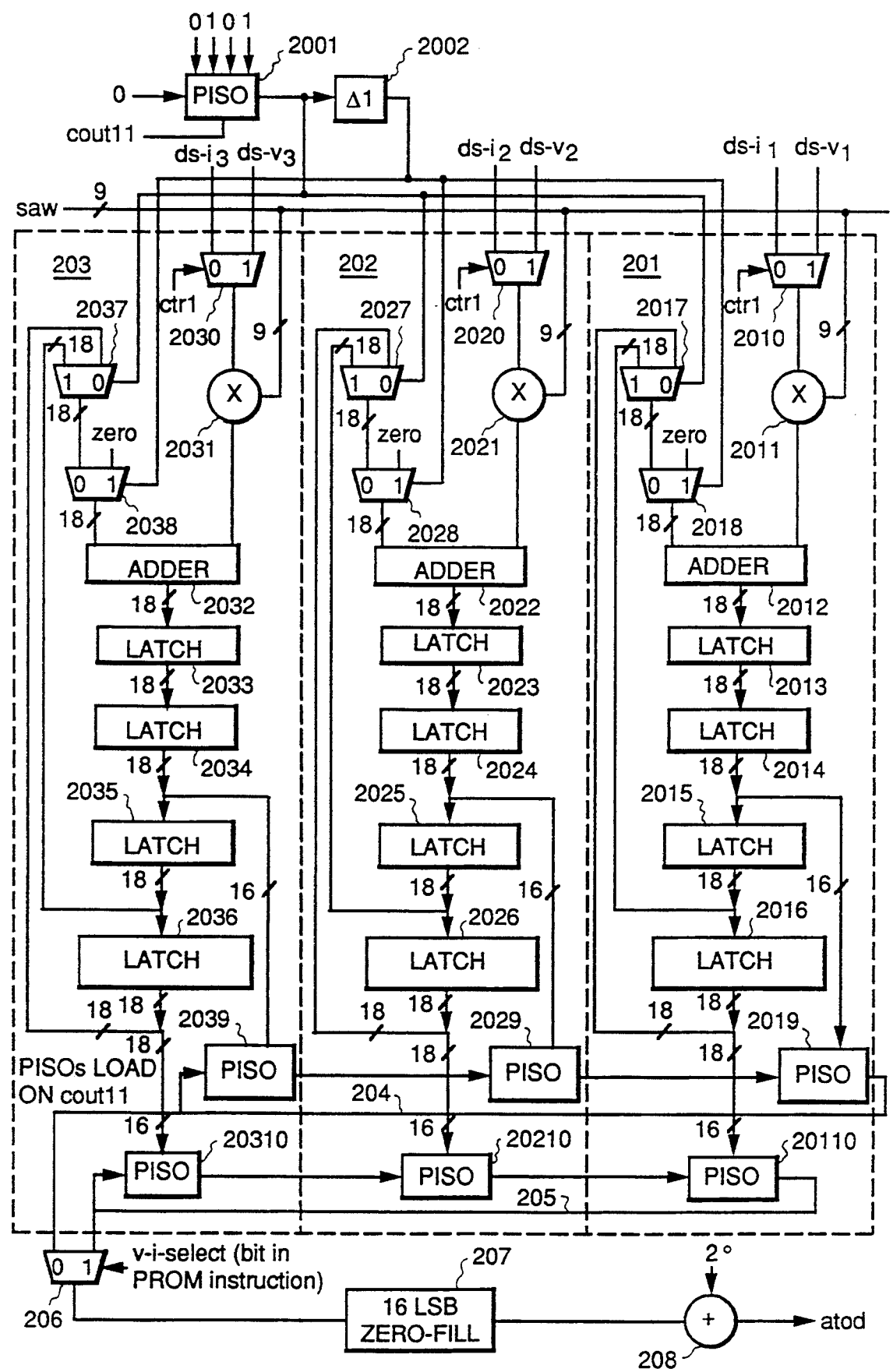
FIG. 7 is a schematic diagram of the multiple-channel decimation filter used between the oversampling analog-to-digital converters and the digital signal processor cascade in FIG. 1.

FIG. 7 shows the six-channel decimation filter 20 in greater detail. The output samples $ds\text{-}i_1$ from the sigma-delta modulator 21 and the output samples $ds\text{-}v_1$ from the sigma-delta modulator 24 are filtered on a time-division-multiplexed basis by decimation filter channel 201. The decimation filter channel 201 includes a multiplexer 2010 that responds to the count output ctr1 from the less rapidly changing more-significant-bit output from the two-stage counter 102 (of FIG. 2) to select between the output samples $ds\text{-}i_1$ from the sigma-delta modulator 21 and the output samples $ds\text{-}v_1$ from the sigma-delta modulator 24.

The selected signal is supplied from the multiplexer 2010 as a stream of bits, each successive single bit of which stream is used as the multiplier signal for a multiplier 2011 that receives a bit-parallel multiplicand signal saw from the nine-stage counter 103 (of FIG. 2), which counter counts the overflow from the two-stage counter 102. The multiplier 2011 comprises a plurality of AND gates receiving as their respective first input signals the respective bits of the saw signal and receiving as their respective second input signals the respective bits of the multiplexer 2010 output signal. The saw signal is the positive up count from the nine-stage counter 103 when the count output ctr0 generated by the more rapidly changing less-significant-bit output from the two-stage counter 102 is a ONE; when the count output ctr0 generated by the more rapidly changing less-significant-bit output from the two-stage counter 102 is a ZERO, the saw signal is the negative down count from the nine-stage counter 103. This facilitates the interleaved accumulations of input signal samples as convolved with a set of rising triangular coefficients and as convolved with a set of falling triangular coefficients.

The parallel-bit products of $ds\text{-}i_1$ convolved with the falling filter coefficients, of $ds\text{-}i_1$ convolved with the rising filter coefficients, of $ds\text{-}v_1$ convolved with falling filter coefficients, and of $ds\text{-}v_1$ convolved with the rising filter coefficients are supplied on a time-division-multiplexed basis from the multiplier 2011 to a parallel-bit digital adder 2012 as its addend signal. The digital adder 2012 supplies its sum output to a cascade of word latches 2013, 2014, 2015 and 2016. The word latches 2013, 2014, 2015 and 2016 clock their contents forward at the clocking rate of the counter 102 (of FIG. 2). During the time-division-multiplexed accumulations involving the digital adder 2012, multiplexers 2017 and 2018 select the output signal from the latch 2016 to the adder 2012 as its augend input signal.

The cout11 overflow indication going to ONE is used as a load instruction to condition a parallel-in/serial-out stage 2019 to load itself from latch 2014 contents, the convolution of the $ds\text{-}v_1$ samples with a complete set of triangular filter coefficients. The cout11 overflow indication going to ONE also is used as a load instruction to another parallel-in/serial-out stage 20110 to load itself from latch 2016 contents, the convolution of the $ds\text{-}i_1$ samples with a complete set of triangular filter coefficients.

A parallel-in/serial-out register 2001 is loaded through its parallel-bit input port with a 0101 parallel-bit signal responsive to cout11 overflow indication from the counter 103 (of FIG. 2) being ONE as maximum count is reached. A serial-bit input port of the PISO register 2001 is supplied with ZERO input. After the cout11 overflow indication returns to ZERO, the SIPO register 2001 supplies a 1010 bit sequence followed by ZEROs until cout11 overflow indication next goes to ONE. This output signal from the PISO register 2001 controls the selection made by the multiplexer 2017. This output signal from the PISO register 2001 is delayed by one clock interval in a clocked latch 2002 to generate the signal that controls the selection made by the multiplexer 2018.

On the first clock cycle following the cout11 overflow indication being ONE, the final result of the accumulation of $ds\text{-}i_1$ convolved with rising filter coefficients stored in the latch 2015 is selected by the multiplexer 2017 to the augend input of adder 2012 to pre-condition the accumulation of ds-i1 convolved with falling filter coefficients. On the second clock cycle following the cout11 overflow indication being ONE, arithmetic zero is selected by the multiplexer 2018 to the input port of adder 2012 to pre-condition the accumulation of ds-i1 convolved with rising filter coefficients. On the third clock cycle following the cout11 overflow indication being ONE, the final result of the accumulation of ds-v1 convolved with rising filter coefficients stored in the latch 2015 is selected by the multiplexer 2017 to the augend input of adder 2012 to pre-condition the accumulation of ds-v1 convolved with falling filter coefficients. On the fourth clock cycle following the cout11 overflow indication being ONE, arithmetic zero is again selected by the multiplexer 2018 to the input of adder 2012 to pre-condition the accumulation of ds-v1 convolved with rising filter coefficients.

The output samples ds-i$_2$ from the sigma-delta modulator 22 and the output samples ds-v$_2$ from the sigma-delta modulator 25 are filtered on a time-division-multiplexed basis by decimation filter channel 202. Elements 2020–2029 and 20210 in the decimation filter channel 202 correspond to respective ones of the elements 2010–2019 and 20110 in the decimation filter channel 201. The output samples ds-i$_3$ from the sigma-delta modulator 23 and the output samples ds-v$_3$ from the sigma-delta modulator 26 are filtered on a time-division-multiplexed basis by decimation filter channel 203. Elements 2030–2039 and 20310 in the decimation filter channel 202 correspond to respective ones of the elements 2010–2019 and 20110 in the decimation filter channel 201. The multiplexers 2027 and 2037 are, like the multiplexer 2017, controlled by the output signal from the PISO register 2001; and the multiplexers 2028 and 2038 are, like the multiplexer 2018, controlled by the output signal from the clocked latch 2002. The parallel-in/serial-out stages 2039, 2029 and 2019 are connected in a loop 204 of bit-serial memory. The parallel-in/serial-out stages 20310, 20210 and 20110 are connected in another loop 205 of bit-serial memory. A multiplexer 206 responds to a v-i-select bit in the multiply-add processor 30 instructions, as furnished from the PROM 9, to select sixteen-bit chunks from one of the bit-serial memory loops 204 and 205 for reading to circuitry 207, which precedes each of these chunks with sixteen fill ZEROs to form a 32-bit data word forwarded to a bit-serial adder 208 as its addend input signal. The adder 208 receives bit-serial 2$^0$ as its augend input, so it provides a two's complement signed 32-bit data word responsive to the uni-polarity 32-bit data word received as its addend input signal.

Figure 8:
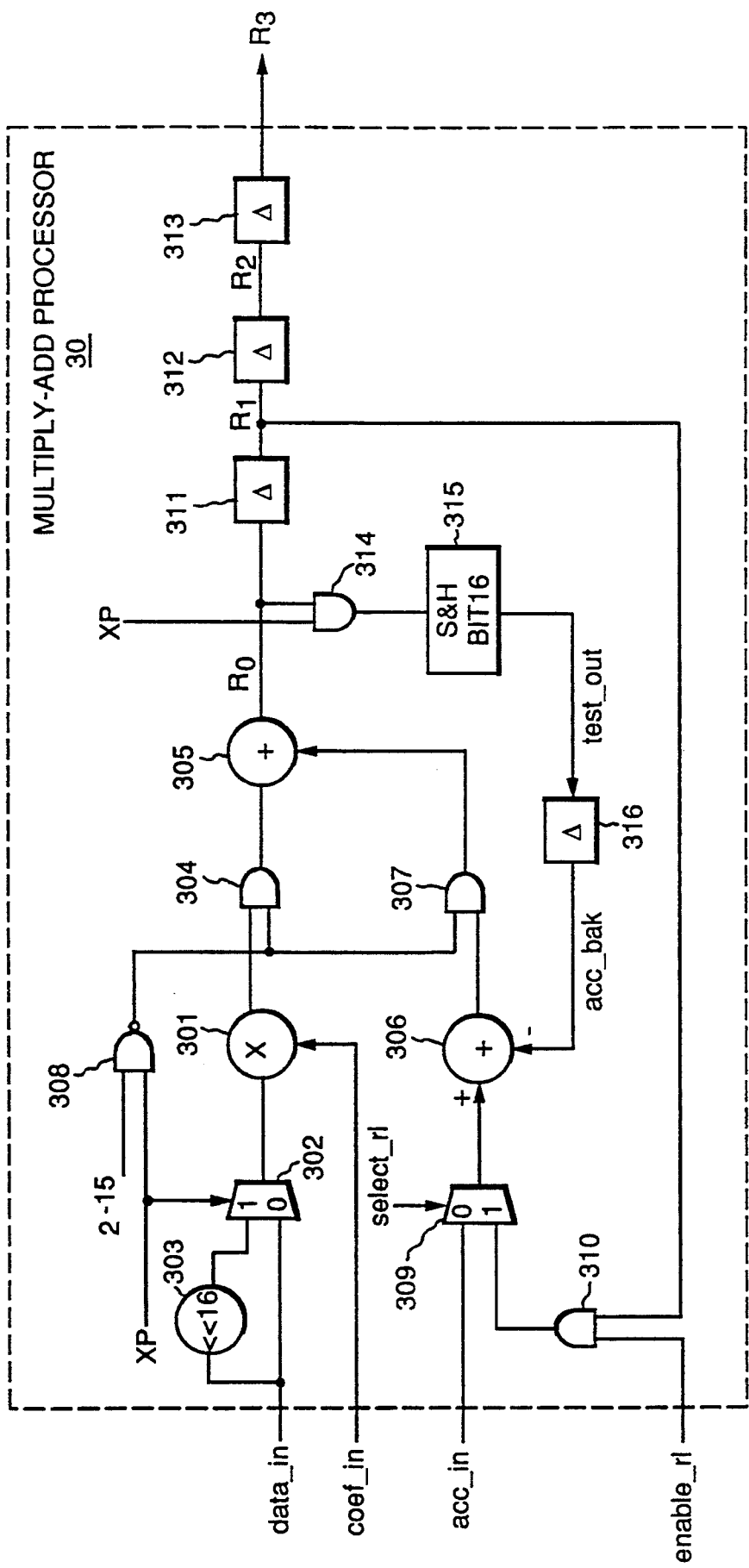
FIG. 8 is a schematic diagram of the bit-serial multiply-add processor that is the initial processor in the FIG. 1 digital signal processor cascade.

FIG. 8 shows the multiply-add processor 30 in greater detail. A select-R$_1$ signal, an enable-R$_1$ signal and an XP signal are each what is termed a "logic signal". A "logic signal" is a signal, usually used for control purposes, that is constant during a bit-serial word, 32 clock cycles in the case of the power metering i-c 5. The constant $2^{-15}$ is a bit-serial word which has only its bit 16 set high to a ONE, where the least significant bit is bit 0.

A bit-serial multiplier 301 receives a bit-serial coef(-ficient)_in as a multiplicand signal. Its bit-serial multiplier signal is received from the output port of a two-input multiplexer 302 that receives a bit-serial data_in signal at one of its input ports and that receives at the other of its input ports the data_in signal as multiplied by $2^{16}$ in a left shifter 303 which is implemented by a sixteen-binary-place shift towards more significance and zero-filling. The bit-serial product from the bit-serial multiplier 301 is selectively applied via an AND gate 304 as addend input signal to a bit-serial adder 305. The bit-serial difference output signal from a bit-serial subtractor 306 is selectively supplied via an AND gate 307 as the bit-serial augend input signal for the bit-serial adder 305. A NAND gate 308 outputs a ONE that conditions the signal at the AND gate 304 output port to be the same as the bit-serial product from the multiplier 301 and that conditions the signal at the AND gate 307 output port to be the same as the bit-serial difference output signal from the subtractor 306 except when bit 16 occurs at the same time the logic signal XP is high in extended-precision processing. The logic signal XP is a flag signal that is a portion of certain of the programmed instructions for the multiply-add processor 30. A two-input multiplexer 309 applies a bit-serial acc-(umulator)_in signal as minuend input signal to the subtractor 306, except during certain accumulations when a select-R$_1$ signal supplied to the multiplexer 309 is a ONE causing it to select to its output port the bits appearing serially from the output port of an AND gate 310.

The bit-serial sum output signal R$_0$ from the adder 305 is the input signal for a one-word-length clocked delay line 311 that generates a bit-serial signal $R_1 = \Delta R_0$. The bit-serial sum output signal R$_1$ from the clocked delay line 311 is supplied as one of the two input signals to the AND gate 310, the other input thereto being the enable-R$_1$ logic signal. The bit-serial sum output signal R$_1$ from the clocked delay line 311 is the input signal for a one-word-length clocked delay line 312 that generates a bit-serial signal $R_2 = \Delta R_1$. The bit-serial sum output signal R$_2$ from the clocked delay line 312 is the input signal for a one-word-length clocked delay line 313 that generates a bit-serial signal $R_3 = \Delta R_2$.

The bit-serial sum output signal R$_0$ from the adder 305 is applied to one input port of an AND gate 314, the other input port of which receives the XP logic signal. The output port of the AND gate 314 is supplied to a sample-and-hold circuit 315 that puts out a logic signal according to the state of bit 16 of its input signal, in which the least significant bit is bit 0. The logic signal from the output port of the AND gate 314 is delayed for the duration of one bit-serial word before being applied to the subtrahend input port of the bit-serial subtractor 306.

Normally (the input logic signals all set to ZERO), the multiply-add processor 30 multiplies data_in and coef_in signals to produce a product which is added to acc_in signal. The bit-serial multiplier 301 is built from sixteen coefficient slices, so only the sixteen most significant bits of the coefficient are used in the multiplication. The output of the bit-serial multiplier is a 32-bit bit-serial word which is equivalent to the thirty-two most significant bits of the 47-bit complete product of the 32-bit-per-word data_in word and the 16-bit-per-word coef_in signal, both of which signals are signed numbers in two's complement representation. The fifteen least significant bits of the product are discarded in the internal circuitry of the bit-serial multiplier 301.

In extended precision mode, the flag signal XP supplied as a part of the current programmed instruction for the processor 30 is set high during the first word of each successive two-word operation. The signals data_in and coef_in must be repeated during both words, while the signal acc_in and the multiplier output are the least significant (first word) and most significant (second word) portions of a two-word quantity. When XP is high, the data input to the multiplier 301 selected by the multiplexer 302 is data_in as pre-shifted to the left by sixteen bits and zero-filled by the left shifter 303. Therefore, during the first word of an extended precision operation, the output of the multiplier 301 is similar to that obtained by discarding the sixteen most significant bits of the 47-bit complete product instead of the fifteen least significant bits. However, owing to misinterpretation of the sign bit of the data word by the multiplier 301, only the sixteen least significant bits are valid. To summarize, the output of the multiplier 301 during the first word will have a ZERO as least significant bit, followed by the fifteen least significants of the 47-bit complete product, followed by sixteen "garbage" bits.

When the multiplier output is added to the least-significant word from acc—in, AND gates 304 and 307 are operative to mask bit 16 of both the addend and augend inputs of adder 305 responsive to the NAND gate 308 output signal being ZERO because of XP and $2^{-15}$ being simultaneously high. Therefore, bit 16 of the adder 305 sum output is equivalent to the carry bit from the addition of the sixteen least significant bits, i.e., the valid portion of the word. This bit is sampled and held by a sample-and-hold circuit 315 to produce the logic signal test—out, which is delayed in a clocked latch 316 to generate a logic signal acc-bak for use in the following word.

During the second word of an extended precision operation, XP logic signal is zero. In fact, there is no apparent difference between a single-precision operation and the second word of an extended-precision operation. As previously stated the data—in and acc—in input signals from the previous word should be repeated, and the more significant word of a two-word acc—in should now be applied. If the less significant portion of the two-word operation yielded a carry, the logic signal acc—bak will be high during the most significant portion of the extended precision operation. The logic signal acc—bak is subtracted from acc—in. Since, a high logic signal has a two's complement value of $-1$, a carry from the least significant word causes the most significant word to be incremented. A logic signal of ZERO has a two's complement value of zero; thus, when there is no carry from the least significant word, the second word is unaffected. The net effect of the extended-precision operation is that the complete 47-bit product of the data—in and coef—in signals is preserved in the accumulation. The dynamic range of the accumulator is also forty-seven bits, since the least significant bit and the sixteen most significant bits of the least significant word are not useful.

Figure 9:
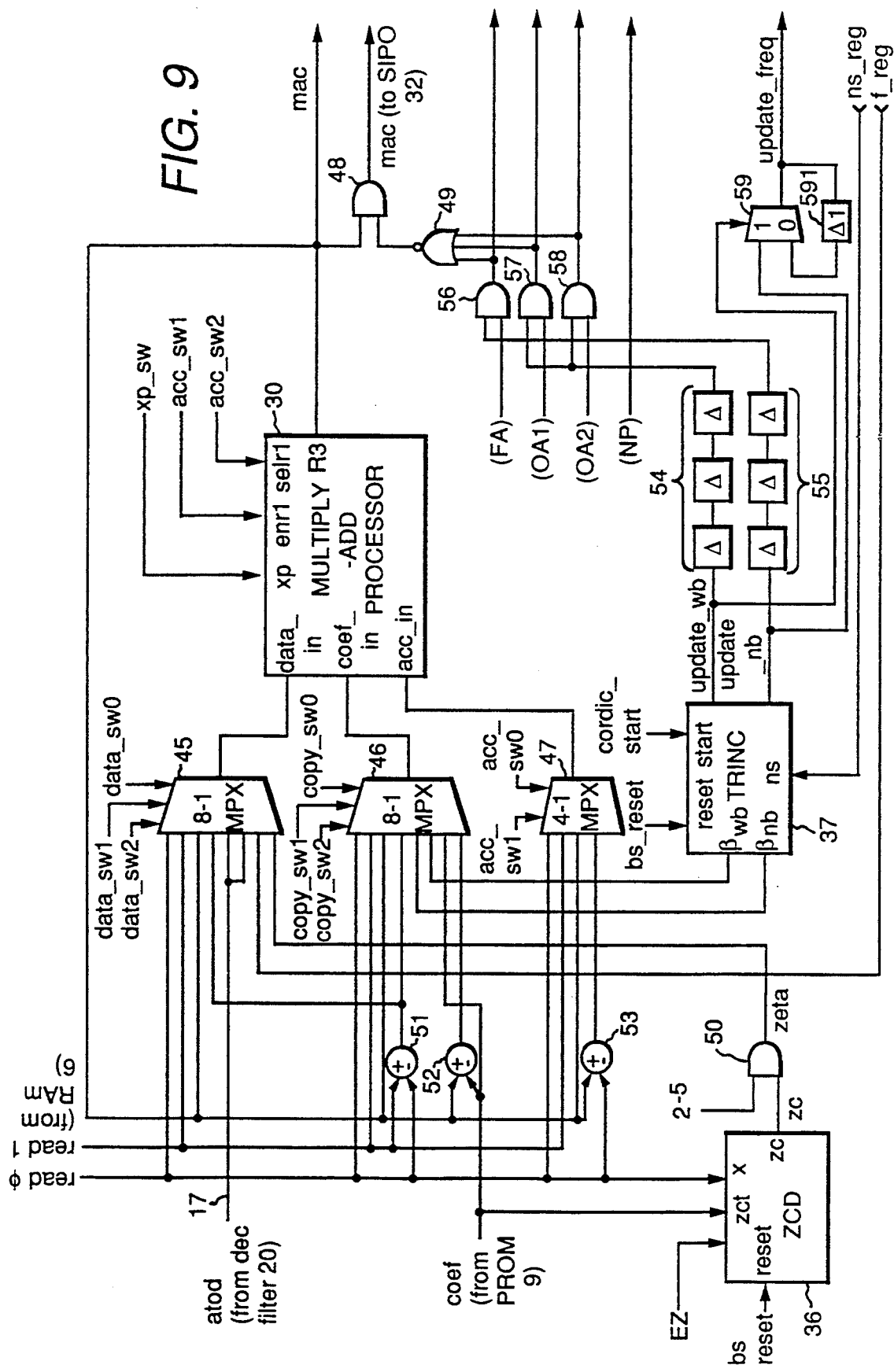
FIG. 9 is a schematic diagram showing the connections of the FIG. 8 bit-serial multiply-add processor to other elements in the FIG. 1 power metering system.

FIG. 9 shows in greater detail the connections of the multiply-add processor 30 to other circuitry. An eight-input multiplexer 45 selects the data—in signal applied to the multiply-add processor 30. The bit-serial data—in signal can be selected from:

(000) a read—0 signal supplied from RAM 6 via the PISO register 33, (001) a read—1 signal supplied from RAM 6 via the PISO register 34, (010) the output signal of the multiply-add processor 30, (011) the difference between read—0 and read—1 signals from a subtractor 51, (100) the output signal of the decimation filter 20, (101) the output signal of the decimation filter 20, (110) an indication f of frequency drawn from a register 192 in the bank 19 of bit-serial registers, and (111) zero-crossing indications from an AND gate 50.

Another eight-input multiplexer 46 selects the coef—in signal applied to the multiply-add processor 30. The bit-serial coef—in signal can be selected from:

(000) the read—0 signal supplied from RAM 6 via the PISO register 33, (001) the read—1 signal supplied from RAM 6 via the PISO register 34, (010) the output signal of the multiply-add processor 30, (011) the difference between read—0 and read—1 signals, as determined by the subtractor 51, (100) relatively high-frequency $sinc^2$ filter coefficients $\beta_{nb}$ from the triangular coefficient generator 37, (101) relatively low-frequency $sinc^2$ filter coefficients $\beta_{wb}$ from the triangular coefficient generator 37, (110) the coef signal supplied from PROM 9 via the PISO register 95, and (111) the sum of the output signal of the multiply-add processor 30, and the coef signal supplied from PROM 9 via the PISO register 95, as determined by a an adder 52.

A four-input multiplexer 47 selects the acc—in signal applied to the multiply-add processor 30. The bit-serial acc—in signal can be selected from:

(00) the read—0 signal supplied from RAM 6 via the PISO register 33,

(01) the read—1 signal supplied from RAM 6 via the PISO register 34,

(10) the output signal of the multiply-add processor 30, and

(11) the difference between the output signal of the multiply-add processor 30 and the read—0 signal supplied from RAM 6 via the PISO register 33, as determined by a subtractor 53.

Figure 16:
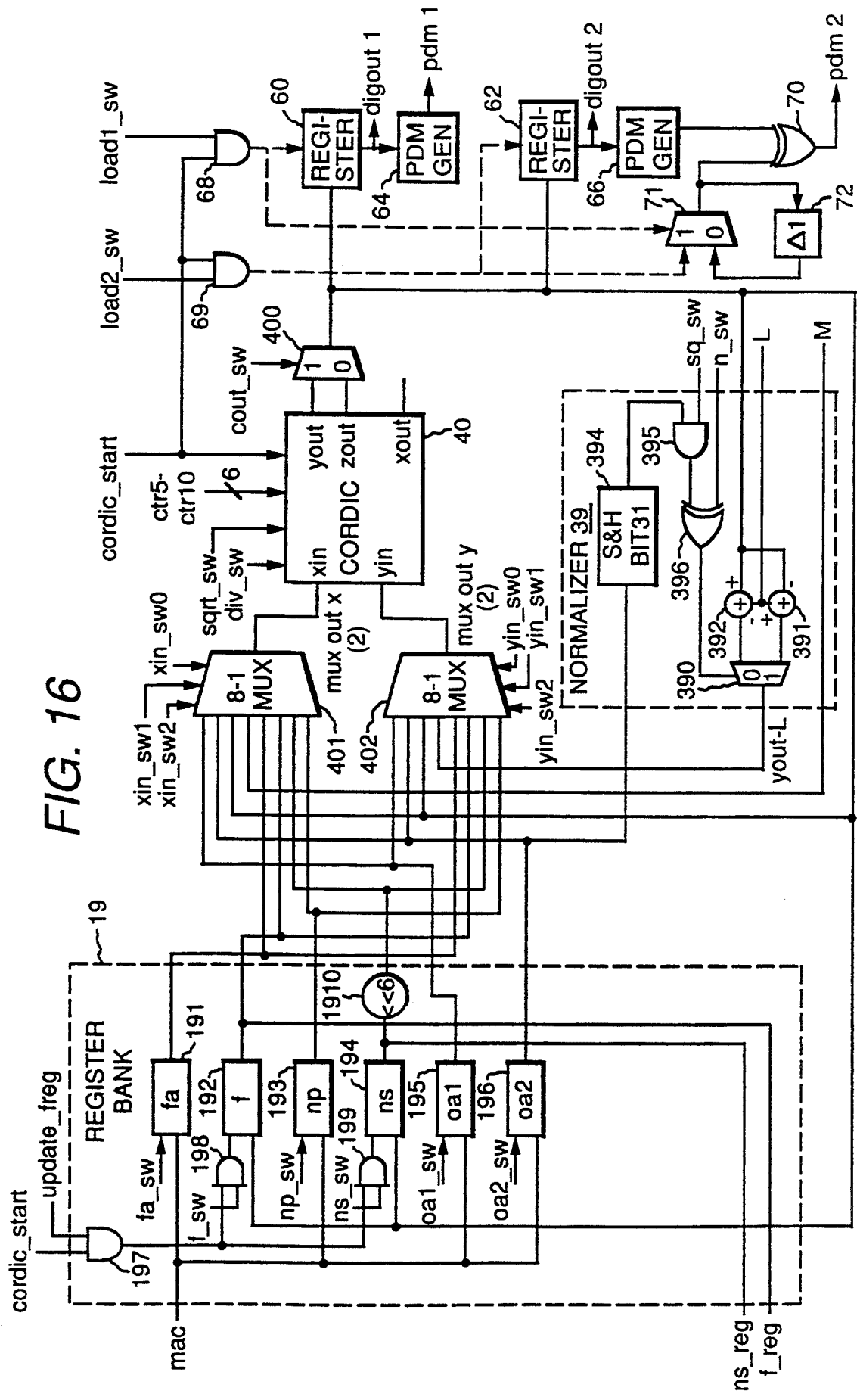
FIG. 16 is a schematic diagram showing the connections of the FIG. 13 bit-serial CORDIC processor to other elements in the FIG. 1 power/metering system.

In FIG. 16, the register bank 19 between the multiply-add processor 30 and the CORDIC processor 40 is shown as comprising component bit-serial registers 191–196. Each of these registers 191–196 is a 32-bit serial memory with the bits stored therein being cyclically available, one bit at a time for reading and one bit at a time for writing.

The bit-serial register 191 is used for storing $f_a$, the accumulated low-pass filtering result for frequency, as written to register 191 from the multiply-add processor 30 (in FIG. 9). As may be seen in FIG. 16, when the 100 input of the multiplexer 401 is selected, $f_a$ can be read to the CORDIC processor 40 as the xin input signal thereto; and when the 100 input of the multiplexer 402 is selected, $f_a$ can be read to the CORDIC processor 40 as the yin input signal thereto.

The bit-serial register 192 is used for storing f, the normalized signal frequency ($8f_{in}/f_s$), as written to register 192 from the CORDIC processor 40 (in FIG. 16) during updating. The contents of the bit-serial register 192 can be read and selected by the multiplexer 45 (in FIG. 9) as data—in signal for the multiply-add processor 30 (also in FIG. 9). As may be seen in FIG. 16, when the 101 input of the multiplexer 401 is selected, f can be read to the CORDIC processor 40 as the xin input signal thereto; and when the 101 input of the multiplexer 402 is selected, f can be read to the CORDIC processor 40 as the yin input signal thereto.

The bit-serial register 193 is used for storing $n_p$, the number of periods used in the kernel for low-pass filtering with the multiply-add processor 30, as written to register 193 from the multiply-add processor 30 (as shown in FIG. 16). Register 193 is loaded with $n_p$ from the output of processor 30 responsive to an NP flag appearing in the current instruction for the processor 30. As shown in FIG. 16, when the 111 input of the multiplexer 401 is selected, $n_p$ can be read to the CORDIC processor 40 as the xin input signal thereto; and when the 111 input of the multiplexer 402 is selected, $n_p$ can be read to the CORDIC processor 40 as the yin input signal thereto.

The bit-serial register 194 is used for storing $n_s$, which equals $n_p$ divided by f, is calculated by the CORDIC processor 40, and is written to register 194 from the CORDIC processor 40 during start-up or updating (as may be seen in FIG. 16). (At times, particularly in the drawing "$n_s$" appears as "$n_s$".) The contents of the bit-serial register 194 are supplied to the triangular coefficient generator 37 (in FIG. 11). As may be seen in FIG. 16, when the 110 input of the multiplexer 401 is selected, $n_s$ as divided by $2^6$ in a shift-with-sign-extension circuit 1910 can be read to the CORDIC processor 40 as the xin input signal thereto; and when the 110 input of the multiplexer 402 is selected, $n_s$ as divided by $2^6$ in the shift-with-sign-extension circuit 1910 can be read to the CORDIC processor 40 as the yin input signal thereto.

Referring to FIG. 9 and 16, the bit-serial register 195 is used for storing $o_{a1}$, the accumulated low-pass filtering result for signals received by the multiply-add processor 30 from the decimation filter 20 as written, to register 195 from the multiply-add processor 30. As may be seen in FIG. 16, when the 000 input of the multiplexer 401 is selected, $o_{a1}$ can be read to the CORDIC processor 40 as the xin input signal thereto; and when the 000 input of the multiplexer 402 is selected, $o_{a1}$ can be read to the CORDIC processor 40 as the yin input signal thereto.

Referring to FIG. 9 and 16, the bit-serial register 196 is used for storing oa2, the accumulated low-pass filtering result for signals received by the multiply-add processor 30 from the decimation filter 20, as written to register 196 from the multiply-add processor 30. As may be seen in FIG. 16, when the 001 input of the multiplexer 401 is selected, oa2 can be read to the CORDIC processor 40 as the xin input signal thereto; and when the 001 input of the multiplexer 402 is selected, oa2 can be read to the CORDIC processor 40 as the yin input signal thereto.

Returning to considering FIG. 9 alone, a two-input AND gate 48 receives the output signal of the multiply-add processor 30 at one of its inputs and responds to that signal for writing it to the RAM 6 when the other of its input signals is a ONE, as furnished from the output port of a three-input NOR gate 49. NOR gate 49 furnishes that ONE when there is absence of load instruction to any of the bit-serial registers 191, 195 and 196 in the bank 19 of registers used to interface between the processors 30 and 40. NOR gate 49 responds with a ZERO to a load instruction being supplied to any of the bit-serial registers 191, 195 and 196 in the bank 19 of registers used to interface between the processors 30 and 40. This causes the addressed location in RAM 6 to be written with arithmetic zero.

As will be explained in more detail later on, in connection with FIGS. 11 and 12, the triangular coefficient generator 37 issues an update_wb signal that pulses to ONE from its normal ZERO state each time a cycle of filter coefficients $2n_s$ in number is completed and an update_nb signal that pulses to ONE from its normal ZERO state each time a cycle of filter coefficients $8n_s$ in number is completed. The update_wb and the update_nb signals are each delayed for the duration of three bit-serial words (96 bits) in clocked delay lines 54 and 55, respectively, to provide control signals temporally aligned with the $R_3$ output signal of the multiply-add processor 30. Responsive to the delayed update_nb signal and an FA flag included in the current instruction for the processor 30 both being ONEs concurrently, an AND gate 56 issues a ONE as a load instruction to the bit-serial register 192 used for storing the value $f_a$ computed by the multiply-add processor 30. Responsive to the delayed update_wb signal and an OA1 flag included in the current instruction for the processor 30 both being ONEs concurrently, an AND gate 57 issues a ONE as a load instruction to the bit-serial register 195 used for storing the value computed by the multiply-add processor 30. Responsive to the delayed update_wb signal and an OA2 flag included in the current instruction for the processor 30 both being ONEs concurrently, an AND gate 58 issues a ONE as a load instruction to the bit-serial register 196 used for storing the value oa2 computed by the multiply-add processor 30.

A multiplexer 59 and a clocked delay line 591 are connected in a latch configuration in which a logic signal at the output port of the multiplexer 59 is updated every time the triangular coefficient generator 37 issues an update_wb signal that pulses to ONE from its normal ZERO state. When this occurs the current value of the update_nb signal from the triangular coefficient generator 37 is latched to generate an update_freq signal, the waveform of which is shown in FIG. 12. As shown in FIG. 16, an AND gate 197 ANDs the update_freq signal with a cordic_start signal that goes to ONE at the beginning of each cycle of processor CORDIC 40 instructions. The output signal from the AND gate 197 is ANDed in an AND gate 198 with an f_sw flag that is ONE during the CORDIC processor 40 instruction directing the loading of the value f; and, at a time when the update_freq signal is high, a ONE from the AND gate 198 commands the loading of the bit-serial register 192 with the value f computed by the CORDIC processor 40. The output signal from the AND gate 197 is also ANDed in an AND gate 199 with an $n_s$_sw flag that is ONE during the CORDIC processor 40 instruction directing the loading of the value $n_s$; and, at a time when the update_freq signal is high, a ONE from the AND gate 198 commands the loading of the bit-serial register 194 with the value $n_s$ computed by the CORDIC processor 40. A left-shifter 1910 multiplies the value of $n_s$ by $2^6$ as supplied to the multiplexers 401 and 402, so that divisions twice by $n_s$ in the CORDIC processor 40 do not generate quotients that overflow the output signal range of the CORDIC processor 40.

Figure 10:
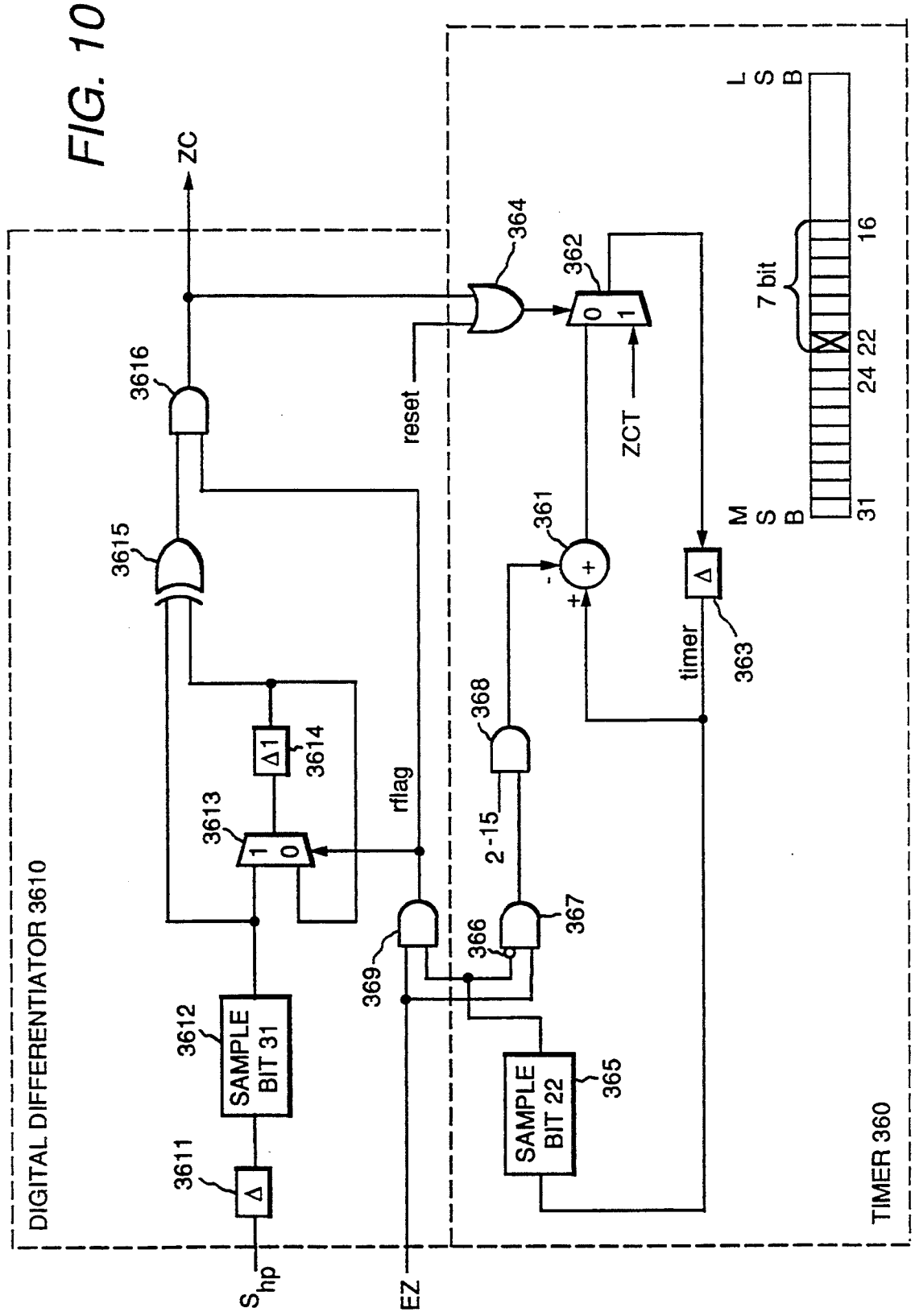
FIG. 10 is a schematic diagram of the zero-crossing detector used in the FIG. 1 power metering system.

FIG. 10 shows the construction of the zero-crossing detector 36 in greater detail. The operation of the zero-crossing detector 36 is enabled by an EZ flag being decoded from the processor 30 programmed instruction. The zero-crossing detector 36 essentially keeps a running tabulation of the sign bit of an input signal $s_{hk}$ thereto, selected from one of the $v_{hk}$ and $i_{hk}$ high-pass-filtering results as will be described in reference to FIG. 19A, and generates an indication of when the sign bit changes. The normally-ZERO output signal ZC of the zero-crossing detector 36 goes to ONE to indicate when the sign bit has changed. To reduce the likelihood of a false indication of zero-crossing being generated in response to a noise spike or to harmonic distortion, a timer 360 is included in the zero-crossing detector 36 circuitry to generate an enabling signal rflag that when ONE permits the detector 36 to provide an indication of when the sign bit changes only after a prescribed time has elapsed since the previous such indication.

The timer 360 is essentially a counter that counts down from a prescribed value ZCT read from the PROM 9. This counter comprises a bit-serial subtractor 361 arranged to feed back its difference output signal selectively through a multiplexer 362, to be delayed by one word in a clocked delay line 363 to generate a timer signal, which timer signal is then applied as minuend input signal to that subtractor 361. In the initiation of the down count, an OR gate 364 responds to either a reset signal or the zero-crossing detector 36 output signal ZC going to ONE to generate a ONE that conditions the multiplexer 362 to select the prescribed value ZCT to be delayed by one word in a clocked delay line 363 to generate the initial word of the timer signal. Circuitry 365 senses the logic state of the twenty-second bit of each bit-serial word of the timer signal, which is the sign bit thereof, and generates a logic signal holding the same logic state until the circuitry 365 senses the logic state of the twenty-second bit of the next bit-serial word. When the twenty-second bit of the prescribed value ZCT is sensed, it is invariably a ZERO owing to ZCT being a positive quantity. Circuitry 365 responds to generate a logic signal ZERO. The response from the circuitry 365 is supplied to the input port of a logic inverter 366 that has its output port connected to supply one of the input signals to a two-input AND gate 367. AND gate 367 is conditioned to supply a ONE as output signal responsive to its input signal from the logic inverter 366 being a ONE concurrently with the other of its input signals, the EZ flag that is a ONE to enable the operation of the zero-crossing detector 36. The output signal from the AND gate 367 is supplied as one of the input signals to a two-input AND gate 368 that receives bit-serial $2^{-15}$ as the other of its input signals. AND gate 368 output signal is applied as subtrahend signal to the subtractor 361. As long as the AND gate 367 supplies a ONE as input to the AND gate 368, AND gate 368 supplies bit-serial $2^{-15}$ to the subtractor 361 as subtrahend signal. The counting down in timer 360 continues until the timer signal changes polarity, at which time the circuitry 365 furnishes a ONE output signal. Inverter 366 responds this ONE to supply a ZERO to the AND gate 367, which responds to supply a ZERO to the AND gate 368. AND gate 368 responds to its ZERO input signal to supply an arithmetic zero subtrahend to the subtractor 361. Down counting accordingly is halted, so the circuitry 365 will continue to furnish a ONE output signal until the timer is reset by either the reset signal or the ZC signal going to ONE.

An AND gate 369 responds to the EZ flag and the output signal of the timer-sign-detector circuitry 365 concurrently being ONEs to generate the rflag signal. The rflag signal being ONE enables a digital differentiator 3610 that detects changes in the sign bit of a bit-serial signal supplied thereto from the output port of a clocked delay line 3611. The clocked delay line 3611 repeats at its output port the signal $s_{hk}$ (one of the signals $v_{h1}$, $i_{h1}$, $v_{h2}$, $i_{h2}$, $v_{h3}$ and $i_{h3}$) read to its input port from the RAM 6 after a delay equal to the duration of one bit-serial word, to provide input signal to $s_{hk}$-sign detector circuitry 3612. The $s_{hk}$-Sign detector circuitry 3612 samples bit 31 of delayed $s_{hk}$ signal and holds that bit for the 32-bit duration of a bit-serial word. Providing that the rflag signal is ONE, the held bit is selected by a multiplexer 3613 to the input port of a clocked delay line 3614. The current held bit from the output port of the $s_{hk}$-Sign detector circuitry 3612 is exclusively ORed with the signal at the output of the clocked delay line 3614 in an exclusive-OR gate 3615. As long as the rflag signal is continuously ONE, the exclusive-OR gate 3615 exclusively ORs the currently held and previously held sign bits, to differentiate digitally the held output of the $s_{hk}$-sign detector circuitry 3612. The result of this digital differentiation is applied as one input signal to a two-input AND gate 3616, which receives the rflag signal as the other of its input signals and generates the ZC signal at its output port. Except when a transition occurs in the sign bit of $s_{hk}$, both input signals to the exclusive-OR gate 3615 will be ZEROs or will be ONEs, causing the gate response to be a ZERO, in consequence of which the response ZC of the AND gate 3616 will be a ZERO. When a transition occurs in the sign bit of $s_{hk}$, one of the input signals to the exclusive-OR gate 3615 will be a ZERO and the other will be a ONE, causing the gate response to be a ONE, in consequence of which the response ZC of the AND gate 3616 will be a ONE, indicating the occurrence of the zero-crossing.

As previously explained, ZC being a ONE resets the timer 360, conditioning the multiplexer 362 to apply ZCT to the input port of the clocked delay line 363. After the one-word delay in the clocked delay line 363, the sign bit of ZCT is detected by the timer-sign-detector circuitry 365. The rflag signal generated by AND gate 369 becomes a ZERO responsive to the output signal of the timer-sign-detector circuitry 365 being a ONE. When the rflag signal is ZERO, the multiplexer 3613 is conditioned to recirculate the sign condition that generated the zero-crossing from the output port of the clocked delay line back to its input port until the timer counts down to zero. Any noise spike that causes the $s_{hk}$-sign detector circuitry 3612 to change its output condition while the rflag signal is ZERO is not admitted by the multiplexer 3613 into this recirculatory loop. Meanwhile, the rflag signal being ZERO causes the ZC signal to be ZERO irrespective of any difference in the recirculated sign bit and the sign bit currently detected by the $s_{hk}$-sign detector circuitry 3612.

Figure 11:
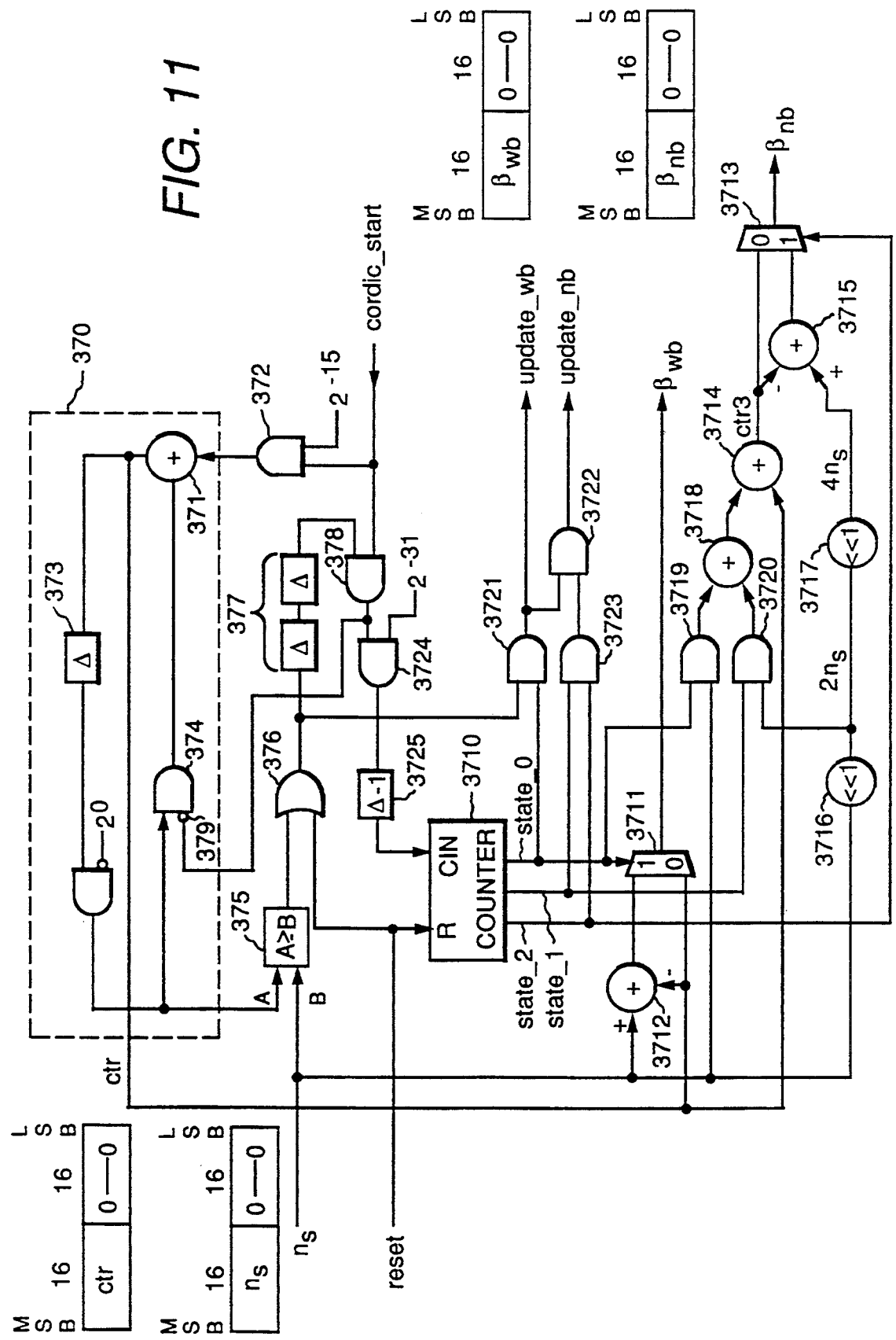
FIG. 11 is a schematic diagram of the triangular coefficient generator used to generate filtering coefficients for use by the FIG. 8 bit-serial multiply-add processor when performing $sinc^2$ digital low-pass filtering.

FIG. 11 shows the construction of the triangular coefficient generator 37 in greater detail. A bit-serial counter 370 cyclically counts up from arithmetic one to $n_s$, a value stored in the bit-serial register 194 and made available to the triangular coefficient generator 37, as shown in FIG. 9. The $n_s$ input signal is shown in FIG. 11 as being disposed in the sixteen most significant bits of the thirty-two bits cycling within the bit-serial register 194. The bit-serial counter 370 counts in the sixteen most significant bits subrange of the full thirty-two bit range for bit-serial signals in the processor 30 and essentially comprises a bit-serial adder 371 connected as an accumulator for bit-serial $2^{-15}$ The counting rate in the counter 370 is established by cordic_start pulses to ONE that are ANDed with bit-serial $2^{-15}$ in an AND gate 372 to furnish an augend input signal for the adder 371. The sum output signal from the adder 371 is delayed for the duration of one bit-serial word in a clocked delay line 373, and the delayed sum signal is selectively applied as an addend input signal to the bit-serial adder 371 via an AND gate 374. The bit-serial delayed sum signal from the clocked delay line 373 is compared to the bit-serial value $n_s$ as read from the bit-serial register 194. This comparison is done by a bit-serial comparator 375, which outputs a string of ONEs when the count has reached $n_s$. An OR gate 376 responds to a ONE from the comparator 375 or to a ONE supplied as a reset signal to generate a ONE at its output port. ONEs at the output of the OR gate 376 are delayed for the duration of two bit-serial words in a clocked delay line 377 to be ANDed with the next cordic_start pulse in a two-input AND gate 378. The resulting ONEs in the normally ZERO output signal from the AND gate 378 is inverted in a logic inverter 379 to cause the normally ONE logic signal applied to AND gate 374 to go to ZERO, to interrupt accumulation by the adder 371 and to instead supply arithmetic zero as the addend input signal to the adder 371. At the same time the cordic_start pulse enables the AND gate 372 to apply $2^{-15}$ to the adder 371 and so reset it to the bit-serial $2^{-15}$ value that is reckoned as arithmetic one in comparing to $n_s$.

The triangular coefficient generator 37 of FIG. 11 includes another counter 3710, which is a bit-parallel counter that includes three cascaded counter stages. The first of these stages generates a state_0 output signal, which has transitions between ZERO and ONE logic states corresponding to the counter 370 reaching $n_s$ count. The second of these stages generates a state_1 output signal, which has transitions between ZERO and ONE logic states corresponding to the ONE-to-ZERO transitions of the state_0 signal. The third of these stages generates a state_2 output signal, which has transitions between ZERO and ONE logic states corresponding to the ONE-to-ZERO transitions of the state_1 signal. The string of ONEs furnished from the AND gate 378 as reset signal for the bit-serial counter 370 is applied as one input of a two-input AND gate 3724, which receives bit-serial $2^{-31}$ as its other input signal. AND gate 3724 responds to generate a reset pulse that is only one clock cycle long, which the silicon compiler program arranges to be delayed negative-one-bit duration respective to all associated circuitry, as indicated by a psuedo-delay element 3725. The negative delay of the counter 3710 reset pulse in the psuedo-delay element 3725 cannot actually exist, of course, but the silicon compiler program counterfeits it by introducing a unit-delay clocked latch in every circuit path parallelling that circuit path in which the psuedo-delay element 3725 is shown. This is done to synchronize an update_wb signal going to ONE with the leading edge of the cordic_start pulse. The advanced-in-relative-time, one-clock-cycle-long reset pulse is applied to the counter 3710 to reset each of its three counter stages, causing each of the signals state_0, state_1 and state_2 to be ZERO-valued. The relative timing of the ctr count output of the counter 370 and of the signals state_0, state_1 and state_2 from counter 3710 are shown in FIG. 12.

Figure 12:
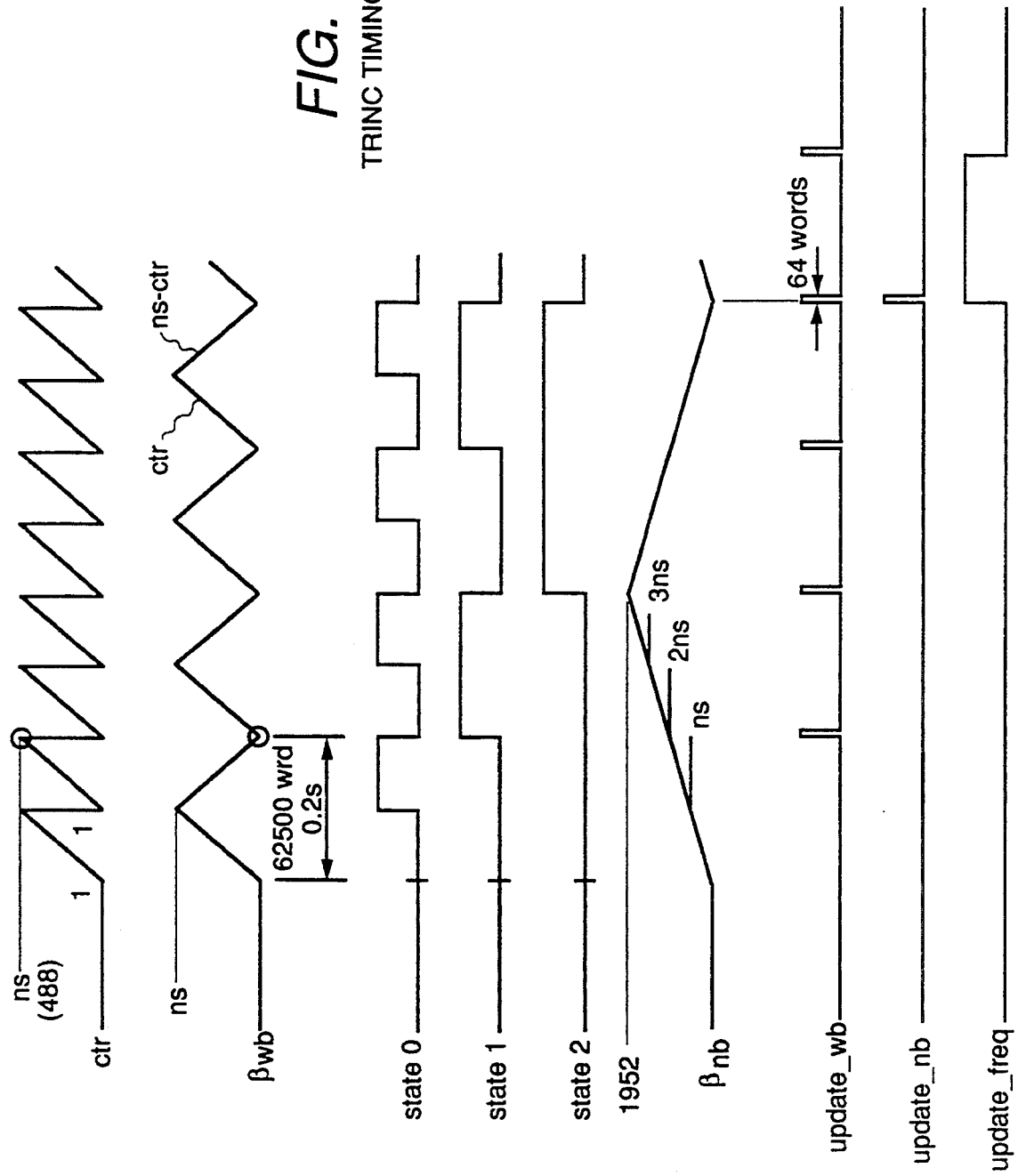
FIG. 12 is a timing diagram showing waveforms associated with the FIG. 11 triangular coefficient generator, as plotted against time.

A $\beta_{wb}$ signal supplied from the multiplexer 3711 is, as shown in FIG. 12, a symmetrical triangular filtering kernel $2n_s$ samples wide. As shown in FIG. 11, during the counting cycles when state_0 is ZERO, the state_0 signal conditions a multiplexer 3711 to select ctr to form a rising portion of its output signal $\beta_{wb}$. During the counting cycles when state_0 is ONE, the state_0 signal conditions the multiplexer 3711 to select the difference output from a bit-serial subtractor 3712 to form a falling portion of its output signal $\beta_{wb}$. The subtractor 3712 receives $n_s$ as minuend input signal, receives ctr as a subtrahend input signal, and generates an $n_s$−ctr difference output signal.

A $\beta_{nb}$ signal supplied from the multiplexer 3713 is, as shown in FIG. 12, a symmetrical triangular filtering kernel $8n_s$ samples wide. As shown in FIG. 11, during the counting cycles when state_2 is ZERO, the state_2 signal conditions a multiplexer 3713 to select a rising portion of its output signal $\beta_{nb}$, as supplied by the sum output signal of a bit-serial adder 3714. During the counting cycles when state_2 is ONE, the state_2 signal conditions the multiplexer 3713 to select a falling portion of its output signal $\beta_{nb}$, as supplied by the difference output signal of a bit-serial subtractor 3715. The value $n_s$ is multiplied by two by a shift 3716 of all bits by one bit place towards greater significance, to generate an input signal for an AND gate 3720; and the result $2n_s$ from shift 3716 is multiplied by two by a shift 3717 of all bits by one bit place towards greater significance, to generate a minuend signal of $4n_s$ for the subtractor 3715. The sum output signal of the bit-serial adder 3714 is used by the subtractor 3715 as its subtrahend input signal. The adder 3714 generates a ramp up to $4n_s$ during the four successive ctr ramps that state_2 is ZERO after the triangular coefficient generator is started, which is selected by the multiplexer 3713 as the rising portion of its output signal $\beta_{nb}$. The adder 3714 again generates a ramp up to $4n_s$ during the next four successive ctr ramps when state_2 is ONE, which ramp is subtracted from $4n_s$ in the subtractor 3715 to generate a complementary ramp therefrom; and this complementary ramp is selected by the multiplexer 3713 as the falling portion of its output signal $\beta_{nb}$.

In generating each ramp up to $4n_s$ as its sum output signal, the adder 3714 receives the counter output ctr as its augend input and the sum output from another bit-serial adder 3718 as its addend input. The adder 3718 receives as its addend and augend input signals the output signals from an AND gate 3719 and the AND gate 3720. At the beginning of the ramp output from the adder 3714, the ZERO-valued state_0 and state_1 signals as applied to AND gates 3719 and 3720 condition them to supply arithmetic-zero addend and augend input signals to the adder 3718. The adder 3718 sums these arithmetic zeroes to generate as sum output signal an arithmetic zero supplied to adder 3714 as its addend input signal. The adder 3714 sum output is accordingly equal to its ctr augend input signal.

In the next cycle of ctr output from the counter 370, the ONE-valued state_0 signal applied as one input signal of the AND gate 3719 conditions it to reproduce the $n_s$ signal received as its other input signal, to be used as addend signal by the adder 3718. The ZERO-valued state_1 signal as applied to AND gate 3720 conditions it to supply arithmetic-zero augend input signal to the adder 3718. The sum output signal from the adder 3718 accordingly corresponds to $n_s$. The adder 3714 receives ctr signal as both addend and augend, so its sum output signal is $n_s$+ctr.

In the next cycle of ctr output from the counter 370, the ZERO-valued state_0 signal as applied to AND gate 3719 conditions it to supply arithmetic-zero addend input signal to the adder 3718. The ONE-valued state_1 signal applied as one input signal of the AND gate 3720 conditions it to reproduce the $2n_s$ signal received as its other input signal, to be used as augend signal by the adder 3718. The sum output signal from the adder 3718 accordingly corresponds to 2ctr. The adder 3714 receives $2n_s$ signal as addend and ctr signal as augend, so its sum output signal is 2ns+ctr.

In the next cycle of ctr output from the counter 370, the ONE-valued state_0 signal applied as one input signal of the AND gate 3719 conditions it to reproduce the $n_s$ signal received as its other input signal at its output port, to be used as addend signal by the adder 3718. The ONE-valued state_1 signal applied as one input signal of the AND gate 3720 conditions it to reproduce the 2ns signal received as its other input signal, to be used as augend signal by the adder 3718. The sum output signal from the adder 3718 accordingly corresponds to $3n_s$. The adder 3714 receives $3n_s$ signal as addend and ctr signal as augend, so its sum output signal is $3n_s$+ctr.

An AND gate 3721 responds to the final count of the counter 370 occurring when the state_0 signal is ONE to generate a ONE pulse in the normally-ZERO signal called update_wb, which signals the conclusion of a relatively-wide-band (i.e., relatively-narrow-kernel) low-pass filtering sequence in the multiply-add processor 30. Since ctr is incremented each time cordic_start occurs, the duration of update_wb signal being ONE is equal to the duration of one multiply-add processor 30 program cycle—i.e., sixty-four bit-serial words. An AND gate 3722 receives update_wb at one of its input ports. Every fourth time the update_wb signal pulses to ONE, an AND gate 3723 responds to both the state_1 and state_2 signals being concurrently ONE to deliver a ONE to the other input port of the AND gate 3722. The AND gate 3722 responds to generate a ONE pulse in the normally-ZERO signal called update_nb, which signals the conclusion of a relatively-narrowband (i.e., relatively-wide-kernel) low-pass filtering sequence in the multiply-add processor 30. The relatively-narrow-band low-pass filtering sequence is used by the multiply-add processor 30 when it computes $f_a$; the processor 30 uses the relatively-wide-band low-pass filtering sequence for computations of other signals.

Figure 13:
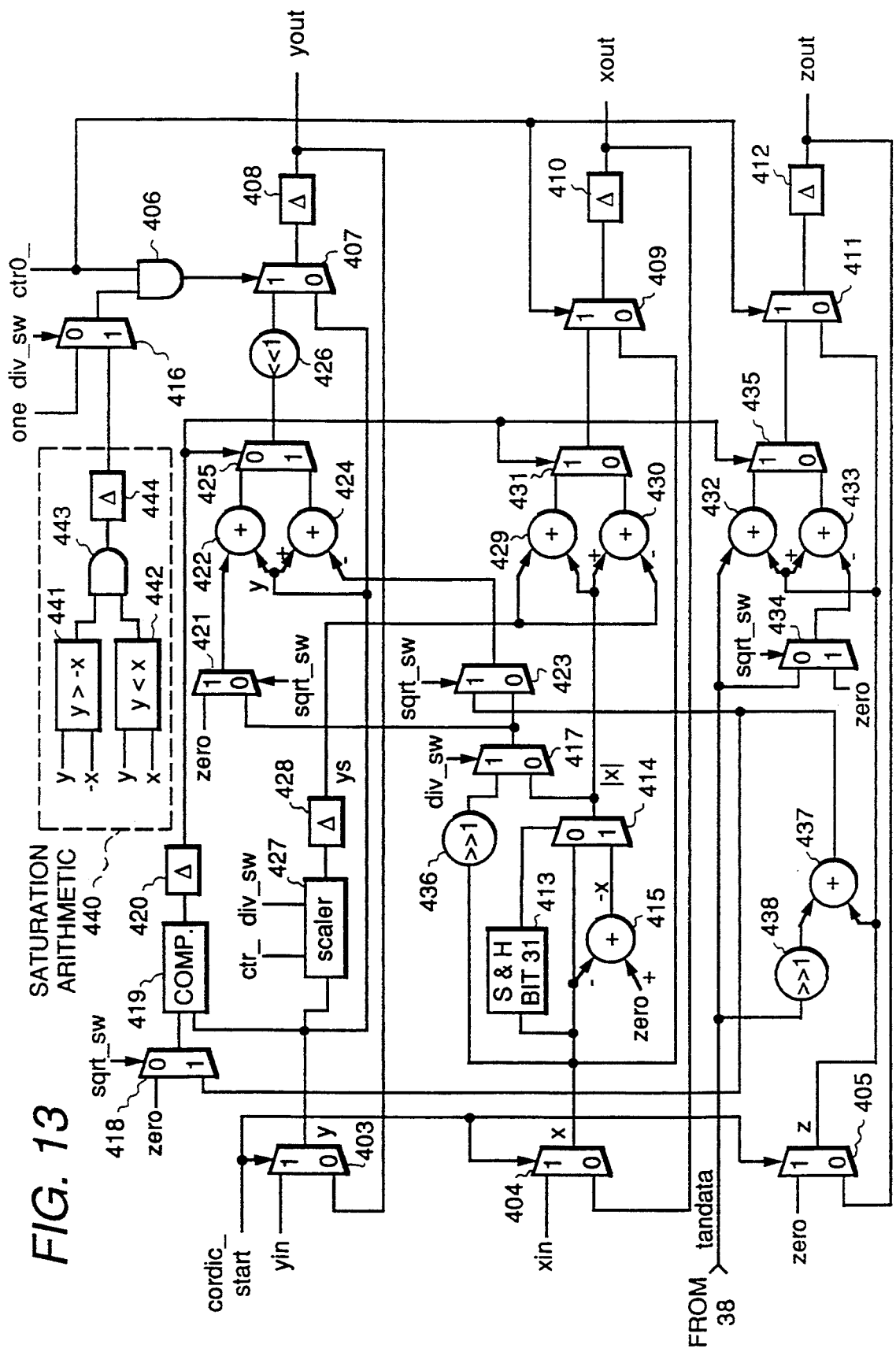
FIG. 13 is a schematic diagram of the bit-serial CORDIC processor that is the final processor in the FIG. 1 digital-signal processor cascade.

FIG. 13 shows the CORDIC processor 40 in greater detail. The processor 40 not only is capable of computing the arc tangent of yin/xin and the magnitude (xin,-yin) function simultaneously by an iterative CORDIC procedure, but is alternatively capable of performing non-restoring division or square-rooting computations using portions of the same digital hardware used in CORDIC computations The CORDIC processor 40 comprises three bit-serial accumulators each selectively having incremental or decremental accumulating capability. A first of these bit-serial accumulators accumulates an xout signal and includes elements 404, 413–415, 429–431, 409 and 410. A second of these bit-serial accumulators accumulates a zout signal and includes elements 405, 432–435, 411 and 412. A third of these bit-serial accumulators accumulates a yout signal, and includes elements 403, 422, 424–426, 407 and 408.

The xout signal is the output signal for the processor 40 for the magnitude (xin,yin) function during CORDIC computation, when the vector resolved into xout and yout components orthogonal to each other is subjected to a series of successive rotations that reduce the yout component so as to approach arithmetic zero ever more closely and increase the xout component so as to approach the magnitude of the vector ever more closely. The bit-serial accumulator that accumulates the xout signal is not usefully employed in performing square rooting; and, when performing division, this bit-serial accumulator is operated as a serial memory for the magnitude of the xin signal, rather than incrementing or decrementing xout.

The bit-serial accumulator that accumulates zout signal generates the arc tangent of yin/xin during CORDIC computations by accumulating arc tangent radices supplied from ROM circuitry 38. These arc tangent radices have binary values such that accumulation requires addition or subtraction of full digital words. The non-restoring division and square rooting procedures when performed in bit-serial arithmetic in which the successive bits of a digital word are progressively more significant require accumulation of their respective partial-quotient and partial-square-root results on full-digital-word basis. This contrasts with the accumulation of those results being done on a successive-bit basis using a simple shift register when these computations are carried out in parallel-bit arithmetic or in a bit-serial arithmetic in which the successive bits of a digital word are progressively less significant. The bit-serial accumulator that accumulates zout signal, used to accumulate the arc tangent of yin/xin during CORDIC computations, is also used to accumulate the results of the non-restoring division and square rooting procedures performed in bit-serial arithmetic by the processor 40. This economizes the digital hardware used for performing the CORDIC, division and square-rooting computations. The zout signal is the output signal for the CORDIC processor 40 for all functions except magnitude (xin,-yin).

In all of the iterative procedures performed by the processor 40, the your signal is selectively incremented or decremented by the bit-serial accumulator that accumulates your signal so as to bring the magnitude of your towards a prescribed value, arithmetic zero for the CORDIC and non-restoring division computational procedures. To avoid loss of dynamic range in the computations as yout is systematically reduced in value the bit-serial accumulator for yout is of a type that shifts your one place towards greater significance each successive computation step. The scaling of yout is accommodated by a compensatory scaling of all associated numbers relative to that normally required by the algorithm. When computing yin/xin, x is held constant instead of being scaled by $\frac{1}{2}$ each iteration. When calculating the square root of yin, the trial value is scaled by $\frac{1}{2}$ each iteration instead of $\frac{1}{4}$. When performing Cordic rotation, y is modified using an unscaled x, and x is modified using y scaled by $2^{-2i}$ during iteration step i, rather than x and y each being scaled by $2^{-i}$ before modifying the other, as is conventionally done in implementing the CORDIC algorithm. In all cases, the accumulation of zout is unaffected by the scaling of y and x.

The signal div_sw is a logic signal that is ZERO except when the processor 40 is to execute non-restoring division procedures; and the signal sqrt_sw is a logic signal that is ZERO except when the processor 40 is to execute non-restoring square rooting procedures. The signals div_sw and sqrt_sw are provided as respective single-bit fields in the instructions for the CORDIC processor 40 and control the multiplexers used to modify the routing of signals through the processor 40, so as selectively to implement each of the three different types of computations. The signal ctr5 is a logic signal which is high only during odd-numbered cycles of the 64-cycle CORDIC computation. When ctr5 is ZERO, the five-bit count output from the CORDIC program counter 108 (in FIG. 2) defines the address in the PROM 9 of one of the thirty-two CORDIC instructions for the CORDIC processor 40. When ctr5 is ONE, the count output from the counter 108 address in the instruction PROM 9 a cordic coefficient for the CORDIC processor 40. Each CORDIC instruction accessed when ctr5 is ZERO is maintained when ctr5 is next ONE, reflective of the fact that the processor 40 requires two word intervals per computational cycle.

During the time the cordic_start signal is ONE, a multiplexer 403 selects its output signal y to equal the yin signal supplied as its first input signal from the multiplexer 402 of FIG. 16; a multiplexer 404 selects its output signal x to equal the xin signal supplied as its first input signal from the multiplexer 401 of FIG. 16; and a multiplexer 405 selects its output signal z to equal the arithmetic zero applied as its first input signal. The ctr5 signal applied as an input signal to the AND gate 406 is low, conditioning the output signal from the AND gate 406 to be low. The low output from the AND gate 406 conditions a multiplexer 407 to select its output signal to equal the signal y received as an input signal from the multiplexer 403, which output signal is supplied to a word-length clocked delay line 408. The ctr5 signal being low conditions a multiplexer 409 to select its output signal to equal the signal x received as an input signal from the multiplexer 404, which output signal is supplied to a word-length clocked delay line 410. The ctr5 signal being low also conditions a multiplexer 411 to select its output signal to equal the signal z received as an input signal from the multiplexer 405, which output signal is supplied to a word-length clocked delay line 412. After the time the cordic_start signal is high, during the determination of the successive bits of the bit-serial yout, xout and zout signals by the CORDIC processor 40, the multiplexer 403 selects its output signal to equal the yout signal fed back as its second input signal from the output port of the clocked delay line 408; the multiplexer 404 selects its output signal to equal the xout signal from the CORDIC processor 40 fed back as its second input signal from the output port of the clocked delay line 410; and the multiplexer 405 selects its output signal to equal the zout signal fed back as its second input signal from the output port of the clocked delay line 412. Computations are carried forward only when the ctr5 signal applied as an input signal to the AND gate 406 is high, so the multiplexer 407 interrupts bit-serial latching operations in a loop through elements 408, 403 and 407; so the multiplexer 409 interrupts bit-serial latching operations in a loop through elements 410, 404 and 409; and so the multiplexer 411 interrupts bit-serial latching operations in a loop through elements 412, 405 and 411.

The computation algorithms require a positive-valued divisor $|x|$ for use with the dividend yin. During the bit-serial latching operation of the loop through elements 410, 404 and 409 when ctr5 is ZERO, the sign bit of the output signal x from the multiplexer 404 is sampled and held for one word duration by the sample-and-hold circuit 413. The held sign bit controls a multiplexer 414 in selecting as its output signal a replica of its x input signal if the held sign bit is a ZERO or a replica of its $-x$ input signal if the held sign bit is a ONE. That is, the output signal from the multiplexer 414 is $|x|$ when ctr5 is ONE during computation. The $-x$ input signal for the multiplexer 414 is obtained from a bit-serial subtractor 415 as the difference between arithmetic zero and the output signal x from the multiplexer 404.

Usually, in CORDIC computations the vector having orthogonal coordinates xout and yout is subjected to stepwise rotation that continually reduces the magnitude of yout towards zero and increases the magnitude of xout towards that of the complete vector. The respective angles of rotation involved in the successive rotation steps are progressively smaller and are accumulated to determine with increasing precision the angle of rotation zout that reduces your to zero. In each step of the CORDIC computations the previous value of yout is compared to arithmetic zero to determine its sign, so as to determine whether being incremented or decremented by one half the previous value of xout will generate as a first cross-sum the desired result of a current value of y out of lesser magnitude than the previous value of yout, and the cross-sum providing the desired result is generated as updated yout. A second cross-sum is generated as updated xout, either by decrementing the previous value of xout by one half the previous value of yout if the previous value of yout was incremented by one half the previous value of xout in generating the first cross-sum, or by incrementing the previous value of xout by one half the previous value of yout if the previous value of your was decremented by one half the previous value of x out in generating the first cross-sum. The determination of whether the previous value of yout is to be incremented or decremented by one half the previous value of xout also determines whether the rotation step is to decrement or increment the angle of rotation zout.

As performed in processor 40, the generation of the first cross-sum is performed by incrementing or decrementing twice the previous value of yout by the previous value of xout. The generation of the second cross-sum is performed by incrementing or decrementing the previous value of xout by $2^{-2}$ yout the first step of computation, by $2^{-4}$ yout the second step of computation, by $2^{-6}$ yout the third step of computation, etc. These modifications of the CORDIC algorithm are made reflective of the fact that the bit-serial accumulator for yout is of a type that shifts yout one place towards greater significance each successive computation step, to avoid loss of dynamic range in the computations as yout is systematically reduced in value.

During CORDIC computations the control bit div_sw is ZERO, conditioning a multiplexer 416 continually to select successive ONEs as another input signal to the AND gate 406, in addition to its ctr5 input signal, causing the AND gate 406 output signal to replicate its ctr5 input signal. The control bit div_sw being ZERO-valued also conditions a multiplexer 417 to select $|x|$ as its output signal.

During CORDIC computations the control bit sqrt_sw is ZERO to cause a multiplexer 418 to select arithmetic zero as its output signal. The output signal from the multiplexer 418 is the value towards which yout is to be successively modified during each of the iterative computation steps. The arithmetic zero output signal selected by the multiplexer 418 is compared to a y output signal from the multiplexer 403 to determine the sign of y to indicate the direction in which modification of y is to be made, the comparison being made by a digital comparator 419 and the sign bit being stored for a word interval in a latch 420. The comparator 419 generates a ONE output signal when y is arithmetic zero or greater and otherwise generates a ZERO output signal. The latch 420 output signal being ONE or ZERO indicates whether the previous value of yout is to be incremented or decremented in generating an updated yout of decreased magnitude, whether the previous value of xout is to be decremented or incremented in generating an updated xout of increased magnitude, and whether arc tan radix from the ROM 38 is to decrement or increment the accumulated rotation angle zout.

The control bit sqrt_sw being ZERO also conditions a multiplexer 421 to apply the $|x|$ signal as previously selected by the multiplexer 417 to a bit-serial adder 422 as its augend input signal. The control bit sqrt_sw being ZERO-valued also conditions a multiplexer 423 to apply that previously selected $|x|$ signal to a bit-serial subtractor 424 as its subtrahend input signal. The addend input signal to the adder 422 and the minuend input signal to the subtractor 424 are each the y output signal from the multiplexer 403.

In the text that follows, the subscripts (i−1), i and (i+1) refer to the $(i-1)^{th}$, $i^{th}$ and $(i+1)^{th}$ successive iterations of the computation steps in the processor 40.

A multiplexer 425 selects the sum output from the adder 422 as the cross-sum of $y_i$ with $|x_i|$ if $y_i$ is negative, or selects the difference output from the subtractor 424 as the decremented or increment if $y_i$ is positive. The output signal from the multiplexer 425 is multiplied by two by a left-shifting clocked latch 426, and the resulting doubled signal is supplied as a second input signal to the multiplexer 407 as iteration value $y_{(i+1)}$.

The $y_i$ signal from the multiplexer 403 is scaled by a factor $\delta_i = 2^{-2i}$ in a scaler 427 and delayed in a clocked delay line 428 for one word duration, to then be used in generating the cross-sum of $x_i$ with $2^{-2i} y_i$. The output signal from the clocked delay line 428 is applied as augend input signal to a bit-serial adder 429 and as subtrahend input signal to a bit-serial subtractor 430. The addend input signal to the adder 429 and the minuend input signal to the subtractor 430 are each the $|x|$ output signal from the multiplexer 414. A multiplexer 431 responds to $y_i$ being zero or positive to select the sum output from the adder 429 to the multiplexer 409 as a second input signal thereto and responds to $y_i$ being negative to select the difference output from the subtractor 430 to the multiplexer 409 as the second input signal thereto. The second input signal to the multiplexer 409 is replicated in its output signal responsive to the ctr5 signal being high.

The z output signal from the multiplexer 405 is applied as augend input signal to a bit-serial adder 432 and as minuend input signal to a bit-serial subtractor 433. Arc tangent radix coefficients sequentially read from the read-only memory 38 are used as addend input signal by the adder 432. Furthermore, when the sqrt_sw control bit is ZERO, as during CORDIC computations, a multiplexer 434 selects to the subtractor 433 as its subtrahend input signal the tandata signal from ROM 38. A multiplexer 435 responds to $y_i$ having been zero or positive to select the sum output from the adder 432 to the multiplexer 411 as a second input signal thereto and responds to $y_i$ being negative to select the difference output from the subtractor 433 to the multiplexer 411 as the second input signal thereto. The second input signal to the multiplexer 411 is replicated in its output signal responsive to the ctr5 signal being high.

During the computation of yin/xin in accordance with a non-restoring division procedure, the processor 40 operates as a fractional machine, with the most significant bits of xin and yin being their sign bits in a two's complement arithmetic and being followed by the binary point. During the computation of yin/xin, the div_sw signal is ONE. This conditions the multiplexer 416 to continuously select output signal from saturation arithmetic circuitry 440 as its output signal, conditions the multiplexer 417 to replicate in its output signal an $|x|/2$ signal, and conditions the scaler 427 output signal continuously to be ZEROs. Assuming that yin is smaller in magnitude than xin, the saturation arithmetic circuitry 440 generates a string of ONEs that enables non-restoring division procedures to go forward. As will be explained in detail further on, in connection with FIG. 15, the div_sw signal being ONE also conditions the arc tangent radix ROM circuitry 38 to supply bit-serial $2^{-1}$ during the first pair CORDIC program instructions, bit-serial $2^{-2}$ during the second successive pair of CORDIC program instructions, bit-serial $2^{-3}$ during the third successive pair of CORDIC program instructions, etc.

The scaler 427 output signal continuously being ZEROs causes the sum output of the adder 429 receiving the resulting arithmetic zero as addend input signal to equal its $|x|$ augend input signal as supplied from the multiplexer 414. It also causes the difference output of the subtractor 430 receiving the resulting arithmetic zero as subtrahend input signal to equal its $|x|$ minuend input signal as supplied from the multiplexer 414. Accordingly, the multiplexer 431 output signal is $|x|$, the same as the multiplexer 417 output signal, when yin/xin is being computed. After this value is selected by the multiplexer 409 when ctr5 is ONE to be circulated in the loop through elements 410, 404 and 409, the output signal from the multiplexer 404 will be $|x|$ throughout the computational cycle—i.e., until the next time cordic_start is high.

The multiplexer 417 responds to one half the $|x|$ output signal maintained from the multiplexer 404. The $|x|/2$ signal is supplied as the trial divisor in the non-restoring division process, either to be added to y in the adder 422 or to be subtracted from y in the subtractor 424. The x/2 signal selected by the multiplexer 417 is shown as being provided by a bit shifter 436 as shown in the circuit diagram supplied to a silicon compiler. In actuality, the bit shift towards lesser significance is provided by the silicon compiler introducing one-bit shifts towards greater significance in all parallel paths.

During the computation of yin/xin, the control bit sqrt_sw is ZERO to cause the multiplexer 434 to select tandata=$2^{-i}$ as the subtrahend input signal to the subtractor 433. Each successive time that ctr5 signal is a ONE, the value of z from the multiplexer 405, either as augmented by the $2^{-i}$ value of tandata in the adder 432, or as decremented by the $2^{-i}$ value of tandata in the subtractor 433, is selected by the multiplexer 435 to provide the updated value of z to be fed back to the multiplexer 405 via the clocked delay line 412 and used the next time that ctr5 signal is a ONE. The selections made by the multiplexer 435 (and by multiplexers 425 and 431) are made according to the sign of y computed in the previous one of the successive steps of comparing the dividend y or modified dividend to zero that are performed in a non-restoring division procedure, as one attempts to reduce the modified dividend magnitude. If $y_{(i-1)}$ (the previous value of y) was zero or positive, the magnitude of $y_i$ (the current value of y) is reduced by subtracting $|x|/2$, and the value of z from the multiplexer 405 as incremented by tandata=$2^{-i}$ in the adder 432 is selected by the multiplexer 435 to provide the updated value of z. If $y_{(i-1)}$ was negative, the magnitude of $y_i$ (the current value of y) is reduced by adding $|x|/2$, and the value of z from the multiplexer 405 as decremented by tandata=$2^{-i}$ in the subtractor 433 is selected by the multiplexer 435 to provide the updated value of z.

The control bit sqrt_sw being ZERO-valued also conditions the multiplexer 418 to select arithmetic zero as its output signal. The arithmetic zero output signal selected by the multiplexer 418 is compared to the output signal y from the multiplexer 403 to determine the sign bit of y, the comparison being made by the digital comparator 419 and the sign bit being stored for a word interval in the latch 420. The control bit sqrt_sw being ZERO-valued conditions the multiplexer 421 to apply an $|x|/2$ signal as previously selected by the multiplexer 417 to the adder 422 as its augend input signal. The control bit sqrt—sw being ZERO-valued also conditions the multiplexer 423 to apply that previously selected $|x|/2$ signal to the subtractor 424 as its subtrahend input signal. The addend input signal to the adder 422 and the minuend input signal to the subtractor 424 are each the y output signal from the multiplexer 403. A multiplexer 425 selects the sum output from the adder 422 if the previous value of y was negative, or selects the difference output from the subtractor 424 if the previous value of y was positive. In order to maintain dynamic range in the division procedure, between trial division computation steps, the value of $y-|x|$ or $y+|x|$ selected by the multiplexer 425 is shifted one bit towards greater significance without shifting the trial divisor $|x|$, rather than following the alternative procedure of shifting the trial divisor $|x|$ one bit towards lesser significance without shifting the value of $y-|x|$ or $y+|x|$ selected by the multiplexer 425. Accordingly, the output signal from the multiplexer 425 is multiplied by two by a left-shifter 426, to increase the significance of that output signal, and the resulting doubled signal is supplied as a second input signal to the multiplexer 407.

The saturation arithmetic circuitry 440 is used to keep the magnitude of the quotient zout no larger than unity. To keep the magnitude of the quotient zout in range $|y|$ must be smaller than $|x|$. Circuitry 440 puts out a ONE only when $|y|$ is sufficiently small that division can proceed satisfactorily. A bit-serial comparator 441 in circuitry 440 generates a ONE output signal whenever y exceeds xneg difference output signal from the subtractor 415, indicating a negative-valued y is not too large to be in range. A bit-serial comparator 442 in circuitry 440 generates a one as its output signal whenever y is less than x, indicating a positive-valued y is not too large to be in range. An AND gate 443 in circuitry 440 responds to both indications of y being in range to generate a string of ONEs supplied as input signal to a clocked delay line 444 to be delayed one word before appearing as output signal from the saturation arithmetic circuitry 440. If positive y is out of range, the comparator 419 will continually output ONEs after the ZERO sign bit of y is past, and the accumulation of zout will result in its most positive value, a string of ONEs followed by a ZERO sign bit. If negative y is out of range, the comparator 419 will continually output ZEROs after the ONE sign bit of y is past, and the accumulation of zout will result in its most negative value, a string of ZEROs followed by a ONE sign bit.

The non-restoring square-rooting procedure to compute $(yin)^{(\frac{1}{2})}$ is similar in many respects to a non-restoring division procedure. However, $y_i$ is the radicand when $i=1$ and is otherwise residual radicand, rather than being the dividend when $i=1$ and otherwise being the residual dividend. The trial divisor of the non-restoring division procedure becomes a trial square root to be divided into the residual radicand to generate a result to be compared to the trial test root itself, to determine whether or not the radicand or residual radicand is to be decremented. Since the trial square root to be divided into the residual radicand is to be derived from the zout square root thusfar extracted, there is no need to keep track of the trial test root itself in a separate x out register. In the first computational step the trial square root is invariably one-quarter or binary 0.01.

During the computation of $(yin)^{(\frac{1}{2})}$ the control bit div—sw is ZERO, conditioning the multiplexer 416 continually to select successive ONEs as another input signal to the AND gate 406, in addition to its ctr5 input signal, causing the AND gate 406 output signal to replicate its ctr5 input signal.

During the computation of $(yin)^{(\frac{1}{2})}$ the control bit sqrt—sw is ONE. As will be explained in detail further on, in connection with FIG. 15, this conditions the arc tangent radix ROM circuitry 38 to supply, as tandata signal, bit-serial $2^{-1}$ during the first pair CORDIC program instructions, bit-serial $2^{-2}$ during the second successive pair of CORDIC program instructions, bit-serial $2^{-3}$ during the third successive pair of CORDIC program instructions, etc. The sqrt—sw signal being ONE also conditions the multiplexer 421 to select arithmetic zero to the adder 422 as its addend input signal, so its sum output signal equals its augend input signal y. Accordingly, the residual radicand can only be decremented. The control bit sqrt—sw being ONE also conditions the multiplexer 423 to select to the subtractor 424 as its subtrahend input signal a trial square root that is the sum output signal of an bit-serial adder 437, receiving the z output signal from the multiplexer 405 as its augend input signal and receiving tandata/2 as its addend input signal. The tandata/2 signal is shown as being provided to the adder 437 by a bit shifter 438, as shown in the circuit diagram supplied to a silicon compiler, but in actuality the bit shift towards lesser significance is provided by the silicon compiler by introducing one-bit shifts towards greater significance in all parallel paths. The control bit sqrt—sw being ONE also conditions the multiplexer 434 to select arithmetic zero to the subtractor 433 as its subtrahend input signal. Accordingly, the accumulation of the square root is invariably incremental when it occurs. Furthermore, the sqrt—sw signal being ONE conditions the multiplexer 418 to select the trial square root against which to compare the radicand or residual radicand $y_i$ in order to determine whether or not $y_{(i+1)}$ is or is not to be decremented.

Figure 14:
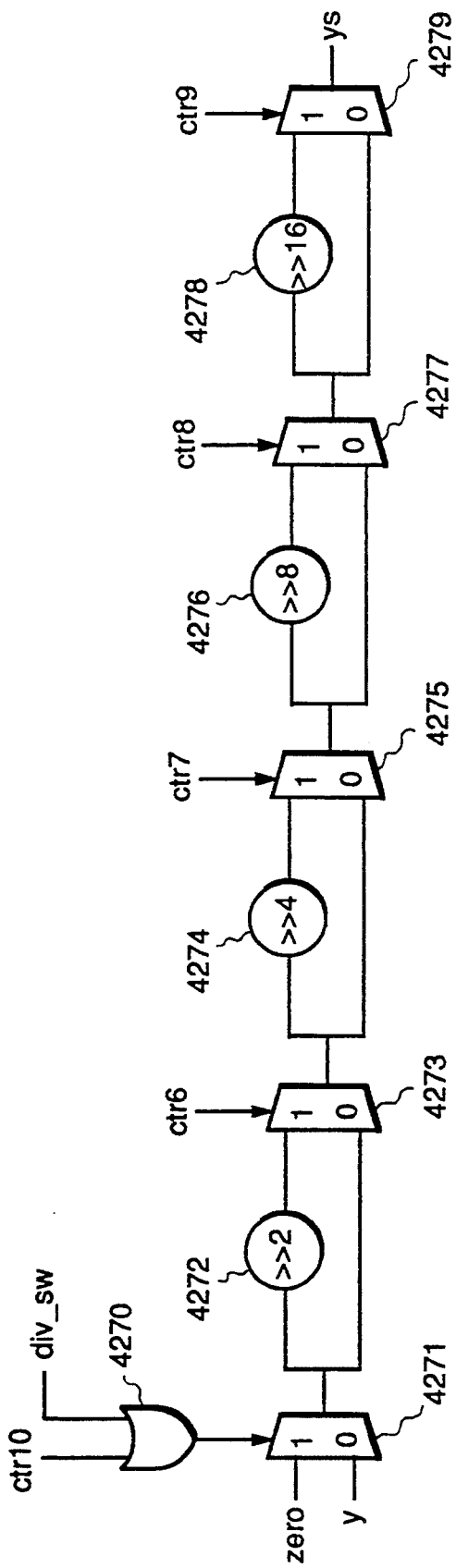
FIG. 14 is a schematic diagram of the scaler used in the FIG. 13 CORDIC processor.

FIG. 14 shows the operation of the scaler 427 in greater detail. The signals ctr5, ctr6, ctr7, ctr8, ctr9 and ctr10 are the successively more significant of the six most significant bits of the count output of the counter 103 (of FIG. 2). An OR gate 4270 responds to the div—sw control bit being ONE during the computation of yin/xin to cause a multiplexer 4271 to select arithmetic zero as input signal to the rest of the scaler circuit 427, resulting in its output being arithmetic zero. The OR gate 4270 also responds to the ctr10 output from the counter 103 reaching ONE at full count to select arithmetic zero as input signal to the rest of the scaler circuit 427, resulting in its output being arithmetic zero.

Except when the OR gate 4270 output signal is a ONE, the scaler 427 responds to the sixteen successive count conditions of the ctr6, ctr7, ctr8 and ctr9 signals from the counter 103 to right-shift the bit-serial signal ys from the scaler 427 by twice the number of bits in that count, as referenced to the bit-serial signal y supplied to the scaler 427.

FIG. 14 shows a two-bit-right shifter 4272 and a multiplexer 4273 used to selectively divide by a factor of four responsive to ctr6 signal being ONE, a four-bit-right shifter 4274 and a multiplexer 4275 used to selectively divide by a factor of sixteen responsive to ctr7 signal being ONE, an eight-bit-right shifter 4276 and a multiplexer 4277 used to selectively divide by a factor of 256 responsive to ctr8 signal being ONE, a 16-bit-right shifter 4278 and a multiplexer 4279 used to selectively divide by a factor of 65 536 responsive to ctr9 signal being ONE. In actuality, bit shifts towards lesser significance are provided by the silicon compiler introducing delays in all parallel signal paths to shift those parallel signal paths towards greater significance; this procedure using left-shifters in all parallel signal paths is necessary since right-shifters per se, are not available in bit-serial format.

Figure 15:
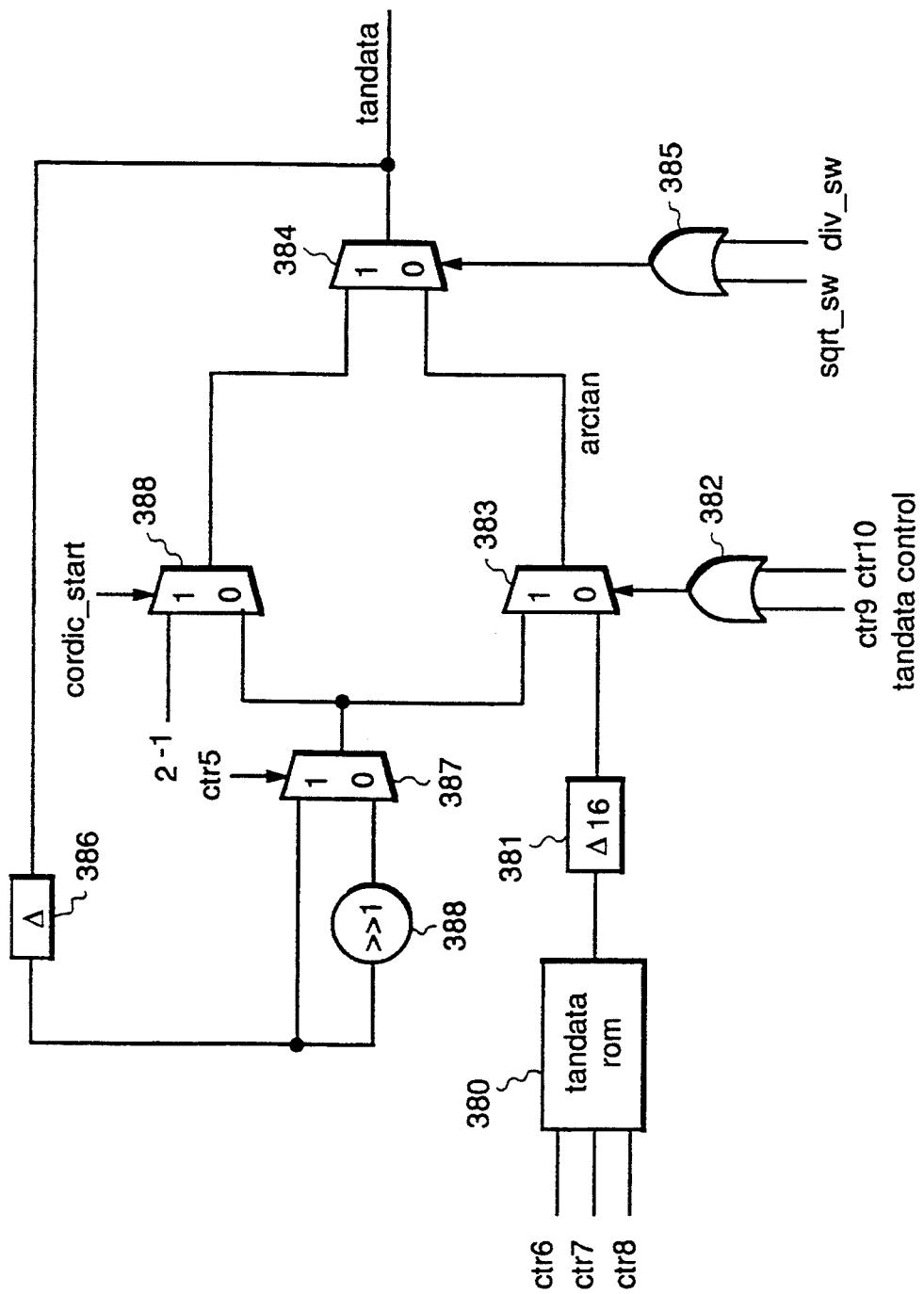
FIG. 15 is a schematic diagram showing more specifically the interface between the arc tan radix read-only memory and the CORDIC processor, shown generally in FIG. 1.

FIG. 15 shows more particularly the details of the arc tangent radix ROM circuitry 38. A reduced size for the actual ROM 380 is made possible by the fact that for smaller angles the tangent function is almost linearly proportional to the angle. Accordingly, the actual ROM 380 stores the arc tangent radices of only the eight largest angles having tangents that are declining negative integral powers of two, which arc tangent radices are successively addressed by an address comprising the ctr6, ctr7 and ctr8 outputs of the counter 103. The stored arc tangent radices are only sixteen bits long but are read out through a parallel-in/serial-out output register within the ROM 380 in such manner that they are followed by sixteen trailing ZEROs, and a clocked delay line 381 delays the ROM 380 serial output to shift the sixteen trailing ZEROs to appear as leading ZEROs. As long as ctr9 and ctr10 outputs of the counter 103 applied as input signals to a two-input OR gate 382 are both ZERO during the first $2^9$ counts of the counter 103 (eight cycles of CORDIC computation), the OR gate 382 output signal is ZERO, conditioning a multiplexer 383 to select arc tangent radices from the ROM 380 as an input signal to a further multiplexer 384. The multiplexer 384 replicates in its own output signal the arctan output signal from the multiplexer 383 responsive to the output signal from an OR gate 385 being ZERO. The output signal from the OR gate 385 is ZERO as long as the sqrt_sw and div_sw signals it receives as its input signals are both ZERO—i.e., during the computation of the arc tangent of yin/xin.

During the computation of the arc tangent of yin/xin, the tandata output signal of the multiplexer 384, as delayed one word in a clocked delay line 386, is applied as one of the input signals to a multiplexer 387. The other input signal of the multiplexer 387 is one-half as large and is generated by a bit shifter 388 from the output signal of the clocked delay line 386. A ctr5 control signal conditions the output signal of the multiplexer 387 to replicate the larger input signal when ctr5 signal is ONE and the smaller input signal when ctr5 signal is ZERO. After the first $2^9$ counts of the counter 103 (eight cycles of CORDIC computations), the OR gate 382 output signal is ONE, conditioning the multiplexer 383 to replicate in its own output signal the output signal from the multiplexer 387. Accordingly, the smallest arc tangent radix stored in the ROM 380 is halved once each successive even CORDIC computation cycle, to appear as the tandata output of the multiplexer 384.

During the computation of yin/xin or the square root of yin, one of the input signals of the OR gate 385 will be a ONE, conditioning the multiplexer 384 to replicate the output signal of a multiplexer 388 in its tandata output signal, rather than the arctan output signal of the multiplexer 383. When the cordic_start signal is high, during the initial cycle of a CORDIC instruction, the multiplexer 388 selects bit-serial $2^{-1}$ as its output signal, and tandata signal is accordingly bit-serial $2^{-1}$ as well. Thereafter, the multiplexer 388 replicates in its own output signal the output signal of the multiplexer 387, so bit-serial $2^{-1}$ is successively halved each even COR-DIC instruction, to appear as the tandata output signal from the multiplexer 384.

In FIG. 16 the CORDIC processor 40 receives an xin input signal as selected by a multiplexer 401 and a yin input signal as selected by a multiplexer 402. The CORDIC processor 40 parallelly generates a yout bit-serial output signal and a zout bit-serial output signal, which signals are supplied to respective input ports of a two-input multiplexer 400. The yout or zout bit-serial output signal selected by the multiplexer 400 is fed back as respective input signals for the multiplexers 401 and 402, so that successive computations can be made by the CORDIC processor 40. In power metering applications the CORDIC processor 40 furnishes output data back to the multiply-add processor 30 only when processor 40 has computed $n_s$ or f. To implement furnishing $n_s$ and f back to the multiply-add processor 30, the multiplexer 400 output signal provides respective input signals for the registers 192 and 194 in register bank 19 by suitable connections.

As noted previously in regard to FIG. 1, processing through the CORDIC processor 40 is done on a time-division-multiplexed basis, and provision is made for metering two functions at the same time. Responsive both to cordic_start being high during the first word interval of each CORDIC instruction cycle and to a load1_sw signal being high, an AND gate 68 generates a ONE output signal that directs the loading of the bit-serial indications of the function digout1 into the bit-serial output register 60. Responsive both to cordic_start being high during the first of each cycle of CORDIC instructions and to a load2_sw signal being high, an AND gate 69 generates a ONE output signal that directs the loading of the bit-serial indications of the function digout2 into the bit-serial output register 62.

Each of the pulse duration modulators 64 and 66 access a shared PDM counter (not specifically shown) which is a bit-serial counter included in the clock generator 100 and counts a modular number (e.g., $2^{15}$) of the 10 MHz oscillations of the crystal oscillator in the clock generator 100. The pulse duration modulator 64 includes a respective bit-serial comparator (not specifically shown) for comparing digout1 in bit-serial form to the bit-serial count supplied from the PDM counter, thereby to generate its train of output pulses. Similarly, the pulse duration modulator 66 includes a respective bit-serial comparator (not specifically shown) for comparing digout2 in bit-serial form to the bit-serial count supplied from the PDM counter, thereby to generate its train of output pulses. Two additional bits of resolution are afforded the PDM output signals by selectively generating, when the ten most significant bits of the digout1 or digout2 signal are determined to correspond to the PDM count, a ONE-valued signal of one-quarter, one-half, or three-quarter word duration depending on the eleventh and twelfth most significant bits of the digout1 or digout2 signal being 01, 10 or 11 respectively, rather than 00. The ONE-valued signal is used to extend the pulse duration defined by the bit-serial comparator response.

FIG. 16 shows the PDM generator 66 connected for applying its pulses as a first input signal of a two-input exclusive_OR gate 70, supplying pdm2 output signal that corresponds to the pulses from the PDM generator 66 except when load1_sw and load2_sw signals are both high at the same time that cordic_start pulses high. Under these conditions, digout1 and digout2 are the same, and the pulses put out by the PDM generators 64 and 66 are the same. A multiplexer 71 receptive of the output signals of the AND gates 68 and 69 receives two ONEs as input signals and responds to supply a ONE as its output signal. The output signal of the multiplexer 71 is applied to the exclusive-OR gate 70 as its second input signal. The pdm2 signal supplied from the exclusive-OR gate 70 is the complement of the pulses from the PDM generator 66. The PDM generators 64 and 66 are thus arranged for providing push-pull drive for a center-reading D—Arsonval meter. A single-bit-duration clocked delay 72 is connected to latch the output signal state of the multiplexer 71 when the output signal of the AND gate 68 returns to zero.

The yout or zout bit-serial output signal selected by the multiplexer 400 is applied as an input signal to the normalizer 39. As noted in the previous description of FIG. 1, the normalizer circuit 39 cooperates with the CORDIC processor 40 to provide for the calculation of the further primitive function:

(e) [sign (oa2)]*(yin−L)/M.

This function provides expanded scale readings on meters such as the meters 61, 63, 65 and 67 of FIG. 1, by first translating meter zero by the constant L and by then scaling down the translated reading by the factor M. Since in power metering this function is invariably the last of a string of computations, the yin signal for the last of a string of computations is identical to the yout multiplexer 400 output signal for the next-to-last of the string of computations. L and M are constants in CORDIC program instructions from the PROM 9 as extracted by elements 98 and 984–986 of FIG. 2 and supplied to the normalizer 39. A multiplexer 390 selects, as its output signal for application to the multiplexer 402, either the difference output signal from a subtractor 391 or the difference output signal from a subtractor 392. The yout signal furnished from the multiplexer 400 is subtracted from L in a subtractor 391, and L is subtracted from that y out signal in a subtractor 392. M is applied directly to the multiplexer 401 as an input signal thereto, to be used (in the last of a string of computations by the CORDIC processor 40)as an xin divisor for the (yout−L) dividend selected to processor 40 from the normalizer 39 by the multiplexer 402.

The polarity of oa2, sign(oa2), is determined from the oa2 bit serial data stored in the register 196, by sampling and holding bit 31 of oa2 in sample-and-hold circuitry 394. The sampled and held sign(oa2) is applied from circuitry 394 to a two-input AND gate 395. The AND gate 395 receives as its other input signal a signal sq_sw which is ZERO during all CORDIC computations except when it is desired to change the polarity of the final CORDIC output in accordance with sign(oa2) being negative. The AND gate 395 output signal is ZERO when the signal sq_sw is a ZERO and is [sign (oa2)] when the signal sq_sw is a ONE. An exclusive-OR gate 396 receives the AND gate 395 output signal and an n_sw signal as input signals and supplies its output response to the multiplexer 390 to control its selection between the output signals from the subtractor 391 and the subtractor 392. The n_sw signal is a signal that is high when one wishes to reverse the senses of the digout1 and pdm1 output signals, or the senses of the digout2 and pdm2 output signals. If the n_sw signal is a ONE, the exclusive-OR gate 396 conditions the multiplexer 402 to select (L−yout) difference signal from the subtracter 391 for its output signal when the AND gate 395 output signal is a ZERO and to select (yout−L) difference signal from the subtracter 392 for its output signal when the AND gate 395 output signal is a ONE. If the n_sw signal is a ZERO, the exclusive-OR gate 396 conditions the multiplexer 402 to select (yout−L) difference signal from the subtracter 392 for its output signal when the AND gate 395 output signal is a ZERO and to select (L−yout) difference signal from the subtracter 391 for its output signal when the AND gate 395 output signal is a ONE.

Figure 17:
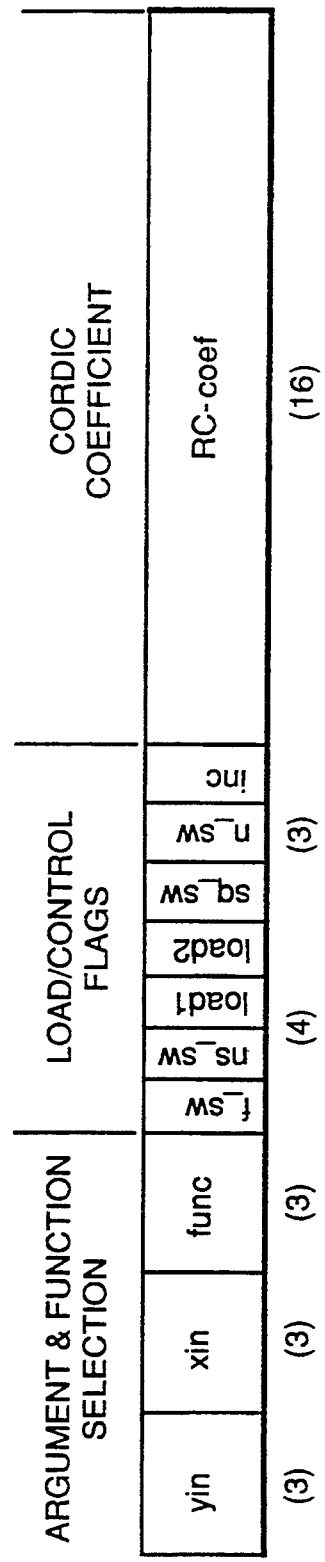
FIG. 17 is a diagram of the CORDIC processor instruction format.

FIG. 17 shows the format of the instructions for the CORDIC processor 40. These instructions have three major fields in them: a 9-bit field controlling argument and function selection in the CORDIC processor 40, a 7-bit field for loading and control flag signals, and a 16-bit field for CORDIC coefficients, or RC-coef values. The 7-bit field for loading and control flag signals comprises four single-bit loading signals: f_sw, ns_sw, load1 corresponding to load1_sw and load2 corresponding to load2_sw, The 7-bit field for loading and control flag signals also comprises three single-bit control signals: sq_sw and n_sw used by the normalizer 39 in FIG. 16, and inc corresponding to the cordic_inc signal applied to the AND gate 1010 in FIG. 12 to control incrementation of the count in the CORDIC instruction counter 108. The 9-bit field controlling argument and function selection in the CORDIC processor 40 has a three-bit portion controlling the selection of yin, has another three-bit portion controlling the selection of xin, and has still another three-bit portion controlling the function performed by the processor 40.

FIG. 18 depicts representative argument and function coding in detail. R C is the result of the previous calculation by the processor 40 as supplied from the multiplexer 400 in FIG. 16. RC-coef is the value of a current CORDIC coefficient, and RC-coef$_{-1}$ is the value of the CORDIC coefficient immediately preceding the current CORDIC coefficient.

FIG. 19 diagrams the calculations performed by the processors 30 and 40 in the power meter i-c 5. One instruction for the multiply-add processor 30 is executed each 32-bit word sequentially time-division multiplexed into the processor 30 from the six-channel decimation filter 20. One complete cycle of sixty-four instructions for the multiply-add processor 30 is executed during the time each successive one of the instructions for the CORDIC processor 40 is executed. The time to execute one of the instructions for the CORDIC processor 40 is equal to the oversampling interval for the sigma-delta modulators 21–26.

An initial procedure is the linearization of the bit-serial digital representations of $v_1$, $i_1$, $v_2$, $i_2$, $v_3$ and $i_3$ supplied from the decimation filter 20 to compensate for non-linearities in the current transformers 11–16. The current transformers 11–16 and the scaling resistors used with them are mounted on a printed circuit board together with the power meter i-c 5, and during manufacture the entire printed circuit board assembly is tested as a unit to determine the coefficients of non-linearity associated with the current transformers 11–16, which are then written into the PROM 9 included in that assembly. The coefficients of non-linearity are used by the multiply-add processor 30 to perform respective third-order polynomial corrections of the bit-serial digital representations of $v_1$, $i_1$, $v_2$, $i_2$, $v_3$ and $i_3$ supplied from the decimation filter 20, which respective corrections are followed by respective high-pass filtering procedures to remove direct components resulting from offset errors in the sigma-delta modulators 21–26.

Figure 19A:
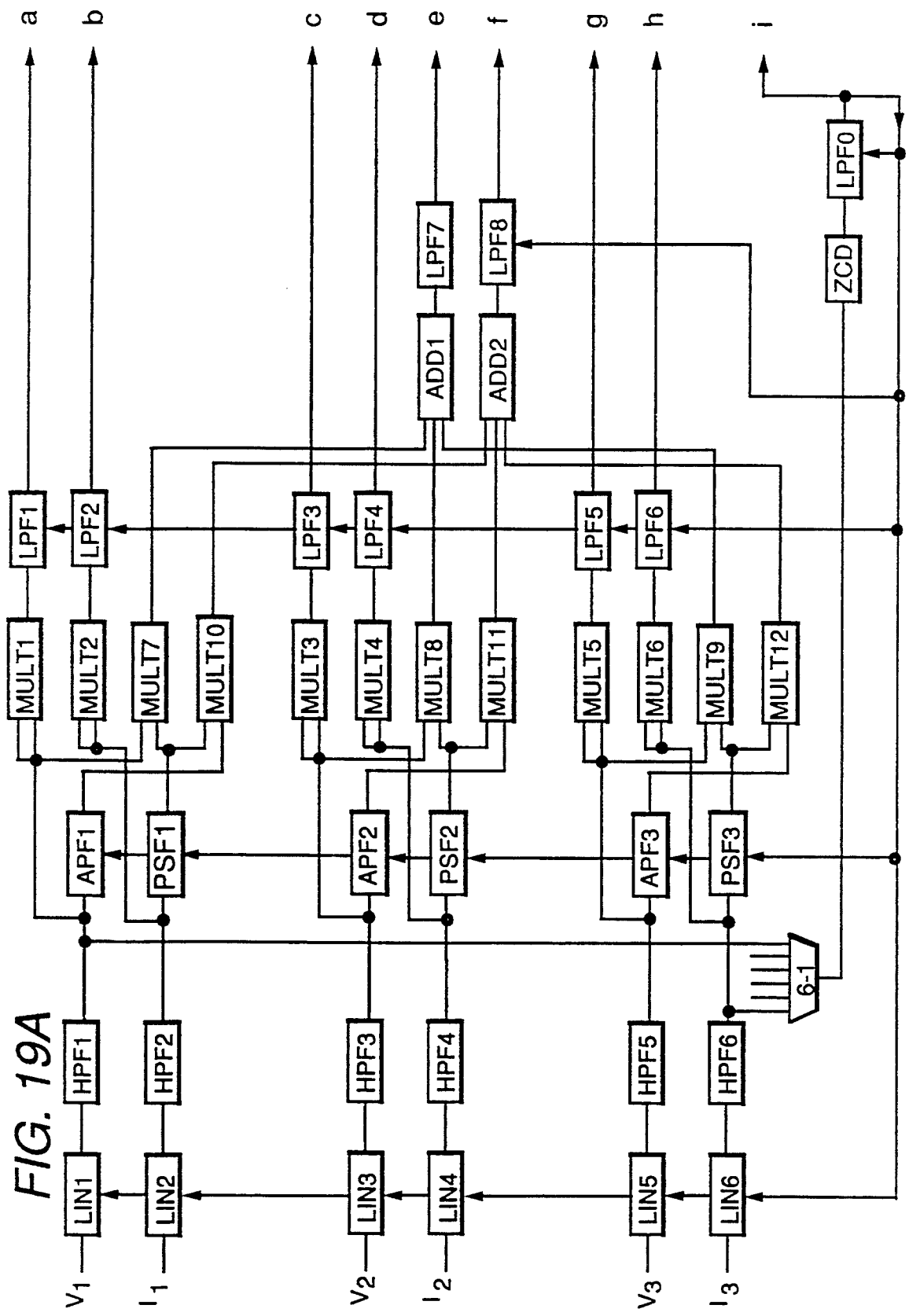
FIG. 19A is a block diagram of the processing carried out in the multiply add processor of the FIG. 1 monolithic integrated circuit.

Referring now to the procedures diagrammed in FIG. 19A, in each of the steps LIN1, LIN3 and LIN5, a respective corrected value $v_{ck}$ of $v_k$ is computed by the multiply-add processor 30 for all samples of $v_k$, using linearization coefficients $A_k$ and $B_k$ read from PROM 9 and a previously computed gain coefficient $\Gamma_{vk}$, the computations being in accordance with the equation that follows.

$$v_{ck} = \{[(A_k * v_k) + B_k]v_k + \Gamma_{vk}\}v_k \quad K=1,2,3 \qquad \text{Eq. (1)}$$

In each of the steps LIN2, LIN4 and LIN6, a respective corrected value $i_{ck}$ of $i_k$ is computed by the multiply-add processor 30 for all samples of $i_k$, using linearization coefficients $D_k$ and $E_k$ read from PROM 9 and a previously computed gain coefficient $\Gamma_{ik}$, the computations being in accordance with the equation that follows.

$$i_{ck} = \{[(D_k * i_k) + E_k]i_k + \Gamma_{ik}\}i_k \quad k=1,2,3 \qquad \text{Eq. (2)}$$

In each of the steps HPF1, HPF3 and HPF5 respectively following the steps LIN1, LIN3 and LIN5, a respective high-pass filter response $v_{hk}$ to $v_{ck}$ is computed by the multiply-add processor 30 for all samples of $v_{ck}$, using a recursion coefficient P read thereto from PROM 9, the computations being in accordance with the equation that follows, in which $z^{-1}$ is the one-word delay operator for a 32-bit bit-serial word.

$$v_{hk} = v_{ck} - z^{-1}v_{ck} + P*z^{-1}v_{hk} \quad k=1,2,3 \qquad \text{Eq. (3)}$$

In each of the steps HPF2, HPF4 and HPF6 respectively following the steps LIN2, LIN4 and LIN6, a respective high-pass filter response $i_{hk}$ to $i_{ck}$ is computed by the multiply-add processor 30 for all samples of $i_{ck}$, using a recursion coefficient Q read thereto from PROM 9, the computations being in accordance with the equation that follows.

$$i_{hk} = i_{ck} - z^{-1}i_{ck} + A*z^{-1}i_{hk} \quad k=1,2,3 \qquad \text{Eq. (4)}$$

Figure 19B:
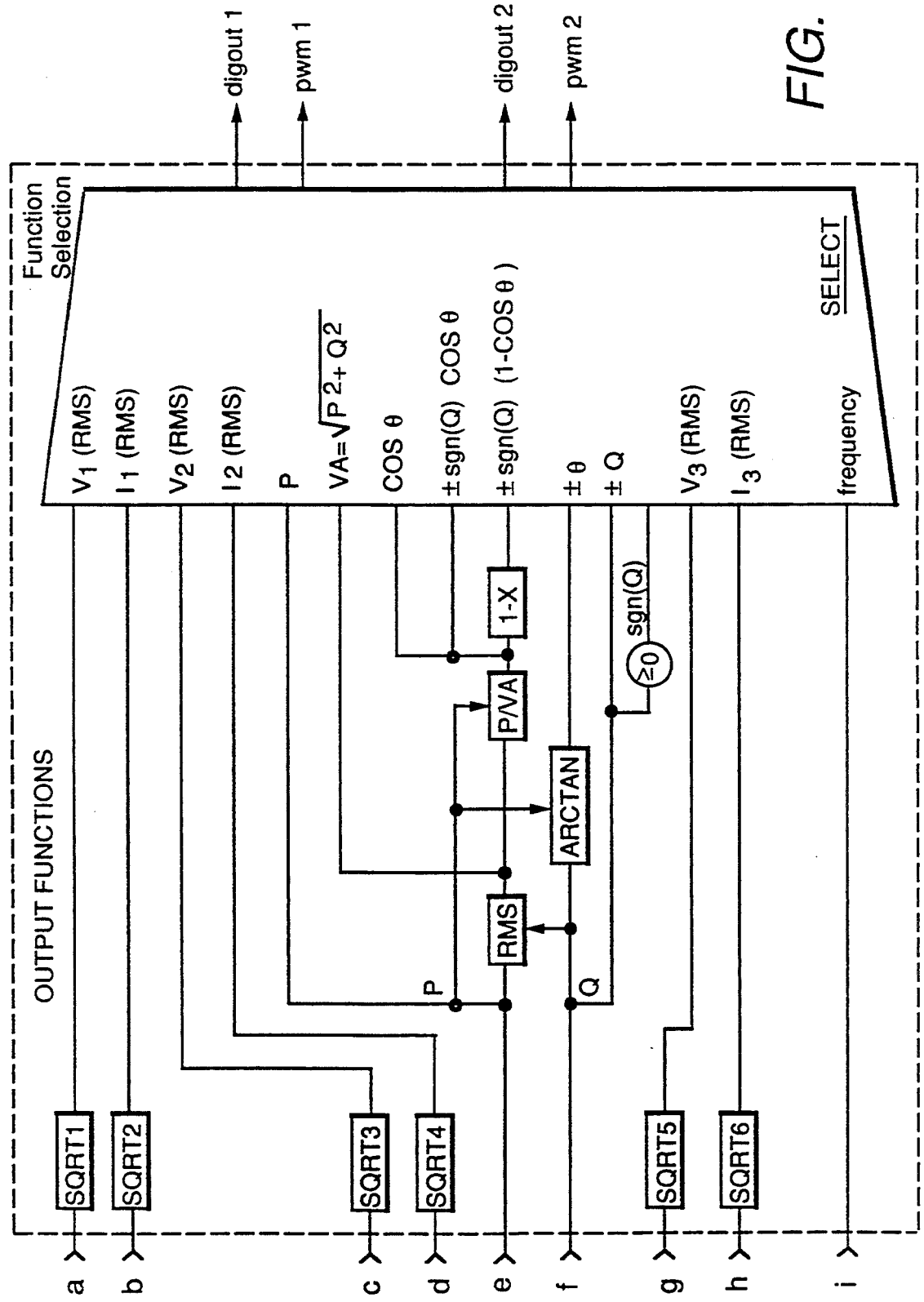
FIG. 19B is a block diagram of the processing carried out in the CORDIC processor of the FIG. 1 monolithic integrated circuit.

As shown in FIG. 19A the multiply-add processor 30 can square the $v_{h1}$ high-pass filter response by multiplication with itself in a multiplication step MULT1 and then subject the product to a low-pass filtering step LPF1. As shown in FIG. 19B the bit-serial signal resulting from the low-pass filtering step LPF1 is supplied to the CORDIC processor 40 as input signal for a square rooting step SQRT1 that generates a bit-serial indication of the r-m-s voltage on the main conductor 1.

As shown in FIG. 19A the multiply-add processor 30 can square the $i_{h1}$ high-pass filter response by multiplication with itself in a multiplication step MULT2 and then subject the product to a low-pass filtering step LPF2. As shown in FIG. 19B the bit-serial signal resulting from the low-pass filtering step LPF2 is supplied to the CORDIC processor 40 as input signal for a square rooting step SQRT2 that generates a bit-serial indication of the r-m-s current through the main conductor 1.

As shown in FIG. 19A the multiply-add processor 30 can square the $v_{h2}$ high-pass filter response by multiplication with itself in a multiplication step MULT3 and then subject the product to a low-pass filtering step LPF3. As shown in FIG. 19B the bit-serial signal resulting from the low-pass filtering step LPF3 is supplied to the CORDIC processor 40 as input signal for a square rooting step SQRT3 that generates. a bit-serial indication of the r-m-s voltage on the main conductor 2.

As shown in FIG. 19A the multiply-add processor 30 can square the $i_{h2}$ high-pass filter response by multiplication with itself in a multiplication step MULT4 and then subject the product to a low-pass filtering step LPF4. As shown in FIG. 19B the bit-serial signal resulting from the low-pass filtering step LPF4 is supplied to the CORDIC processor 40 as input signal for a square rooting step SQRT4 that generates a bit-serial indication of the r-m-s current through the main conductor 2.

As shown in FIG. 19A the multiply-add processor 30 can square the $v_{h3}$ high-pass filter response by multiplication with itself in a multiplication step MULT5 and then subject the product to a low-pass filtering step LPF5. As shown in FIG. 19B the bit-serial signal resulting from the low-pass filtering step LPF5 is supplied to the CORDIC processor 40 as input signal for a square rooting step SQRT5 that generates. a bit-serial indication of the r-m-s voltage on the main conductor 3.

As shown in FIG. 19A the multiply-add processor 30 can square the $i_{h3}$ high-pass filter response by multiplication with itself in a multiplication step MULT6 and then subject the product to a low-pass filtering step LPF6. As shown in FIG. 19B the bit-serial serial signal resulting from the low-pass filtering step LPF6 is supplied to the CORDIC processor 40 as input signal for a square rooting step SQRT6 that generates a bit-serial indication of the r-m-s current through the main conductor 3.

In a SELECT step shown in FIG. 19B, any one of these r-m-s voltages and currents may be selected to appear as digout1 output signal from the i-c 5; and in another, subsequent or concurrent, SELECT step any one of these r-m-s voltages and currents may be selected to appear as digout2 output signal from the i-c 5. The FIG. 19A processing done in the multiply-add processor 30 to implement the computation of the r-m-s voltages and currents for each of the phases is described in the following equations, wherein $v_{sk}$ is read as "the square of the high-pass filtered linearized phase-k voltage $V_{hk}$" and wherein $i_{sk}$ is read as "the square of the high-pass filtered linearized phase-k current $i_{hk}$".

$$v_{sk} = v_{hk} * v_{hk} \qquad \text{Eq. (5)}$$

$$i_{sk} = i_{hk} * i_{hk} \qquad \text{Eq. (6)}$$

As shown in FIG. 19A, the multiply-add processor 30 can phase shift each of the high-pass filter responses $v_{h1}$, $V_{h2}$ and $v_{h3}$ each by ninety degrees in all-pass filter steps APF1, APF2 and APF3, respectively, to generate phase-shifted high-pass filter responses $v_{p1}$, $v_{p2}$ and $v_{p3}$ in accordance with the following equation.

$$v_{pk} = z^{-1}v_{hk} + \alpha(z^{-1}v_{pk} - v_{hk}) \quad k=1,2,3 \qquad \text{Eq. (7)}$$

As shown in FIG. 19A, the multiply-add processor 30 can in respective interpolation (phase shift) filter steps PSF1, PSF2 and PSF3 phase shift each of the high-pass filter responses $i_{h1}$, $i_{h2}$ and $i_{h3}$ by the number of degrees needed to compensate for phase differences in the secondary voltages of the current transformers 11, 12 and 13, respectively, as compared to the secondary voltages of the current transformers 14, 15 and 16, respectively. The interpolation filter steps PSF1, PSF2 and PSF3 generate phase-shifted high-pass filter responses $i_{p1}$, $i_{p2}$ and $i_{p3}$ in accordance with the following equation.

$$i_{pk} = i_{hk} + \delta_k(z^{-1}i_{hk} - i_{hk}) \quad k=1,2,3 \qquad \text{Eq. (8)}$$

These calculations are normally carried out in a $v_{p1}$, $v_{p2}$, $v_{p3}$, $i_{p1}$, $i_{p2}$, $i_{p3}$ sequence, using the program data RAM 6 for temporarily storing the results of these computations.

As shown in FIG. 19A, the multiply-add processor 30 can multiply $v_{h1}$ by $i_{p1}$ in a multiplication step MULT7 to calculate first-phase real power and temporarily store the result, multiply $v_{h2}$ by $i_{p2}$ in a multiplication step MULT8 to calculate second-phase real power and temporarily store the result, multiply $v_{h3}$ by $i_{p3}$ in a multiplication step MULT9 to calculate third-phase real power, add to the third-phase real power component the temporarily stored first- and second-phase real power components in an addition step ADD1 to generate a bit-serial sum signal $P_s$, in accordance with the following equation.

$$p_s = (v_{h1} * i_{p1}) + (v_{h2} * i_{p2}) + (v_{h3} * i_{p3}) \qquad \text{Eq. (9)}$$

The multiply-add processor 30 can then subject that sum signal $P_s$ to a low-pass filtering step LPF7 to generate an indication of the average real power flowing in the main conductors 1, 2 and 3.

As shown in FIG. 19A, the multiply-add processor 30 can multiply $v_{p1}$ by $i_{p1}$ in a multiplication step MULT10 to calculate first-phase reactive power and temporarily store the result, multiply $v_{p2}$ by $i_{p2}$ in a multiplication step MULT11 to calculate second-phase reactive power and temporarily store the result, multiply $v_{p3}$ by $i_{p3}$ in a multiplication step MULT12 to calculate third-phase reactive power, add to the third-phase real power component the temporarily stored first- and second-phase reactive power components in an addition step ADD2 to generate a bit-serial sum signal $q_s$, in accordance with the following equation.

$$q_s = (v_{p1} * i_{p1}) + (v_{p2} * i_{p2}) + (v_{p3} * i_{p3}) \qquad \text{Eq. (10)}$$

The multiply-add processor 30 can then subject that sum signal $q_s$ to a low-pass filtering step LPF8 to generate an indication of the average reactive power flowing in the main conductors 1, 2 and 3.

In a SELECT step shown in FIG. 19B, the indications of the real power P and of the reactive power Q flowing in the main conductors may be selected to appear as digout1 and as digout2 output signals from the i-c 5.

Alternatively, as shown in FIG. 19B, the indications of the real power and of the reactive power may be used by the CORDIC processor 40 in an ARCTAN step to calculate power factor angle Θ and in an RMS step to calculate the square root of the sum of their squares, thus to compute the "apparent" r-m-s volt-amperes VA to which the main conductors 1, 2 and 3 are subjected. In another alternative operation shown in FIG. 19B, the CORDIC processor 40 in a step P/VA may calculate the cosine of the power factor angle Θ), with or without the sign of the reactive power Q as determined by stripping its sign bit in the step sgn(Q), and its versine complement as determined by the step 1-x.

Certain of the calibration coefficients are frequency-dependent. Since the printed circuit board assembly may be used in 50, 60 or 400 Hz power metering, a preliminary procedure is the determination of the frequency of the power being metered. This preliminary procedure is carried out later in the serial execution of instructions for the multiply-add processor 30 than the steps outlined above in connection with equations 1–10, however, and the results saved over in RAM 6 for use in executing the next cycle of multiply-add processor 30 instructions. This is generally satisfactory since variations in power line frequency tend to be very slow.

The correctness or non-correctness of the third-order polynomial linearization does not affect frequency determination in any case, and as shown in FIG. 19A the zero-crossing detector 36 performs a ZCD step to generate zero-crossing indications for any selected one $s_{hk}$ of the high-pass-filter responses $i_{h1}$, $i_2$, $i_{h3}$, $v_{h1}$, $V_{h2}$ and $v_{h3}$. These zero-crossing indications are subjected to a step LPF0 of low-pass filtering by the multiply-add processor 30, as described by the following equation.

$$f_a = z^{-1}f_a + \beta_{wf} * zcd(R, s_{sk}) \qquad \text{Eq. (11)}$$

The zcd $(R, S_{hk})$ response of the zero-crossing detector 36 is a function only of $s_{hk}$ if $s_{hk}$ has a frequency that is smaller than a prescribed maximum $\tfrac{1}{2}R$, where R is a prescribed minimum time between zero crossings, as read from PROM 9. R and $s_{hk}$ are applied to the ZCT and $s_{hk}$ inputs, respectively, of the zero-crossing detector 36. If the frequency of $s_{hk}$ exceeds $\tfrac{1}{2}R$, the zero-crossing detector 36 will produce pulses corresponding to the highest frequency subharmonic of the signal frequency which is less than $\tfrac{1}{2}R$. The accumulated filter response $f_a$ is supplied to the CORDIC processor 40, which divides $f_a$ by $4n_s$, then divides the quotient by $4n_s$, thereby to compute the frequency f of the zero-crossing indications in accordance with the following equation.

$$f = f_a/4n_s/4n_s \qquad \text{Eq. (12)}$$

The value f is written into the register 192 for subsequent use in the multiply-add processor.

After the value f in the register 192 is updated, the frequency-dependent gain coefficients $\Gamma_{vk}$ are computed by the multiply-add processor 30, in accordance with the equation that follows, proceeding from f read to the multiply-add processor 30 from the register 192 and from frequency-independent constants $C_{0k}$ and $C_{1k}$ read to the multiply-add processor 30 from PROM 9.

$$\Gamma_{vk} = C_{0k} + f * C_{1k} \qquad \text{Eq. (13)}$$

The results of computing $\Gamma_{v1}$, $\Gamma_{v2}$ and $\Gamma_{v3}$ are subsequently used on all samples of $v_1$, $v_2$ and $v_3$, respectively, in connection with the linearization of samples from current transformers 14, 15 and 16, respectively.

After the value f in the register 192 is updated, the frequency-dependent coefficients of non-linearity, $\Gamma_{ik}$, are computed by the multiply-add processor 30, in accordance with the equation that follows, proceeding from f read to the multiply-add processor 30 from the register 192 and from frequency-independent constants $F_{0k}$ and $F_{1k}$ read to the multiply-add processor 30 from PROM 9.

$$\Gamma_{ik} = F_{0k} + f * F_{1k} \qquad \text{Eq. (14)}$$

The results of computing $\Gamma_{i1}$, $\Gamma_{i2}$ and $\Gamma_{i3}$ are subsequently used on all samples of $i_1$, $i_2$ and $i_3$, respectively, in connection with the gain correction of samples from current transformers 11, 12 and 13, respectively.

After the value f in the register 192 is updated, a frequency-dependent interpolation coefficient, $\delta_k$, is computed by the multiply-add processor 30, in accordance with the equation that follows, proceeding from f read to the multiply-add processor 30 from the register 192 and from frequency-independent constants $H_k$ and $G_k$ read to the multiply-add processor 30 from PROM 9.

$$\delta_k = H_k + f^*G_k \qquad \text{Eq. (15)}$$

The results of computing $\delta_1$, $\delta_2$ and $\delta_3$ are subsequently used to correct the phase of current samples originating from current transformers 11–13 vis-a-vis voltage samples originating from current transformers 14–16.

After the value f in the register 192 is updated, a frequency-dependent all-pass filter coefficient, $\alpha$, is computed by the multiply-add processor 30, in accordance with the equation that follows, proceeding from f read to the multiply-add processor 30 from the register 192 and from frequency-independent constants J and K read to the multiply-add processor 30 from the PROM 9.

$$\alpha = j + f^*K \qquad \text{Eq. (16)}$$

The result of computing $\alpha$ is subsequently used in phase shifting "sinusoidal" voltages by ninety degrees in all-pass filtering implemented by the multiply-add processor 30. J and K are computed to provide a precise 90-degree phase-shift for 50 Hz and 60 Hz signals.

After the value f in the register 192 is updated, the multiply-add processor 30 executes an instruction in which the value f read from the register 192 and a value T read from prom 9 are multiplied together and the binary fraction portion of the resulting product is discarded in a rounding down operation termed "floor", to determine a parameter $n_p$, as expressed in the following equation.

$$n_p = \text{floor}(T^*f) \qquad \text{Eq. (17)}$$

The value T is one-half the maximum time duration permitted between pulses of update_nb and therefore corresponds to one-half the maximum time between updated i-c 5 output signals, and $n_p$ is the largest number of complete signal cycles that can be fitted within this time duration. The value $n_p$ is written into the register 193, so as to be available to the CORDIC processor 40. The CORDIC processor 40 subsequently computes the number of samples $n_s$ in each sawtooth of a sawtooth generator in the triangular coefficient generator 37, the computation being done in accordance with the following equation.

$$n_s = \text{floor}(n_p/f) \qquad \text{Eq.(18)}$$

The value $n_s$ is written into the register 194, so as to be available to the multiply-add processor 30 by the time it is needed by the low-pass filtering procedures already in progress.

Low-pass filtering steps LPF1 through LPF8 are carried out using the extended precision mode of the multiply-add processor 30 and the narrow-band sinc² FIR filter coefficients generated by the triangular coefficient generator 37. Each filtering operation therefore requires two instructions. During the first instruction, the XP flag is set to ONE, $\beta_{nb}$ is selected to coef_in, the signal being filtered is selected to data_in, the least-significant word of the associated accumulator is selected from RAM 6 to acc_in, and the result is written back to RAM 6 to update the least-significant word of the accumulator. During the second instruction, the XP flag is restored in ZERO, $\beta_{nb}$ is again selected to coef_in, the signal being filtered is again selected to data_in, the most-significant word of the associated accumulator is selected from RAM 6, and the result is added to the carry from the first instruction as has been previously described and written back to RAM 6 to update the most-significant word of the accumulator. Below, this two instruction sequence is represented by function xp() to describe the computation of LPF1 through LPF8.

$$v_{ak} = xp(z^{-1}v_{ak} + \beta_{wb}^*v_{sk}) \qquad \text{Eq. (19)}$$

$$i_{ak} = xp(z^{-1}i_{ak} + \beta_{nb}^*i_{sk}) \qquad \text{Eq. (20)}$$

$$p_a = xp(z^{-1}p_a + \beta_{nb}^*p_s) \qquad \text{Eq. (21)}$$

$$q_a = xp(z^{-1}q_a + \beta_{nb}^*q_s) \qquad \text{Eq. (22)}$$

In actuality, the SELECT operation shown in FIG. 19B is implemented by specifying the computation of only the desired two functions in the MAP and CORDIC programs. Computation not required to form the desired two outputs is not carried forward, and the MAP 30 has been designed to have only enough memory and computing speed for the most demanding combination of functions: real three-phase power P and reactive three-phase power Q.

Figure 20:
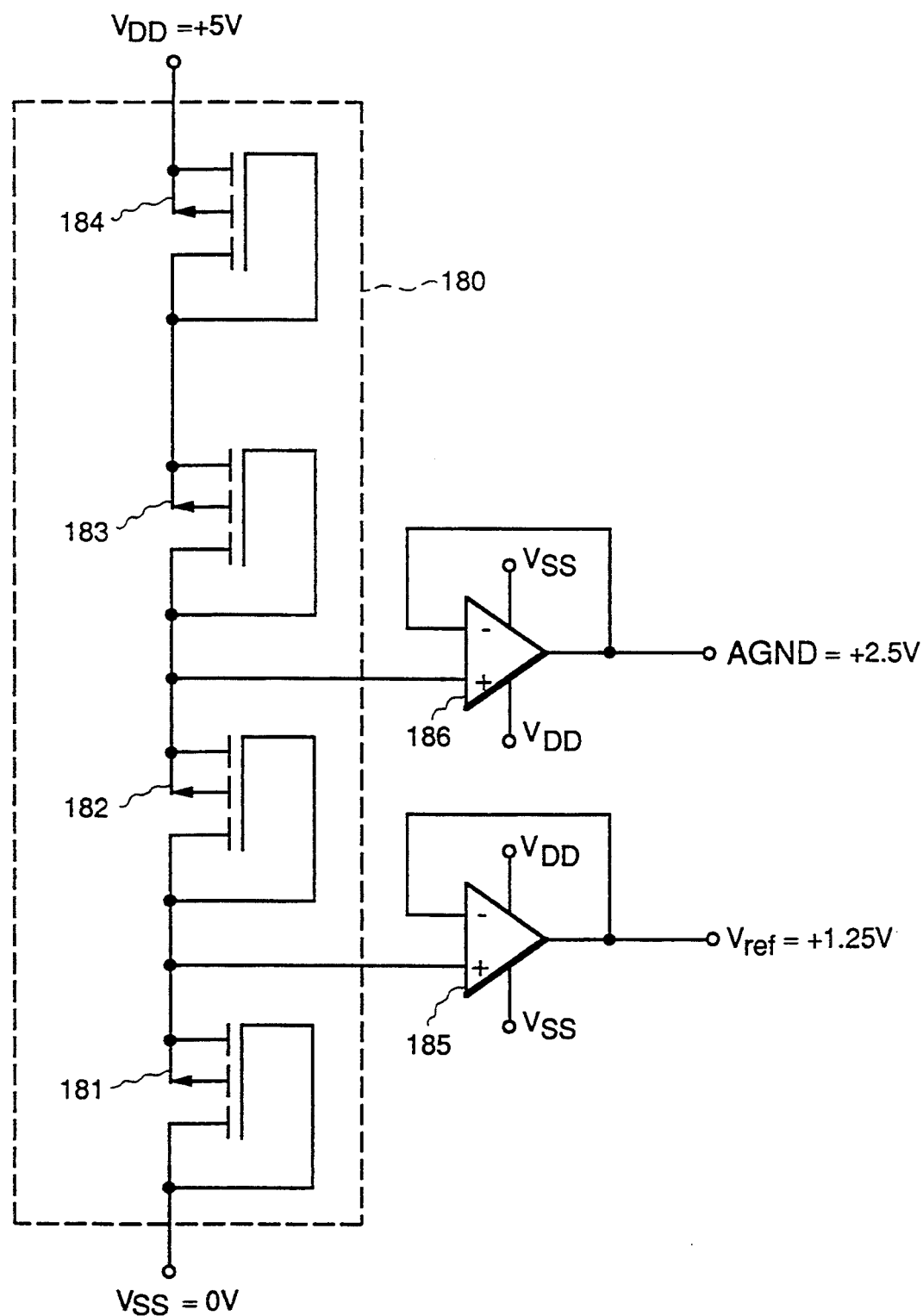
FIG. 20 is a schematic diagram of the analog reference generator shown in FIG. 1.

FIG. 20 shows in greater detail the analog reference generator 18. Power meter i-c 5 receives $V_{SS}$ and $V_{DD}$ power supply voltages that are zero and +5 volts, respectively. A potential divider 180 comprises a series string of "diodes" 181, 182, 183 and 184 which "diodes" comprise respective self-biased enhancement-mode metal-oxide-semiconductor (MOS) field-effect transistors of identical geometry and channel type. An operational amplifier 185 constructed from MOS field-effect transistors is connected as a voltage-follower to supply a reference voltage $V_{ref} = V_{SS} + (\frac{3}{4})(V_{DD} - V_{SS})$ from low source impedance. Another operational amplifier 186 constructed from MOS field-effect transistors is connected as a voltage-follower to supply a voltage $AGND = V_{SS} + (\frac{1}{2})(V_{DD} - V_{SS})$ from low source impedance to the secondary windings of current-sensing transformers 11, 12 and 13 and to the secondary windings of voltage-sensing transformers 14, 15 and 16. The sigma-delta modulators 21–26 use the $V_{ref}$ and AGND signals in the digital-to-analog inverters included in their respective feedback connections. The sigma-delta modulators 21–26 preferably are differential input types as described in U.S. Pat. No. 4,896,156 using $V_{ref}$ and AGND as push-pull analog feedback signals for one digital output bit condition and AGND and $V_{ref}$ (in reversed order) as push-pull analog feedback signals for the other digital output bit condition.

In FIG. 1 the magnitude of the digital signal supplied from the six-channel decimation filter 20 varies in inverse proportion to increase in $(V_{DD} - V_{SS})$ owing to the action of the sigma-delta modulators 21–26. The amplitude of the pulse duration modulators 43 and 44 varies in direct proportion to $(V_{DD} - V_{SS})$, supposing them to receive $V_{SS}$ and $V_{DD}$ as power supply voltages. These effects combine to make independent of minor $(V_{DD} - V_{SS})$ variations the readings of meters with D—Arsonval movements power from the pdm1 and pdm2 output voltages with regard to voltages or currents appearing on the main conductors 1, 2 and 3. Furthermore, the digout1 and digout2 signals when measuring the ratio of two voltages, the ratio of two currents, power factors or frequency have magnitudes independent of ($V_{DD}-V_{SS}$) variations. Accordingly, accurate readings of voltages, currents, voltage ratios, current ratios, power factor and frequency can be obtained even with relatively poor regulation of the power supply voltage ($V_{DD}-V_{SS}$) for the power meter i-c 5. In other circumstances the ($V_{DD}-V_{SS}$) power supply voltage for the i-c 5 has to be more carefully regulated.

Figure 21:
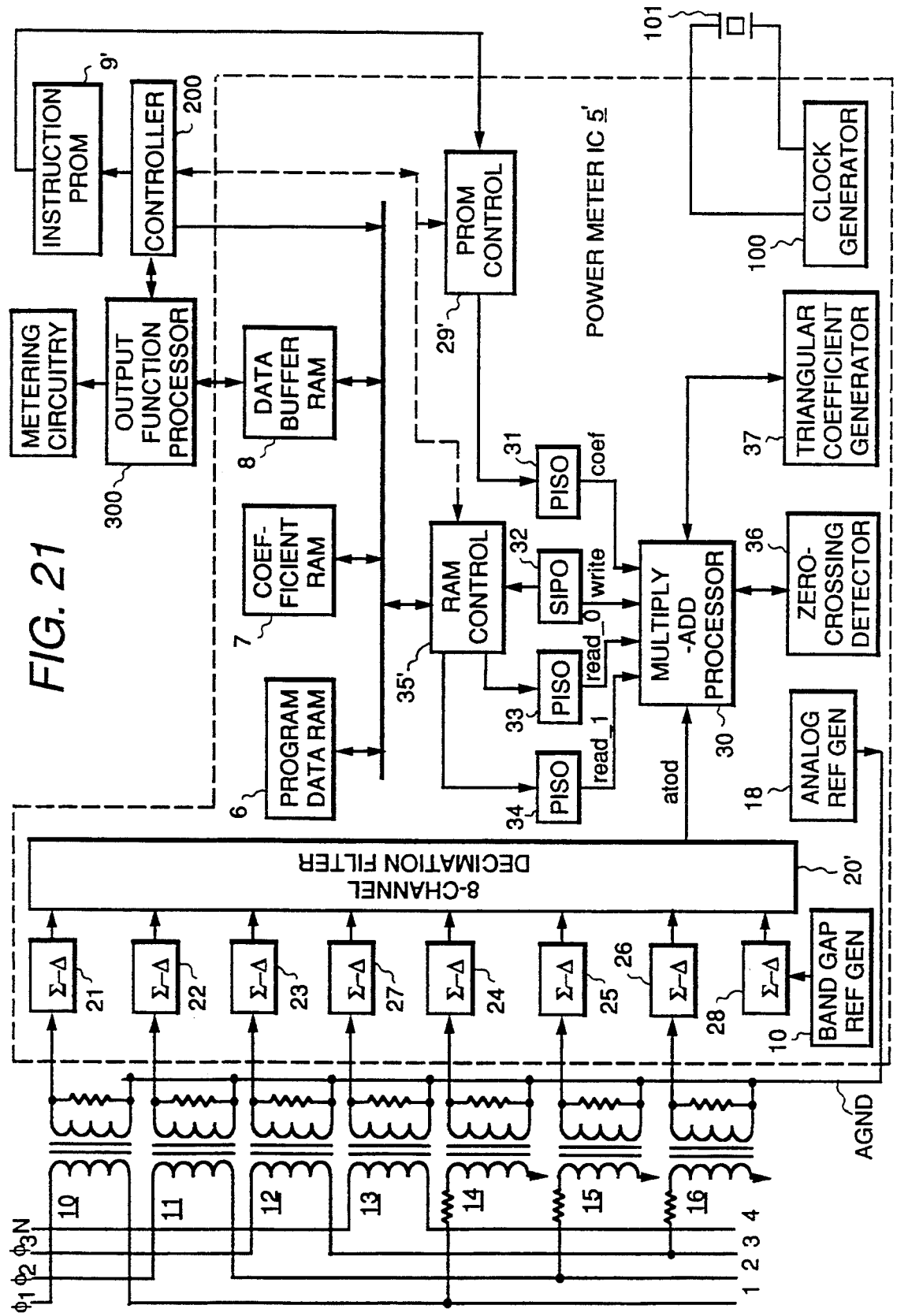
FIG. 21 is a schematic diagram of an alternative monolithic integrated circuit connected for use in a power metering system, which monolithic integrated circuit embodies the invention in certain of its aspects and has therewithin oversampling analog-to-digital converters and a bit-serial multiply-add processor.

The FIG. 21 alternative power metering system uses a monolithic integrated circuit 5' that does not have a CORDIC processor therewithin.

FIG. 22 diagrams the thirty-two bit makeup of each of the program instructions. In the FIG. 22 program instructions there are the following fields:

1) a field for read_0 address for the RAM 6;
2) a field for read_1 address for the RAM 6;
3) a field for C digital filter coefficient data;
4) a field for write address for the RAM 6;
5) a field for control bits for the data multiplexer 45;
6) a field for control bits for the coefficient multiplexer 46;
7) a field for control bits for the accumulator multiplexer 47; and
8) a field for flag bits, such as the flag bits WR0, FA, OA1, OA2, NP, XP and EZ.

The monolithic integrated circuit 5' of the FIG. 21 alternative power metering system includes further sigma-delta modulators 27 and 28. The sigma-delta modulator 27 is included in the first bank of sigma-delta modulators and senses via a current transformer 17 current flow of a neutral conductor 4 included among the three-phase conductors 1, 2 and 3. The sigma-delta modulator 28 is included in the second bank of sigma-delta modulators and is shown connected for digitizing a temperature-dependent voltage as generated by a band-gap reference voltage generator 10 that senses temperature within the monolithic integrated circuit 5'. This internal chip temperature depends on an ambient temperature that the monolithic integrated circuit 5' shares with the current transformers 11-17, so the internal chip temperature indirectly measures the temperatures of the current transformers 11-17, permitting taking their temperatures into account when calculating linearization coefficients for the current transformers 11-17. To accommodate calculation on a four-word cycle, rather than the three-word cycle used in the FIG. 1 power metering system, the six-channel decimation filter 20 of FIG. 1 is replaced by an eight-channel decimation filter 20', and the multiply-add processor 30 of FIG. 1 is replaced by a multiply-add processor 30' that has four (rather than three) words of delay after the multiply-add function is completed.

RAM control circuitry 35', in addition to controlling the reading of program data RAM 6 to the multiply-add processor 30' via the parallel-in/serial-out registers 33 and 34, controls the reading of a coefficient RAM 7 via one of the PISO registers 33 and 34, depending on the value of the read0 and read1 addresses. The RAM control circuitry 35' also controls the writing of the program data RAM 6 or a data buffer RAM 8, which writing is done via the serial-in/parallel-out register 32 and a read/write bus shared by memories 6, 7 and 8. An off-chip system controller 200 directs writing of the coefficient RAM 7 via this shared read/write bus and also directs reading of the data buffer RAM 8 to a further processor 300 under its control via this shared read/write bus. For example, the further processor 300 may perform functions similar to those performed by the CORDIC processor 40 of the FIG. 1 power metering system, but carry them out in bit-parallel digital signal format.

One skilled in the art will be enabled by the reading of the foregoing disclosure to design many data acquisition circuits embodying the invention, some of which will be used in fields such as engine control that are outside the field of power metering; and this should be borne in mind when construing the scope of the claims which follow.

What is claimed is:

1. A monolithic integrated circuit having disposed therewithin:
   a bit-serial multiply-add processor, including
   a bit-serial digital multiplier for multiplying a first bit-serial processor input signal by a second bit-serial processor input signal to generate a bit-serial product signal,
   a bit-serial digital adder for adding a third bit-serial processor input signal to said bit-serial product signal to generate a bit-serial sum signal, and
   means for supplying a bit-serial processor output signal with bits corresponding to those of said bit-serial sum signal;
   a first multiplexer for supplying said first bit-serial processor input signal responsive to a selected one of a plurality of bit-serial input signals, including said bit-serial sum signal, supplied to said first multiplexer;
   a second multiplexer for supplying said second bit-serial processor input signal responsive to a selected one of a plurality of bit-serial input signals, including said bit-serial sum signal, supplied to said second multiplexer;
   a third multiplexer for supplying said third bit-serial processor input signal responsive to a selected one of a plurality of bit-serial input signals, including said bit-serial sum signal, supplied to said third multiplexer;
   an on-chip memory;
   means for reading during each of first selected times stored information from a location within said on-chip memory selected during each of said first selected times to said first, second and third multiplexers as respective bit-serial input signals thereto;
   means for reading during each of second selected times stored information from a location within said on-chip memory selected during each of said second selected times to said first, second and third multiplexers as respective input signals thereto; and
   means for writing during each of third selected times said bit-serial processor output signal to a location within said on-chip memory selected during each said third selected times.

2. A monolithic integrated circuit as set forth in claim 1 having disposed therewithin:
   analog-to-digital converter means for converting a plurality of analog input signals, as supplied to said integrated circuit, to a respective number of bit-serial analog-to-digital conversion results; and
   means for applying at least selected ones of said analog-to-digital conversion results, on a time-division multiplex basis, to said first multiplexer as one of its said plurality of respective bit-serial input signals.

3. A combination including a monolithic integrated circuit as set forth in claim 1 together with:
a read-only memory for storing program instructions and for storing successive coefficient values, said monolithic integrated circuit as set forth in claim 10 further including:
controller means for retrieving stored program instructions in a prescribed order from said read-only memory and for generating control signals for controlling the reading and writing of said on-chip memory, the selecting of said first bit-serial processor input signal by said first multiplexer, the selecting of said second bit-serial processor input signal by said second multiplexer and the selecting of said third bit-serial processor input signal by said third multiplexer.

4. A monolithic integrated circuit as set forth in claim 1 wherein said on-chip memory is of a type into which parallel-bit memory input signal is written and from which parallel-bit memory output signal is read; wherein said means for supplying a digital processor output signal includes a serial-in/parallel-out register receptive of said bit-serial sum signal; wherein said means for reading during each of first selected times stored information from said first location in said on-chip memory includes a first parallel-in/serial-out register for converting said parallel-bit memory output signal to bit-serial input signal for application to said first, second and third multiplexers as respective bit-serial input signals thereto; and wherein said means for reading during each of second selected times stored information from said first location in said on-chip memory includes a second parallel-in/serial-out register for converting said parallel-bit memory output signal to bit-serial input signal for application to said first, second and third multiplexers as respective bit-serial input signals thereto.

5. In combination with a plurality of sensors for generating respective sensor output signals, a monolithic integrated circuit having disposed therewithin:
a bit-serial multiply-add processor, including
a bit-serial digital multiplier for multiplying a first bit-serial processor input signal by a second bit-serial processor input signal to generate a bit-serial product signal,
a bit-serial digital adder for adding a third bit-serial processor input signal to said bit-serial product signal to generate a bit-serial sum signal, and
means for supplying a bit-serial processor output signal with bits corresponding to those of said bit-serial sum signal;
a first multiplexer for supplying said first bit-serial processor input signal responsive to a selected one of a plurality of bit-serial input signals, including said bit-serial sum signal, supplied to said first multiplexer;
a second multiplexer for supplying said second bit-serial processor input signal responsive to a selected one of a plurality of bit-serial input signals, including said bit-serial sum signals, supplied to said second multiplexer;
a third multiplexer for supplying said third bit-serial processor input signal responsive to a selected one of a plurality of bit-serial input signals, including said bit-serial sum signal, supplied to said third multiplexer;
an on-chip memory;
means for reading during each of first selected times stored information from a location within said on-chip memory selected during each of said first selected times to said first, second and third multiplexers as respective bit-serial input signals thereto;
means for reading during each of second selected times stored information from a location within said on-chip memory selected during each of said second selected times to said first, second and third multiplexers as respective input signals thereto; and
means for writing during each of third selected times said bit-serial processor output signal to a location within said on-chip memory selected during each of said third selected times;
analog-to-digital converter means for converting said sensor output signals, as supplied to said integrated circuit, to a respective number of bit-serial analog-to-digital conversion results; and
means for applying at least selected ones of said analog-to-digital conversion results, on a time-division multiplex basis, to said first multiplexer as one of its said plurality of respective bit-serial input signals.

6. A combination as set forth in claim 5 wherein said sensors are arranged for sensing respective electrical parameters associated with a set of electric power lines.

7. A combination as set forth in claim 6 wherein said set of electric power lines has a plurality of phases.

8. A combination as set forth in claim 6 wherein said monolithic integrated circuit includes therewithin:
a bank of registers for temporarily storing at least two successive bit-serial sum signals from said multiply-add processor;
a further digital processor for processing temporarily stored signals read from said bank of registers to generate digital output signals by a successive approximation procedure.

9. A monolithic integrated circuit as set forth in claim 8 in combination with:
a digital meter for displaying a value of said digital output signals.

10. A combination as set forth in claim 8 wherein said sensors are arranged for sensing current in each phase of said set of electric power lines.

11. A combination as set forth in claim 10 including:
a read-only memory, for storing program instructions to instruct said multiply-add processor to correct errors in phase current samples and to instruct said multiply-add processor and further digital processor in calculating r-m-s phase current values, and for storing coefficient values including those indicative of errors arising in said sensors or said analog-to-digital converter means; and
controller means, included within said monolithic integrated circuit, for retrieving stored program instructions in a prescribed order from said read-only memory and for generating control signals for controlling the reading and writing of said on-chip memory, the selecting of said first bit-serial processor input signal by said first multiplexer, the selecting of said second bit-serial processor input signal by said second multiplexer and the selecting of said third bit-serial processor input signal by said third multiplexer.

12. A monolithic integrated circuit as set forth in claim 11 including therewithin:

a pulse duration modulator for generating regularly recurring electric pulses having durations determined in response to said digital output signals.

13. A combination as set forth in claim 11 including therewithin:
a pulse duration modulator for generating regularly recurring electric pulses having durations determined in response to said digital output signals; and
a meter with D'Arsonval movement for measuring average intensity of said electric pulses.

14. A combination as set forth in claim 8 wherein said sensors are arranged for sensing voltage across each said phase of said set of electric power lines.

15. A combination as set forth in claim 14 including:
a read-only memory for storing program instructions to instruct said multiply-add processor to correct errors in phase voltage samples and to instruct said multiply-add processor and further digital processor in calculating r-m-s phase voltage values and for storing coefficient values including those indicative of errors arising in said sensors or said analog-to-digital converter means; and
controller means, included within said monolithic integrated circuit, for retrieving stored program instructions in a prescribed order from said read-only memory and for generating control signals for controlling the reading and writing of said on-chip memory, the selecting of said first bit-serial processor input signal by said first multiplexer, the selecting of said second bit-serial processor input signal by said second multiplexer and the selecting of said third bit-serial processor input signal by said third multiplexer.

16. A combination as set forth in claim 15 including therewithin:
a pulse duration modulator for generating regularly recurring electric pulses having durations determined in response to said digital output signals; and
a meter with D'Arsonval movement for measuring average intensity of said electric pulses.

17. A combination as set forth in claim 8 wherein said sensors are arranged for sensing current in at least a first phase of said set of electric power lines and for sensing voltage across at least said first phase of said set of electric power lines.

18. A combination as set forth in claim 17 including:
a read-only memory, for storing program instructions for instructing said multiply-add processor to correct errors in current and voltage samples for each phase and to instruct said multiply-add processor and further digital processor in calculating power for at least said first phase, and for storing coefficient values including those indicative of errors arising in said sensors or said analog-to-digital converter means; and
controller means, included within said monolithic integrated circuit, for retrieving stored program instructions in a prescribed order from said read-only memory and for generating control signals for controlling the reading and writing of said on-chip memory, the selecting of said first bit-serial processor input signal by said first multiplexer, the selecting of said second bit-serial processor input signal by said second multiplexer and the selecting of said third bit-serial processor input signal by said third multiplexer.

19. A combination as set forth in claim 18 wherein said set of electric power lines has plural phases; wherein there is included means for sensing the current and voltage of each of said plural phases; and wherein said read-only memory stores program instructions for instructing said multiply-add processor and further digital processor in the calculation of total power for all of said plural phases of said set of electric power lines.

20. A combination as set forth in claim 19 including therewithin:
apparatus for providing a digital-readout of the total power for all of said plural phases of said set of electric power lines to a human observer.

21. A combination as set forth in claim 17 including:
a read-only memory, for storing program instructions for instructing said multiply-add processor to correct errors in current and voltage samples for each phase and to instruct said multiply-add processor and further digital processor in calculating reactive power or vars for each phase, and for storing coefficient values including those indicative of errors arising in said sensors or said analog-to-digital converter means; and
controller means, included within said monolithic integrated circuit, for retrieving stored program instructions in a prescribed order from said read-only memory and for generating control signals for controlling the reading and writing of said on-chip memory, the selecting of said first bit-serial processor input signal by said first multiplexer, the selecting of said second bit-serial processor input signal by said second multiplexer and the selecting of said third bit-serial processor input signal by said third multiplexer.

22. A combination as set forth in claim 21 wherein said set of electric power lines has plural phases; wherein there is included means for sensing the current and voltage of each of said plural phases; and wherein said read-only memory stores program instructions for instructing said multiply-add processor and further digital processor in the calculation of total reactive power or vars for all of said plural phases of said set of electric power lines.

23. A combination as set forth in claim 22 including therewithin:
apparatus for providing a digital-readout of the total reactive power or vats for all of said plural phases of said set of electric power lines to a human observer.

24. A combination as set forth in claim 17 including:
a read-only memory, for storing program instructions for instructing said multiply-add processor to linearize current and voltage samples for each phase, for storing program instructions for instructing said multiply-add processor and further digital processor to calculate r-m-s current and voltage for each phase, for storing program instructions for instructing said further digital processor to calculate the power factor for each phase, and for storing coefficient values including those indicative of errors arising in said sensors or said analog-to-digital converter means; and
controller means, included within said monolithic integrated circuit, for retrieving stored program instructions in a prescribed order from said read-only memory and for generating control signals for controlling the reading and writing of said on-chip memory, the selecting of said first bit-serial processor input signal by said first multiplexer, the selecting of said second bit-serial processor input signal by said second multiplexer and the selecting of said third bit-serial processor input signal by said third multiplexer.

25. A combination as set forth in claim 24 including therewithin:
apparatus for providing a digital-readout of the power factor to a human observer.

* * * * *